(12) United States Patent
Clarke et al.

(10) Patent No.: US 11,594,599 B2
(45) Date of Patent: Feb. 28, 2023

(54) QUANTUM DOT ARRAY DEVICES

(71) Applicant: Intel Corporation, Santa Clara, CA (US)

(72) Inventors: James S. Clarke, Portland, OR (US); Robert L. Bristol, Portland, OR (US); Ravi Pillarisetty, Portland, OR (US); Jeanette M. Roberts, North Plains, OR (US); Hubert C. George, Portland, OR (US); Nicole K. Thomas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 16/317,023

(22) PCT Filed: Aug. 10, 2016

(86) PCT No.: PCT/US2016/046236
§ 371 (c)(1),
(2) Date: Jan. 10, 2019

(87) PCT Pub. No.: WO2018/031007
PCT Pub. Date: Feb. 15, 2018

(65) Prior Publication Data
US 2019/0229189 A1    Jul. 25, 2019

(51) Int. Cl.
*H01L 29/12* (2006.01)
*H01L 29/66* (2006.01)
(Continued)

(52) U.S. Cl.
CPC ............ *H01L 29/127* (2013.01); *B82Y 10/00* (2013.01); *H01L 29/0673* (2013.01);
(Continued)

(58) Field of Classification Search
CPC . H01L 29/127; H01L 29/0673; H01L 29/165; H01L 29/42376; H01L 29/66431;
(Continued)

(56) References Cited

U.S. PATENT DOCUMENTS 5,447,873 A * 9/1995 Randall ................. H01L 29/772
                                                        438/172
5,663,571 A    9/1997 Ugajin
(Continued)

FOREIGN PATENT DOCUMENTS

EP    2075745 A1    7/2009
JP    H05347403 A   12/1993
(Continued)

OTHER PUBLICATIONS

PCT May 11, 2017 International Search Report and Written Opinion of the International Searching Authority for International Application Serial No. PCT/US2016/046235; 11 pages.
(Continued)

*Primary Examiner* — Matthew L Reames
(74) *Attorney, Agent, or Firm* — Akona IP PC

(57) ABSTRACT

Disclosed herein are quantum dot devices, as well as related computing devices and methods. For example, in some embodiments, a quantum dot device may include: a quantum well stack including a quantum well layer; a plurality of gates disposed above the quantum well stack, wherein at least two of the gates are spaced apart in a first dimension above the quantum well stack, at least two of the gates are spaced apart in a second dimension above the quantum well stack, and the first and second dimensions are perpendicular; and an insulating material disposed above the quantum well stack, wherein the insulating material extends between at least two of the gates spaced apart in the first dimension, and
(Continued)

the insulating material extends between at least two of the gates spaced apart in the second dimension.

28 Claims, 65 Drawing Sheets

(51) Int. Cl.
      *H01L 29/778*     (2006.01)
      *H01L 29/82*     (2006.01)
      *B82Y 10/00*     (2011.01)
      *H01L 29/423*     (2006.01)
      *H01L 29/06*     (2006.01)
      *H01L 29/165*     (2006.01)
      *H01L 29/76*     (2006.01)

(52) U.S. Cl.
    CPC .......... *H01L 29/165* (2013.01); *H01L 29/423* (2013.01); *H01L 29/42376* (2013.01); *H01L 29/66431* (2013.01); *H01L 29/66977* (2013.01); *H01L 29/7613* (2013.01); *H01L 29/7782* (2013.01); *H01L 29/82* (2013.01)

(58) Field of Classification Search
    CPC ........... H01L 29/66977; H01L 29/7782; H01L 29/82; B82Y 10/00
    See application file for complete search history.

(56) References Cited

U.S. PATENT DOCUMENTS

| | | | |
|---|---|---|---|
| 6,333,516 B1 * | 12/2001 | Katoh | B82Y 10/00 257/15 |
| 7,830,695 B1 * | 11/2010 | Moon | G01R 33/1284 257/14 |
| 9,368,622 B1 | 6/2016 | Boutros | |
| 2001/0013628 A1 | 8/2001 | Tyagi et al. | |
| 2002/0179897 A1 | 12/2002 | Eriksson et al. | |
| 2004/0175881 A1 | 9/2004 | Forbes et al. | |
| 2007/0026684 A1 | 2/2007 | Parascandola et al. | |
| 2007/0063182 A1 * | 3/2007 | Yang | B82Y 10/00 257/14 |
| 2007/0194297 A1 | 8/2007 | McCarthy et al. | |
| 2008/0008969 A1 | 1/2008 | Zhou et al. | |
| 2011/0193155 A1 | 8/2011 | Tsurumi et al. | |
| 2012/0074386 A1 | 3/2012 | Rachmady et al. | |
| 2013/0264617 A1 | 10/2013 | Joshi et al. | |
| 2014/0272711 A1 | 9/2014 | Bristol et al. | |
| 2015/0187766 A1 | 7/2015 | Basker et al. | |
| 2015/0279981 A1 | 10/2015 | Eriksson et al. | |
| 2016/0111501 A1 | 4/2016 | Chen et al. | |
| 2019/0229188 A1 | 7/2019 | Clarke | |

FOREIGN PATENT DOCUMENTS

| | | |
|---|---|---|
| JP | H0677130 A | 3/1994 |
| JP | 2011114156 A | 6/2011 |
| WO | 2010053720 A2 | 5/2010 |
| WO | 2015184484 A1 | 12/2015 |
| WO | 2018031006 A1 | 2/2018 |
| WO | 2018031007 A1 | 2/2018 |

OTHER PUBLICATIONS

PCT Apr. 21, 2017 International Search Report and Written Opinion of the International Searching Authority for International Application Serial No. PCT/US2016/046236; 8 pages.
"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.

(56) References Cited

OTHER PUBLICATIONS

"Defect reduction of selective Ge epitaxy in trenches on Si(001) substrates using aspect ratio trapping," Park et al., Applied Physics Letter 90, 052113 (2007), pp. 052113-1 through 3.
"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).
"Radio frequency measurements of tunnel couplings and singlet-triplet spin states in Si:P quantum dots," House et al., Nature Communications, 6:884, DOI: 10.1038/ncomms9848, pp. 1-6.
"Detecting bit-flip errors in a logical qubit using stabilizer measurements," Riste et al., Nature Communications, 6:6983, DOI: 10.1038/ncomms7983, pp. 1-6.
"Scalable gate architecture for densely packed semiconductor spin qubits," Zajac et al, Department of Physics, Princeton University; Sandia National Laboratories, 8 pages.
"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.
"Single-electron Transistors fabricated with sidewall spacer patterning," Park et al., Superlattices and Microstructures 34 (2003) 231-239.
"Single-electron Transistors with wide operating temperature range," Dubuc et al., Applied Physics Letters 90, 113104 (2007) pp. 113104-1 through 3.
"Single-shot read-out of an individual electron spin in a quantum dot," Elzerman et al., Nature, vol. 430, Jul. 22, 2004, pp. 431-435.
"Suspending superconducting qubits by silicon micromachining," Chu et al., Department of Applied Physics, Yale University, Jun. 10, 2016, 10 pages.
"Single-charge tunneling in ambipolar silicon quantum dots," Müller, Filipp, Dissertation, University of Twente, Jun. 19, 2015, 148 pages.
"An addressable quantum dot qubit with fault-tolerant control-fidelity," Veldhorst et al., Nature Nanotechnology vol. 9, Dec. 2014, pp. 981-985.
EP Extended European Search Report issued in European Application No. 16912828.7 dated Feb. 24, 2020; 11 pages.
EP Extended European Search Report issued in European Application No. 16912829.5 dated Mar. 12, 2020; 9 pages.
Korkusinski, Marek, et al., "Topological Hunds Rule and the Electronic Properties of a Triple Lateral Quantum Dot Molecule," Arvix. Org, Cornell University Library, 201 Olin Library Cornell University; Ithaca, NY 14853; 34 pages (Oct. 6, 2006).
USPTO Notice of Allowance issued in U.S. Appl. No. 16/316,971 dated Jan. 21, 2020; 38 pages.
USPTO Restriction Requirement issued in U.S. Appl. No. 16/316,971 dated Sep. 16, 2019; 6 pages.
JP Nov. 4, 2020 Notice of Reason for Refusal from Japanese Application 2019-500550.

* cited by examiner

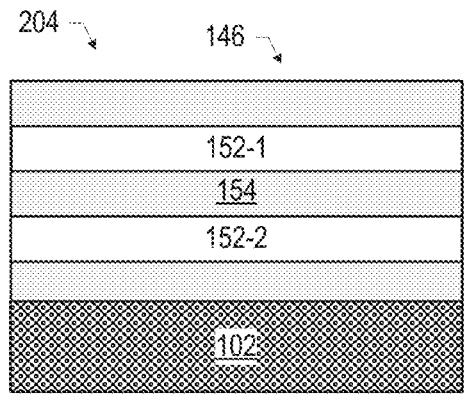
FIG. 5
FIG. 6
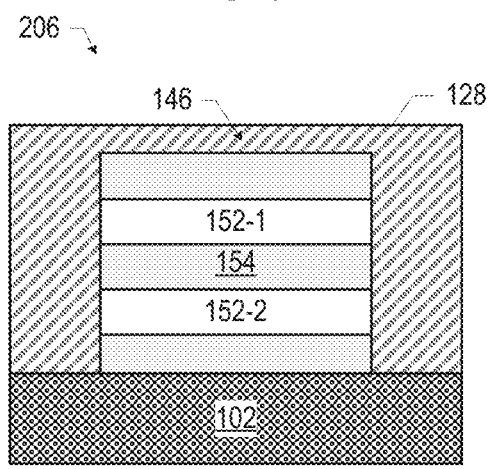
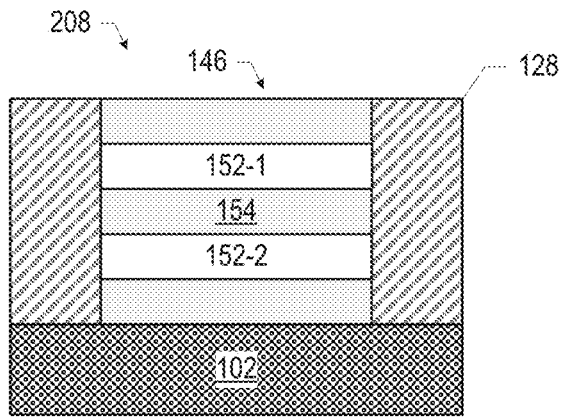
FIG. 7
FIG. 8
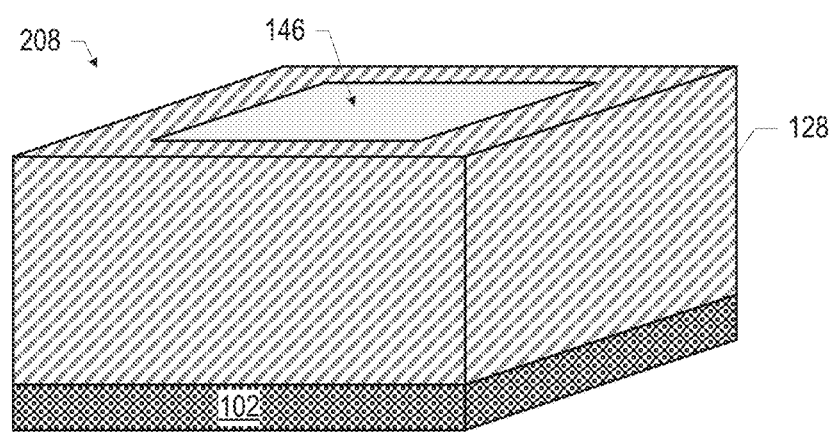
FIG. 9

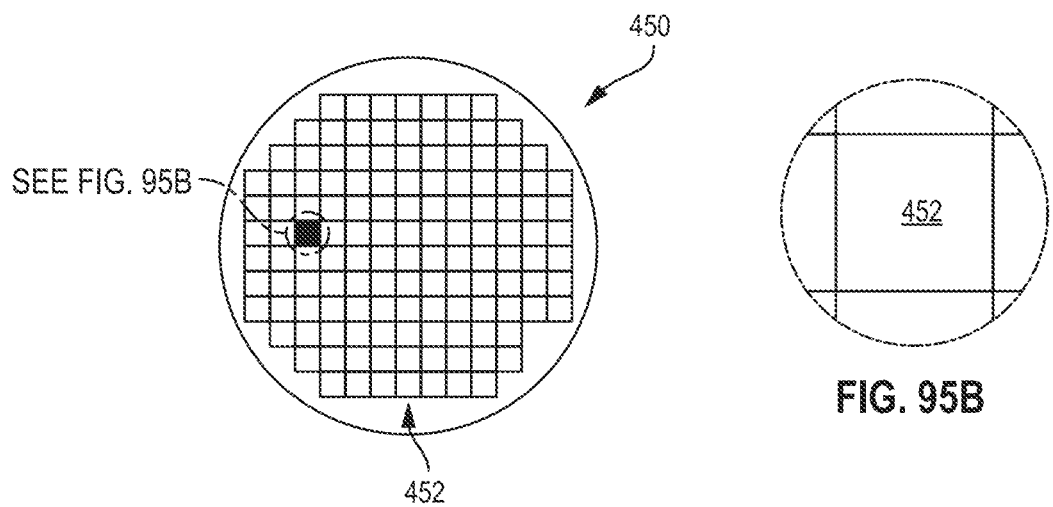
FIG. 95A
FIG. 95B
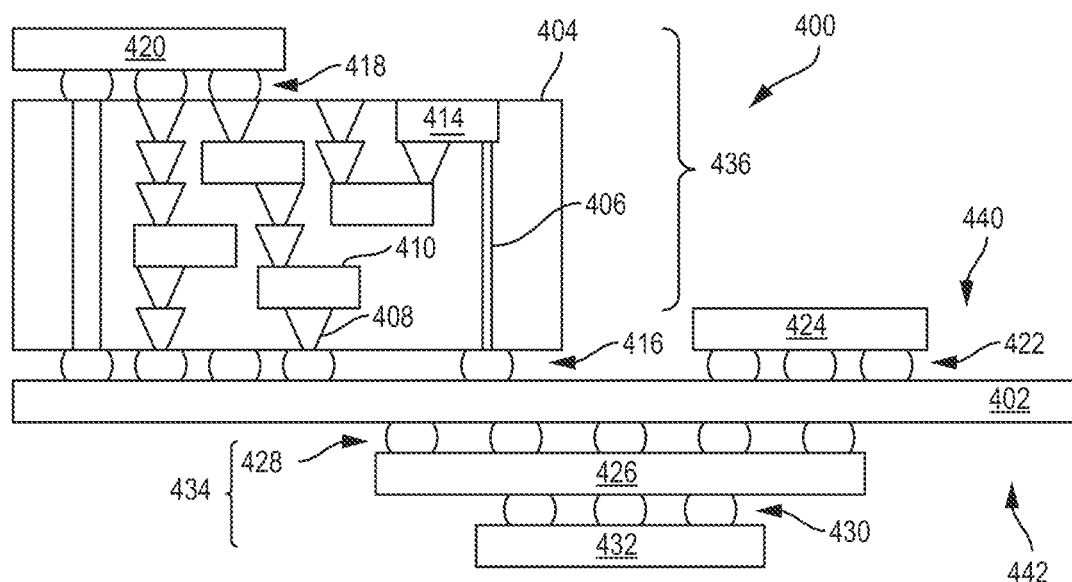
FIG. 96

QUANTUM DOT ARRAY DEVICES

CROSS-REFERENCE TO RELATED APPLICATION

This application is a national stage application under 35 U.S.C. § 371 of PCT International Application Serial No. PCT/US2016/046236, filed on Aug. 10, 2016 and entitled "Quantum Dot Array Devices," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5-12, 13A-B, 14A-B, 15A-B, 16A-B, 17A-B, 18A-B, 19A-B, 20A-B, 21A-B, 22A-B, 23A-B, 24A-B, 25A-B, 26A-B, and 27-47 illustrate various example stages in the manufacture of a quantum dot device, in accordance with various embodiments.

FIGS. 95A and 95B are top views of a wafer and dies that may include any of the quantum dot devices disclosed herein.

FIG. 96 is a cross-sectional side view of a device assembly that may include any of the quantum dot devices disclosed herein.

DETAILED DESCRIPTION

Figure 1:
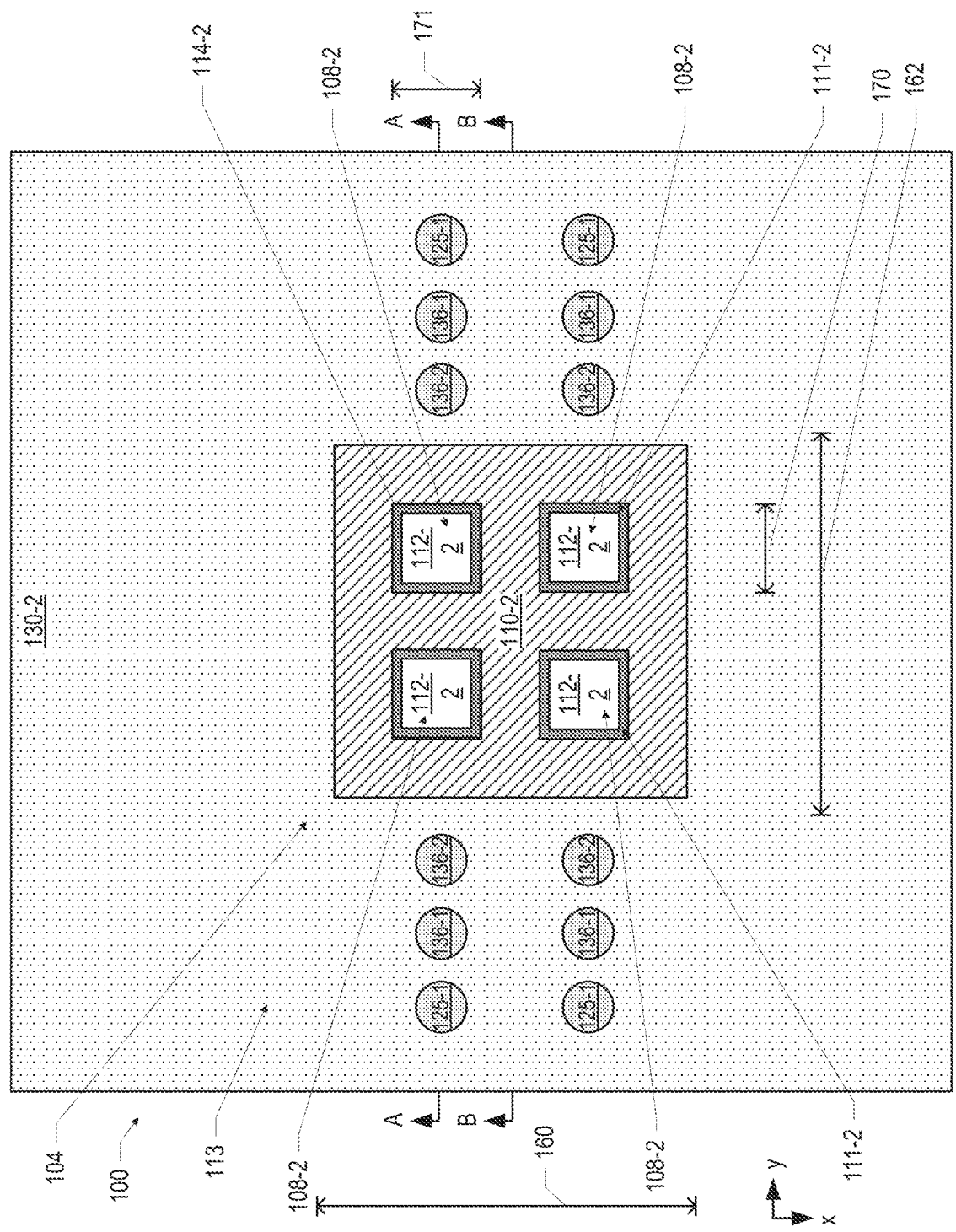
FIGS. 1-4 are cross-sectional views of a quantum dot device, in accordance with various embodiments.

Disclosed herein are quantum dot devices, as well as related computing devices and methods. For example, in some embodiments, a quantum dot device may include: a quantum well stack including a quantum well layer; a plurality of gates disposed above the quantum well stack, wherein at least two of the gates are spaced apart in a first dimension above the quantum well stack, at least two of the gates are spaced apart in a second dimension above the quantum well stack, and the first and second dimensions are perpendicular; and an insulating material disposed above the quantum well stack, wherein the insulating material extends between at least two of the gates spaced apart in the first dimension, and the insulating material extends between at least two of the gates spaced apart in the second dimension.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 2:
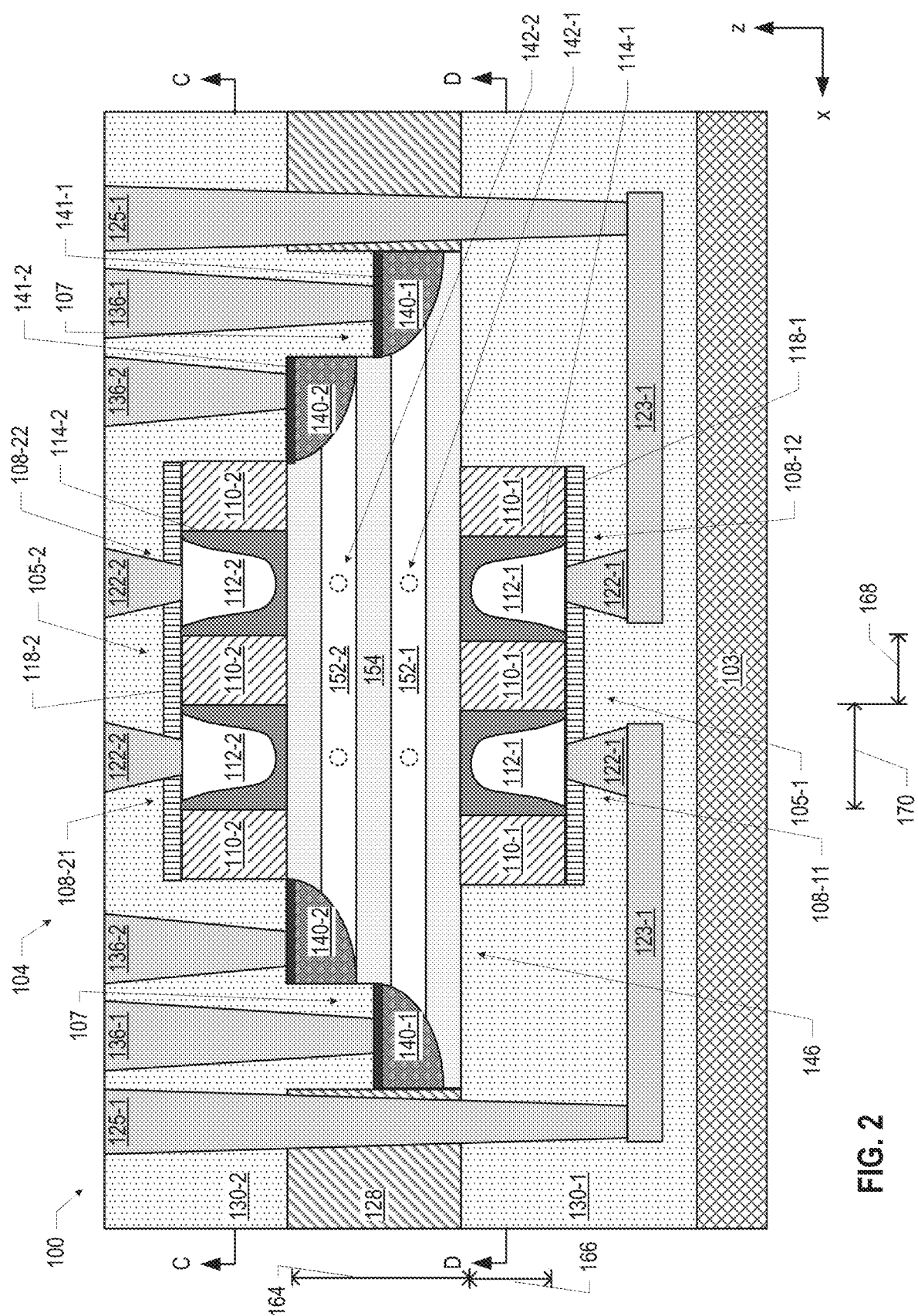
Figure 3:
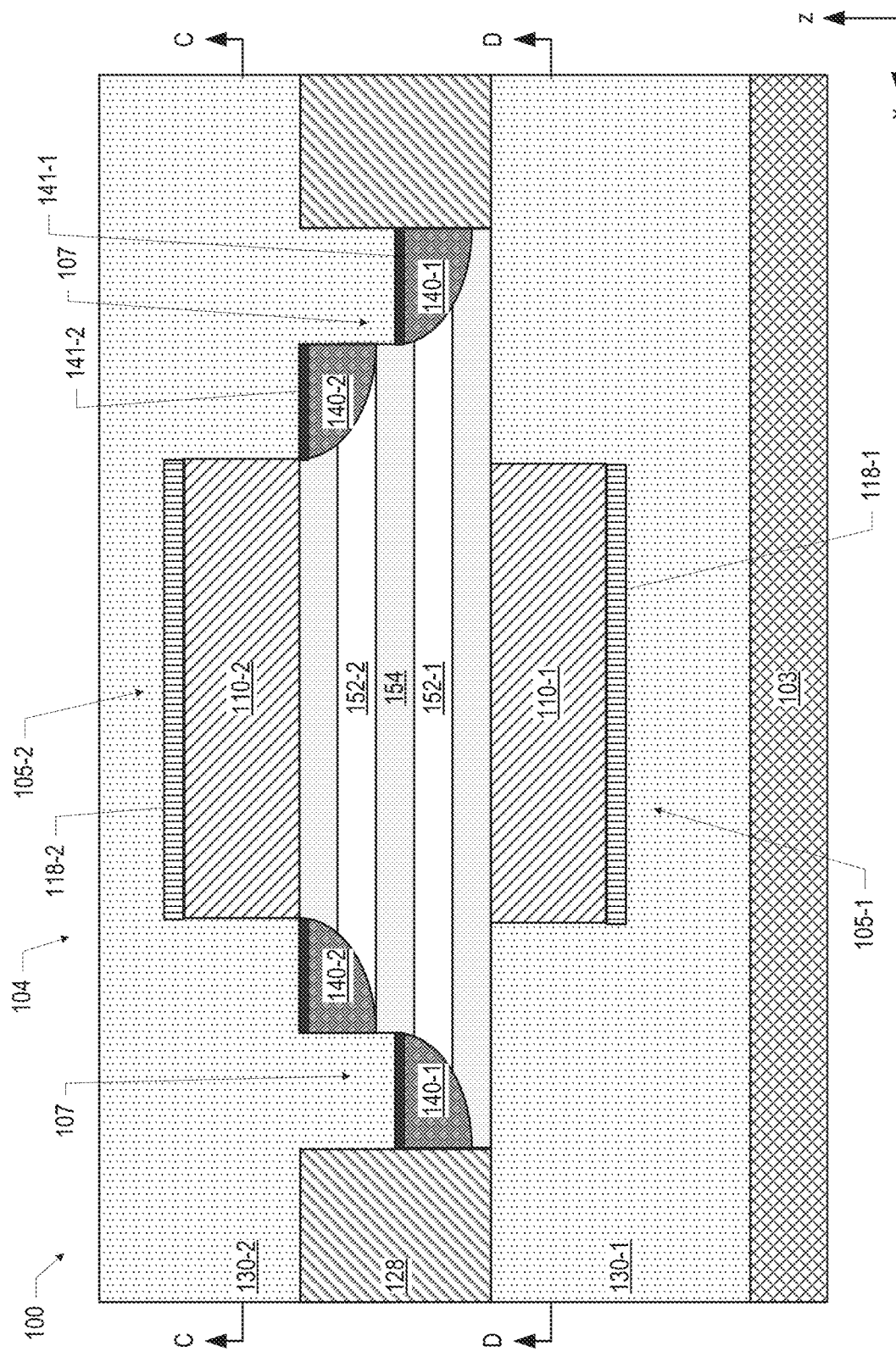
Figure 4:
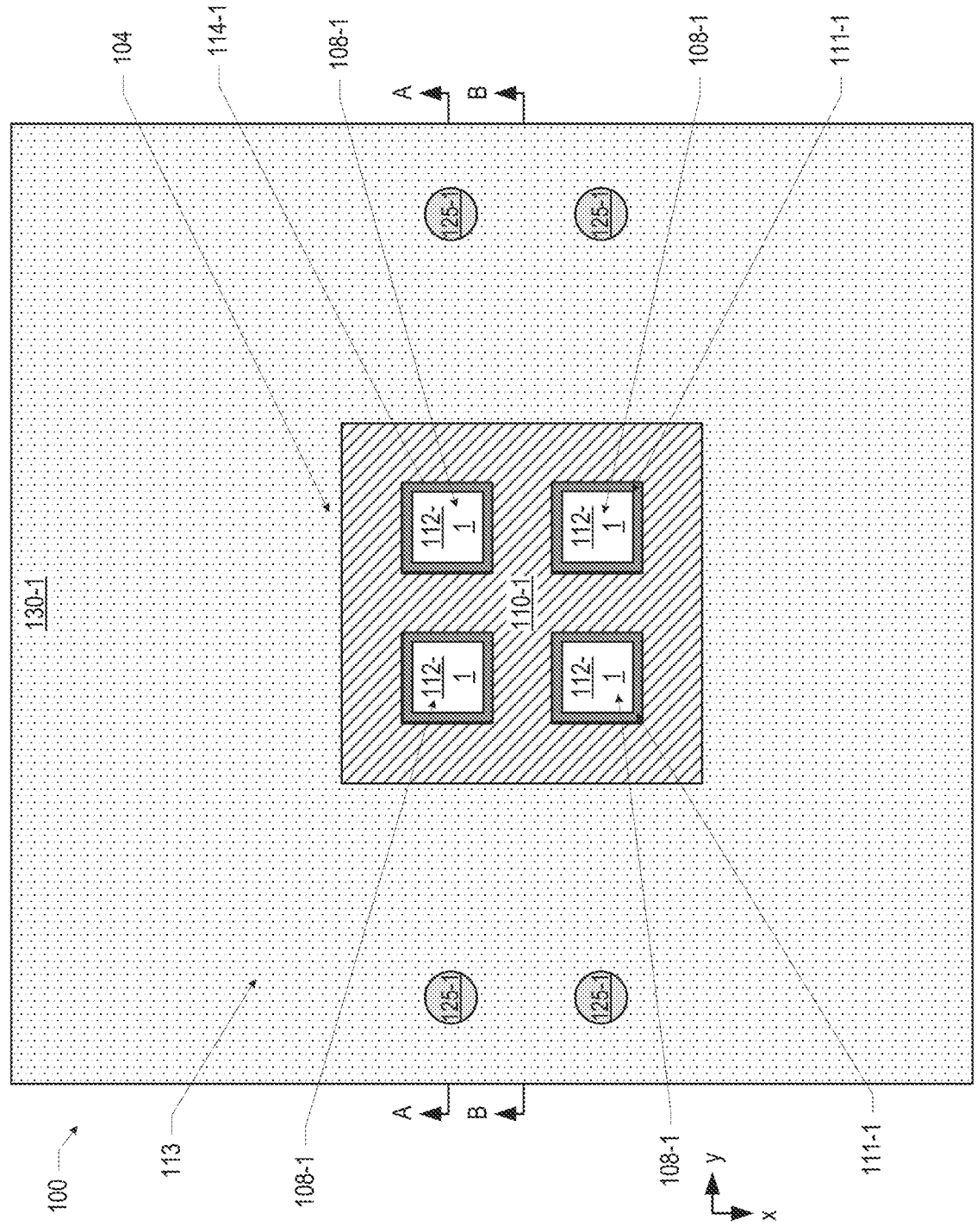

FIGS. 1-4 are cross-sectional views of a quantum dot device 100, in accordance with various embodiments. In particular, FIG. 2 illustrates the quantum dot device 100 taken along the section A-A of FIGS. 1 and 4 and FIG. 3 illustrates the quantum dot device 100 taken along the section B-B of FIGS. 1 and 4 (while FIG. 1 illustrates the quantum dot device 100 taken along the section C-C of FIGS. 2 and 3, and FIG. 4 illustrates the quantum dot device taken along the section D-D of FIGS. 2 and 3). FIGS. 1 and 4 may be considered "top" cross-sectional views and FIGS. 2 and 3 may be considered "side" cross-sectional views, although as noted above, such descriptions are used to facilitate the discussion and are not intended to restrict the application of disclosed embodiments.

The quantum dot device 100 may include one or more quantum dot formation regions 104 spaced apart by insulating material 128 (e.g., silicon oxide). Although only a single quantum dot formation region 104 is shown in FIGS. 1-4, this is simply for ease of illustration, and more than one quantum dot formation region 104 may be included in the quantum dot device 100 (e.g., as discussed below with reference to FIG. 90). The quantum dot formation regions 104 may include a quantum well stack 146, which may include one or more quantum well layers 152. In the embodiment illustrated in FIGS. 1-4, the quantum well stack 146 includes two quantum well layers, 152-1 and 152-2, but in some embodiments (as discussed further herein), the quantum well stack 146 may include one quantum well layer 152 or three or more quantum well layers 152. In the embodiment illustrated in FIGS. 1-4, the quantum well layer 152-1 and the quantum well layer 152-2 are spaced apart by a barrier layer 154. Examples of quantum well stacks 146 are discussed in detail below with reference to FIGS. 88-89. The quantum dot device 100 may, in some embodiments, include a support 103 to provide mechanical support for the quantum dot device 100 (e.g., in the form of a carrier or other structure). In some embodiments, the quantum dot device 100 may not include a support 103.

As noted above, each of the quantum dot formation regions 104 may include one or more quantum well layers 152. The quantum well layers 152 included in the quantum dot formation regions 104 may be arranged normal to the z-direction, and may provide layers in which a two-dimensional electron gas (2DEG) may form to enable the generation of a quantum dot during operation of the quantum dot device 100, as discussed in further detail below. The quantum well layers 152 themselves may provide a geometric constraint on the z-location of quantum dots in the quantum dot formation regions 104. To control the x-location and the y-location of quantum dots in the quantum dot formation regions 104, voltages may be applied to gates disposed on the quantum dot formation regions 104 to adjust the energy profile along the quantum dot formation regions 104 in the x-direction and the y-direction and thereby constrain the x-location and y-location of quantum dots within quantum wells (discussed in detail below with reference to the gates 108). The dimensions of the quantum dot formation regions 104 may take any suitable values. The x-length 160 and the y-length 162, for example, may depend on the number and arrangement of gates included in the quantum dot formation region 104. In some embodiments, the z-length 164 of the quantum well stack 146 included in a quantum dot formation region 104 may be between 200 and 400 nanometers (e.g., between 250 and 350 nanometers, or equal to 300 nanometers). Insulating material and conductive pathways may be present in the peripheral region 113 around a quantum dot formation region 104, as discussed in detail below.

Multiple gates may be disposed in each of the quantum dot formation regions 104. In particular, in some embodiments, a first set of gates 105-1 may be disposed at the "bottom" of each quantum dot formation region 104, and a second set of gates 105-2 may be disposed at the "top" of each quantum dot formation region 104. In the embodiment illustrated in FIGS. 1-4, the first set of gates 105-1 includes four gates 108-1, and the second set of gates 105-2 includes four gates 108-2. This particular number of gates is simply illustrative, and any suitable number and arrangement of gates may be used. For example, a set of gates 105 may include three or more gates 108, arranged in any desired arrangement (e.g., as vertices of triangles or other polygons, in a rectangular or other array, in an irregular arrangement on the quantum well stack 146, etc.). Additionally, as discussed below with reference to FIG. 90, multiple quantum dot formation regions 104 may be included in a quantum dot device 100, as desired.

As shown in FIGS. 1-4, the gate 108-11 may be disposed in an opening 111-1 in an insulating material 110-1, and the gate 108-12 may be disposed in a different opening 111-1 in the insulating material 110-1. The gates 108-21 and 108-22 (of the set of gates 105-2) are arranged along the quantum well stack 146 analogously to the arrangement of the gates 108-11 and 108-12 (of the set of gates 105-1). References to a "gate 108" herein may refer to any of the gates 108. Reference to the "gates 108-1" herein may refer to any of the gates 108 of the first set of gates 105-1 (and analogously for the "gates 108-2").

A set of gates 105 may include multiple gates 108 that include at least one pair of gates 108 spaced apart from each other in a first dimension (e.g., spaced apart from each other in the x-dimension), and at least one pair of gates 108 spaced apart from each other in a second dimension perpendicular to the first dimension (e.g., spaced apart from each other in the y-dimension). A two-dimensional regular array of spaced-apart gates 108 is one example of such an arrangement (e.g., as illustrated in FIGS. 1-4), but many others exist (e.g., an irregular array or other distribution). These pairs may share a gate 108; for example, three gates 108 may satisfy this description if arranged accordingly. In the embodiment illustrated in FIGS. 1-4, the gates 108 in a set 105 are spaced apart by intervening portions of the insulating material 110; in other embodiments, other materials or structures may be disposed between pairs of gates 108 in a set 105. The insulating material 110 may have any suitable material composition. For example, in some embodiments, the insulating material 110 may include silicon oxide, silicon nitride, aluminum oxide, carbon-doped oxide, and/or silicon oxynitride.

In the embodiment illustrated in FIGS. 1 and 4, from a top view, the insulating material 110 around each set of gates 105 may be shaped substantially as a "grid" or "cross-grating," having openings 111 in which the gate metal 112 of the gates 108 are at least partially disposed. Such a grid may have one or more cross-shaped portions (between a set of four adjacent openings 111) and a perimeter portion (extending around the collection of openings 111). As noted elsewhere herein, the insulating material 110 may be patterned in any suitable way to define the location and shape of the gates 108. A number of examples of techniques for patterning the insulating material 110, and thereby establishing the footprints of the gates 108, are discussed below. For example, in some embodiments, the gates 108 may have footprints that are substantially rectangular (e.g., as discussed below with reference to FIGS. 12-28) or footprints that have two linear opposing sides and two semicircular opposing sides (e.g., as discussed above with reference to FIGS. 48-67). In some embodiments, the insulating material 110-1 may be a mirror image of the insulating material 110-2 around the quantum well stack 146; in other embodiments, the insulating material 110-1 may not be a mirror image of the insulating material 110-2. Similarly, the gates 108-1 may be a mirror image of the gates 108-2 around the quantum well stack 146; in other embodiments, the gates 108-1 may not be a mirror image of the gates 108-2.

Each of the gates 108 may include a gate dielectric 114 (e.g., the gate dielectric 114-1 for the gates 108-1, and the gate dielectric 114-2 for the gates 108-2). Separate portions of the gate dielectric 114 may be provided for each of the gates 108, and in some embodiments, the gate dielectric 114 may extend at least partially up the side walls of the openings 111 in the proximate insulating material 110. In such embodiments, the gate metal 112 may extend between the portions of the associated gate dielectric 114 on the side walls of the openings 111, and thus may have a U-shape in cross section (as illustrated in FIG. 2 and discussed below with reference to FIG. 29). In some embodiments, the gate dielectric 114 may be a multilayer gate dielectric (e.g., with multiple materials used to improve the interface between the quantum well stack 146 and the gate metal 112). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114. The gate dielectric 114-1 may be a same material as the gate dielectric 114-2, or a different material.

Each of the gates 108-1 may include a gate metal 112-1, and a hardmask 118-1 may be disposed above the gate metal 112-1. The hardmask 118-1 may be formed of silicon nitride, silicon carbide, or another suitable material. The gate metal 112-1 may be disposed between the hardmask 118-1 and the gate dielectric 114-1, and the gate dielectric 114-1 may be disposed between the gate metal 112-1 and the quantum well stack 146. In some embodiments, the gate metal 112-1 may be a superconductor, such as aluminum, titanium nitride (e.g., deposited via atomic layer deposition), or niobium titanium nitride. In some embodiments, the hardmask 118-1 may not be present in the quantum dot device 100 (e.g., a hardmask like the hardmask 118-1 may be removed during processing, as discussed below).

Each of the gates 108-2 may include a gate metal 112-2, and a hardmask 118-2 may be disposed above the gate metal 112-2. The hardmask 118-2 may be formed of any of the materials discussed above with reference to the hardmask 118-1. The gate metal 112-2 may be disposed between the hardmask 118-2 and the gate dielectric 114-2, and the gate dielectric 114-2 may be disposed between the gate metal 112-2 and the quantum well stack 146. In some embodiments, the gate metal 112-2 may be a different metal from the gate metal 112-1; in other embodiments, the gate metal 112-2 and the gate metal 112-1 may have the same material composition. In some embodiments, the gate metal 112-2 may be a superconductor, such as aluminum, titanium nitride (e.g., deposited via atomic layer deposition), or niobium titanium nitride. In some embodiments, the hardmask 118-2 may not be present in the quantum dot device 100 (e.g., a hardmask like the hardmask 118-2 may be removed during processing, as discussed below).

The dimensions of the insulating material 110 and the gates 108 may take any suitable values. For example, in some embodiments, the z-height 166 of the insulating material 110 and the gate metal 112 may be between 40 and 75 nanometers (e.g., approximately 50 nanometers). In some embodiments, the x-distance 168 between adjacent portions of the gate metal 112 in the cross section of FIG. 2 (and therefore the x-length of the portion of the insulating material 110 disposed between adjacent gates 108) may be less than 100 nanometers (e.g., between 20 and 100 nanometers, between 20 and 40 nanometers, approximately 30 nanometers, or approximately 50 nanometers). In some embodiments, the x-length 170 of the openings 111 in the insulating material 110 (and therefore the x-length of the gates 108) may be between 40 and 60 nanometers (e.g., 50 nanometers); the y-length 171 of the openings 111 may take any of the values described herein for the x-length 170, for example.

During operation of the quantum dot device 100, voltages may be applied to the gates 108-1 to adjust the potential energy in the quantum well layer 152-1 in the quantum dot formation region 104 to create quantum wells of varying depths in which quantum dots 142-1 may form. Similarly, voltages may be applied to the gates 108-2 to adjust the potential energy in the quantum well layer 152-2 in the quantum dot formation region 104 to create quantum wells of varying depths in which quantum dots 142-2 may form. Only one quantum dot 142-1 and one quantum dot 142-2 are labeled with a reference numeral in FIG. 2 for ease of illustration, but two are indicated as dotted circles in each quantum well layer 152 of the quantum well stack 146. As noted above, in some embodiments, the set 105-1 and/or the quantum well layer 152-1 may be omitted from the quantum dot device 100. In some embodiments, the set 105-2 and/or the quantum well layer 152-2 may be omitted from the quantum dot device 100.

The portions of insulating material 110 disposed between adjacent gates 108 may themselves provide "passive" barriers between quantum wells under the gates 108 in the associated quantum well layer 152, and the voltages applied to different ones of the gates 108 may adjust the potential energy under the gates 108 in the quantum well layer 152; decreasing the potential energy may form quantum wells, while increasing the potential energy may form quantum barriers. The discussion below may generally refer to gates 108, quantum dots 142, and quantum well layers 152. This discussion may apply to the gates 108-1, quantum dots 142-1, and quantum well layer 152-1, respectively; to the gates 108-2, quantum dots 142-2, and quantum well layer 152-2, respectively; or to both.

The quantum dot formation region 104 may include doped regions 140 that may serve as a reservoir of charge carriers for the quantum dot device 100. In particular, the doped regions 140-1 may be in conductive contact with the quantum well layer 152-1, and the doped regions 140-2 may be in conductive contact with the quantum well layer 152-2. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown by the interface material 141-1 at the surface of the doped regions 140-1 and the interface material 141-2 at the surface of the doped regions 140-2. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 44-45). In some embodiments, the interface material 141 may be a non-silicide compound, such as titanium nitride. In some embodiments, the interface material 141 may be a metal (e.g., aluminum, tungsten, or indium).

The quantum dot devices 100 disclosed herein may be used to form electron-type or hole-type quantum dots 142. Note that the polarity of the voltages applied to the gates 108 to form quantum wells/barriers depend on the charge carriers used in the quantum dot device 100. In embodiments in which the charge carriers are electrons (and thus the quantum dots 142 are electron-type quantum dots), amply negative voltages applied to a gate 108 may increase the potential barrier under the gate 108, and amply positive voltages applied to a gate 108 may decrease the potential barrier under the gate 108 (thereby forming a potential well in the associated quantum well layer 152 in which an electron-type quantum dot 142 may form). In embodiments in which the charge carriers are holes (and thus the quantum dots 142 are hole-type quantum dots), amply positive voltages applied to a gate 108 may increase the potential barrier under the gate 108, and amply negative voltages applied to a gate 108 may decrease the potential barrier under the gate 108 (thereby forming a potential well in the associated quantum well layer 152 in which a hole-type quantum dot 142 may form). The quantum dot devices 100 disclosed herein may be used to form electron-type or hole-type quantum dots.

Voltages may be applied to each of the gates 108 separately to adjust the potential energy in the quantum well layer under the gates 108, and thereby control the formation of quantum dots 142 under each of the gates 108. Additionally, the relative potential energy profiles under different ones of the gates 108 allow the quantum dot device 100 to tune the potential interaction between quantum dots 142 under adjacent gates 108. For example, if two adjacent quantum dots 142 (e.g., one quantum dot 142 under a gate 108 and another quantum dot 142 under an adjacent gate 108) are separated by only a short potential barrier, the two quantum dots 142 may interact more strongly than if they were separated by a taller potential barrier. Since the depth of the potential wells/height of the potential barriers under each gate 108 may be adjusted by adjusting the voltages on the respective gates 108 and neighboring gates, the differences in potential between various gates 108 may be adjusted, and thus the interaction tuned. In some applications, the gates 108 may be used as plunger gates to enable the formation of quantum dots 142 under the gates 108.

Conductive vias and lines may make contact with the gates 108, and with the doped regions 140, to enable electrical connection to the gates 108 and the doped regions 140/quantum well layers 152 to be made in desired locations. As shown in FIG. 2, the gates 108-1 may extend away from the quantum well stack 146, and conductive vias 122-1 may extend through insulating material 130-1 to contact the gate metal 112-1 of the gates 108-1. The conductive vias 122-1 may extend through the hardmask 118-1 to contact the gate metal 112-1 of the gates 108-1. Conductive lines 123-1 may contact the conductive vias 122-1, and may extend "laterally" away from the conductive vias 122-1 to make contact with conductive vias 125-1 that extend through the insulating material 130-1, the insulating material 128, and insulating material 130-2.

The gates 108-2 may extend away from the quantum well stack 146, and conductive vias 122-2 may contact the gates 108-2. The conductive vias 122-2 may extend through the hardmask 118-2 to contact the gate metal 112-2 of the gates 108-2. The insulating material 130-1 and the insulating material 130-2 may have different material compositions, or the same material composition. Examples of materials that may be used for the insulating materials 130 are discussed below.

Conductive vias 136 may contact the interface material 141 and may thereby make electrical contact with the doped regions 140. In particular, the conductive vias 136-1 may extend through the insulating material 130 and make contact with the doped regions 140-1, and the conductive vias 136-2 may extend through the insulating material 130 and make contact with the doped regions 140-2. The quantum dot device 100 may include further conductive vias and/or lines (not shown) to make electrical contact to the gates 108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

As illustrated in FIGS. 2 and 3, in some embodiments, the quantum dot formation regions 104 may include recesses 107 that extend down to the interface material 141-1 to make conductive contact with the doped regions 140-1 (and thereby the quantum well layer 152-1). The recesses 107 may be filled with the insulating material 130, and the bottoms of the recesses 107 may be doped to provide the doped regions 140-1.

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The conductive vias 122, 125, and 136 may be electrically isolated from each other by various insulating materials, including the insulating materials 130-1 and 130-2, and the insulating material 128, as shown. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 122/125/136 may have a width that is 20 nanometers or greater at their widest point (e.g., 30 nanometers), and a pitch of 80 nanometers or greater (e.g., 100 nanometers). In some embodiments, conductive lines (e.g., the conductive lines 123) included in the quantum dot device 100 may have a width that is 100 nanometers or greater, and a pitch of 100 nanometers or greater. The particular arrangement of conductive vias and lines shown in FIGS. 1-4 is simply illustrative, and any electrical routing arrangement may be implemented.

In some embodiments, the quantum dots 142-2 in the quantum well layer 152-2 may be used as "active" quantum dots in the sense that these quantum dots 142-2 act as qubits and are controlled (e.g., by voltages applied to the gates 108-2) to perform quantum computations. The quantum dots 142-1 in the quantum well layer 152-1 may be used as "read" quantum dots in the sense that these quantum dots 142-1 may sense the quantum state of the quantum dots 142-2 in the same quantum dot formation region 104 by detecting the electric field generated by the charge in the quantum dots 142-2, and may convert the quantum state of the quantum dots 142-2 into electrical signals that may be detected by the gates 108-1. In some embodiments, each quantum dot 142-2 may be read by its corresponding quantum dot 142-1. In some other embodiments, the "active" and "read" roles of the quantum dots 142-1 and 142-2 may be switched. Thus, the quantum dot device 100 enables both quantum computation and the ability to read the results of a quantum computation within a single quantum dot formation region, if desired. In other embodiments, one or more of the quantum well layers 152 and associated set of gates 105 may be omitted. In some such embodiments, the quantum dots 142 formed in the remaining quantum well layer(s) 152 may be "read" by other devices (not shown), if appropriate.

The quantum dot devices 100 disclosed herein may be manufactured using any suitable techniques. FIGS. 5-47 illustrate various example stages in the manufacture of the quantum dot device 100 of FIGS. 1-4, in accordance with various embodiments. Among FIGS. 5-47, FIGS. 13-19 illustrate one set of techniques for patterning the insulating material 110-1, and FIGS. 20-26 illustrate an alternate set of techniques for patterning the insulating material 110-1. FIGS. 81-87, discussed further below, illustrate another alternate set of techniques for patterning the insulating material 110-1. Although the particular manufacturing operations discussed below with reference to FIGS. 5-47 are illustrated as manufacturing a particular embodiment of the quantum dot device 100, these operations may be applied to manufacture many different embodiments of the quantum dot device 100, as discussed herein. Any of the elements discussed below with reference to FIGS. 5-47 may take the form of any of the embodiments of those elements discussed above (or otherwise disclosed herein). For ease of illustration, not all elements in each of FIGS. 5-47 are expressly labeled with reference numerals, but reference numerals for each element are included among the drawings of FIGS. 5-47.

FIG. 5 illustrates a cross-sectional view of an assembly 202 including a base 102. The base 102 may include any suitable semiconductor material or materials, or any other suitable structure on which to perform the subsequent operations. In some embodiments, the base 102 may include a semiconductor material. For example, the base 102 may include silicon (e.g., may be formed from a silicon wafer).

FIG. 6 illustrates a cross-sectional view of an assembly 204 subsequent to providing a quantum well stack 146 on the base 102 of the assembly 202 (FIG. 5). The quantum well stack 146 may include at least one quantum well layer 152. For example, the quantum well stack 146 illustrated in FIG. 6 includes a quantum well layer 152-1, a quantum well layer 152-2, and a barrier layer 154 disposed therebetween. As discussed above, a 2DEG may form in the quantum well layer 152-1 and/or the quantum well layer 152-2 during operation of the quantum dot device 100. Various embodiments of the quantum well stack 146 are discussed below with reference to FIGS. 35 and 36. As noted above, in some embodiments, the quantum well stack 146 may include only a single quantum well layer 152 (and in some such embodiments, only a single set of gates 105, as discussed below).

FIG. 7 illustrates a cross-sectional view of an assembly 206 subsequent to etching the quantum well stack 146 of the assembly 204 (FIG. 5) into a desired shape, then providing an insulating material 128 around the etched quantum well stack 146. The size and shape of the quantum well stack 146 after etching may take any suitable form (e.g., the substantially rectangular solid form illustrated in FIGS. 1-4 and FIGS. 7-9). The quantum well stack 146 may be patterned and etched using any suitable technique known in the art. For example, a combination of dry and wet etch chemistry may be used to shape the quantum well stack 146, and the appropriate chemistry may depend on the materials included in the assembly 204, as known in the art. Any suitable material may be used as the insulating material 128 to electrically insulate the quantum well stack 146. As noted above, in some embodiments, the insulating material 128 may be a dielectric material, such as silicon oxide.

FIG. 8 illustrates a cross-sectional view of an assembly 208 subsequent to planarizing the assembly 206 (FIG. 7) to remove the insulating material 128 above the quantum well stack 146. In some embodiments, the assembly 206 may be planarized into the assembly 208 using a chemical mechanical polishing (CMP) technique.

Figure 10:
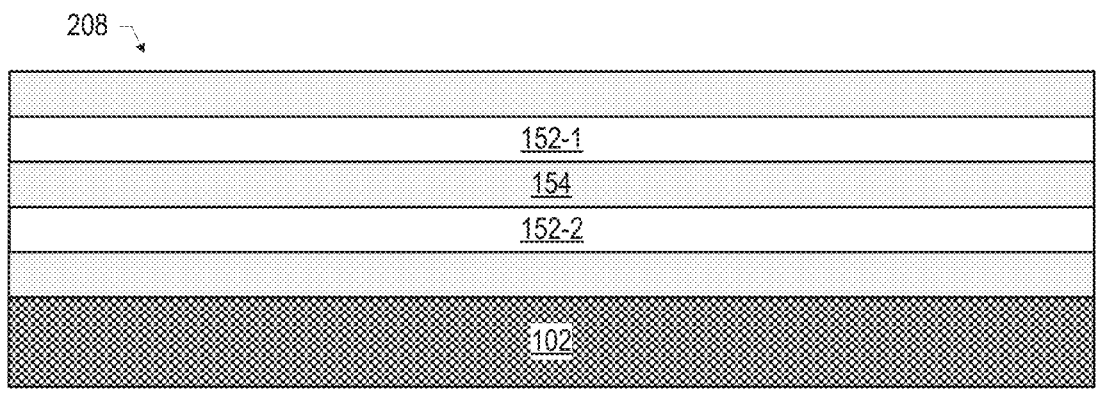

FIG. 9 is a perspective view of at least a portion of the assembly 208, showing the quantum well stack 146 extending from the base 102 and laterally insulated by the insulating material 128. FIG. 10 is another cross-sectional view of the assembly 208, showing a "zoomed-in" version of the cross section of FIG. 8 that omits the insulating material 128 for ease of illustration. The views illustrated in FIGS. 11-34 maintain this zoomed-in perspective, while the cross-sectional views illustrated in FIGS. 35-47 are "zoomed out" to include at least some of the insulating material 128.

Figure 11:
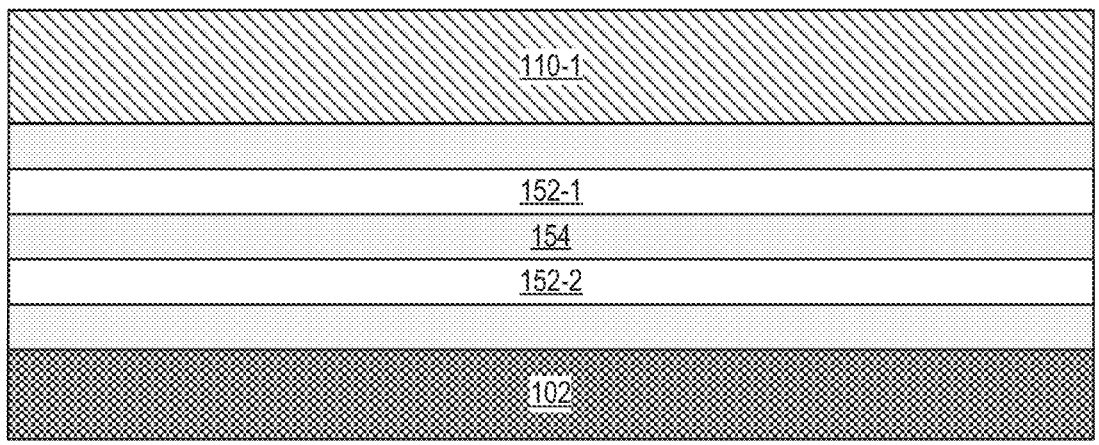

FIG. 11 is a cross-sectional view of an assembly 210 subsequent to providing an insulating material 110-1 on the quantum well stack 146 of the assembly 208 (FIGS. 8-10). The insulating material 110-1 may take any of the forms disclosed herein, and may be deposited using any suitable technique.

Figure 12:
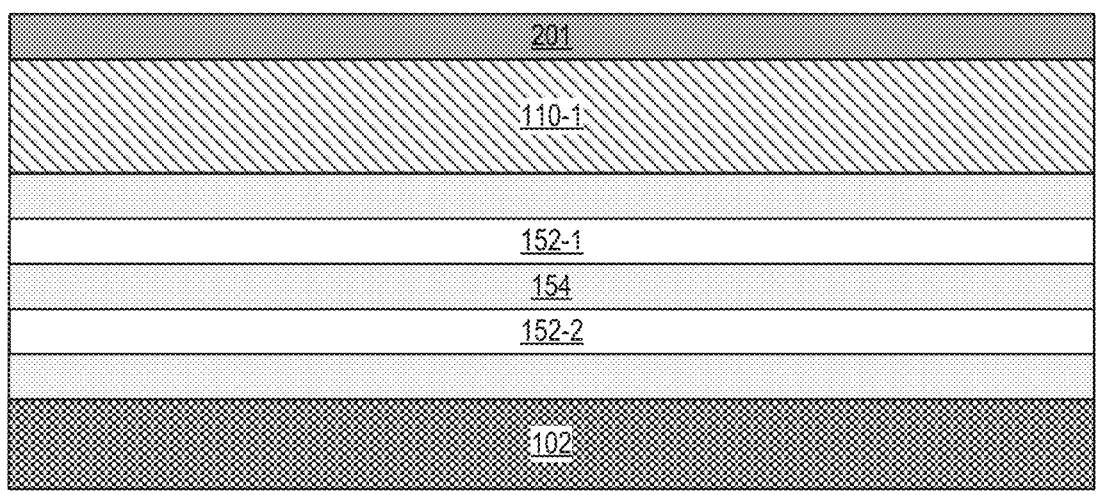

FIG. 12 is a cross-sectional view of an assembly 212 subsequent to providing a hardmask 201 on the insulating material 110-1 of the assembly 210 (FIG. 11). The hardmask 201 may be formed of an electrically insulating material, such as silicon nitride or carbon-doped nitride. The etch selectivity of the hardmask 201, as well as the other masks (e.g., hardmasks) disclosed herein, may be chosen to achieve the patterning results described, and may take any suitable form.

Figure 13A:
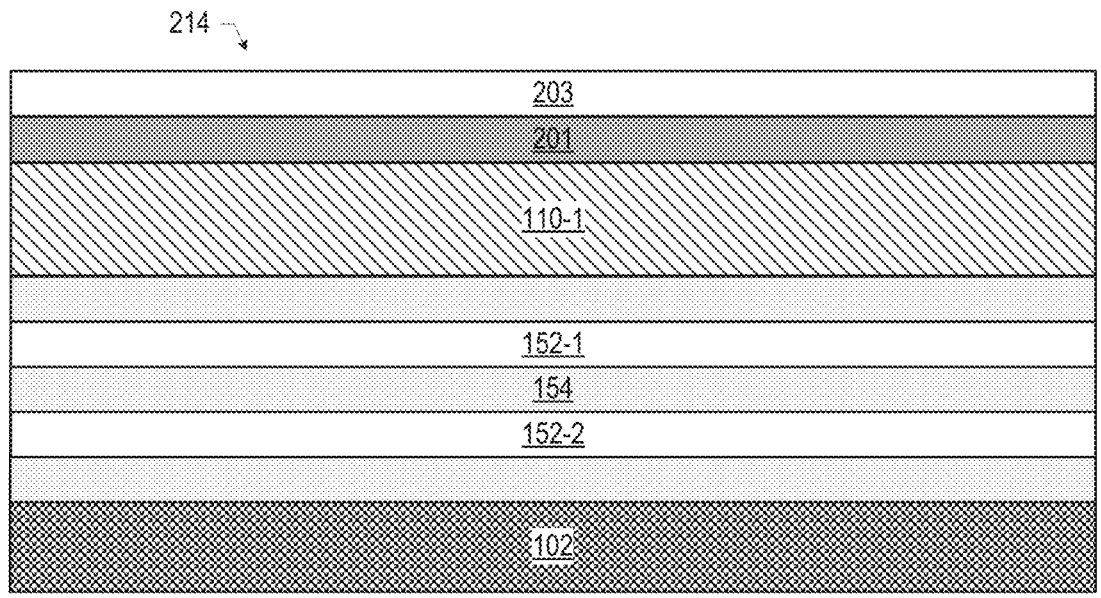
Figure 13B:
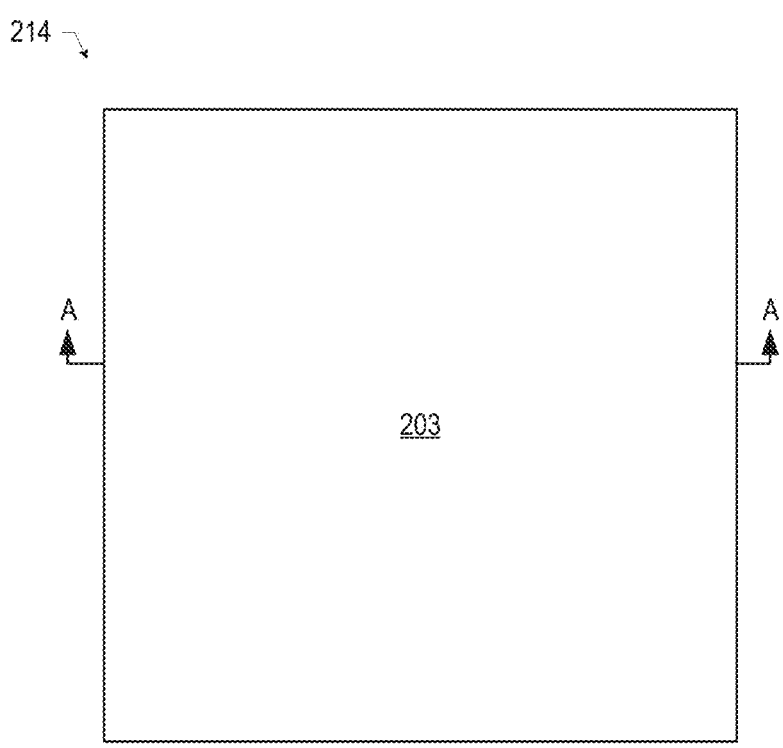

FIG. 13A is a cross-sectional view of an assembly 214 subsequent to providing a resist material 203 on the hardmask 201 of the assembly 212 (FIG. 12). FIG. 13B is a top view of the assembly 214; the cross-sectional view of FIG. 13A is taken along the section A-A of FIG. 13B. In some embodiments, the resist material 203 may be a photoresist, and when patterned, may serve as a mask for subsequent operations, as discussed below. The resist material 203, and any of the resist materials discussed herein, may be applied using any suitable technique, such as coating or casting processes (e.g., spin coating).

Figure 14A:
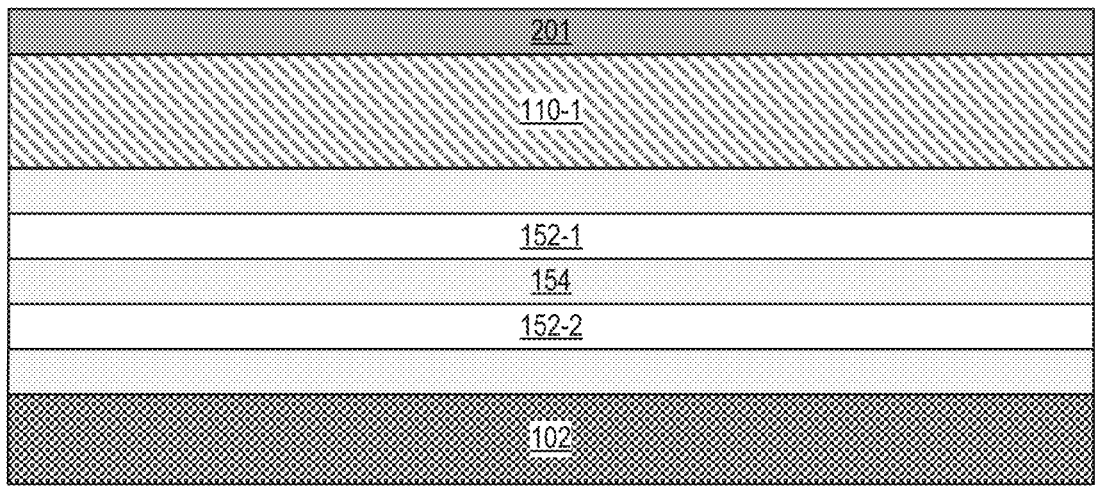
Figure 14B:
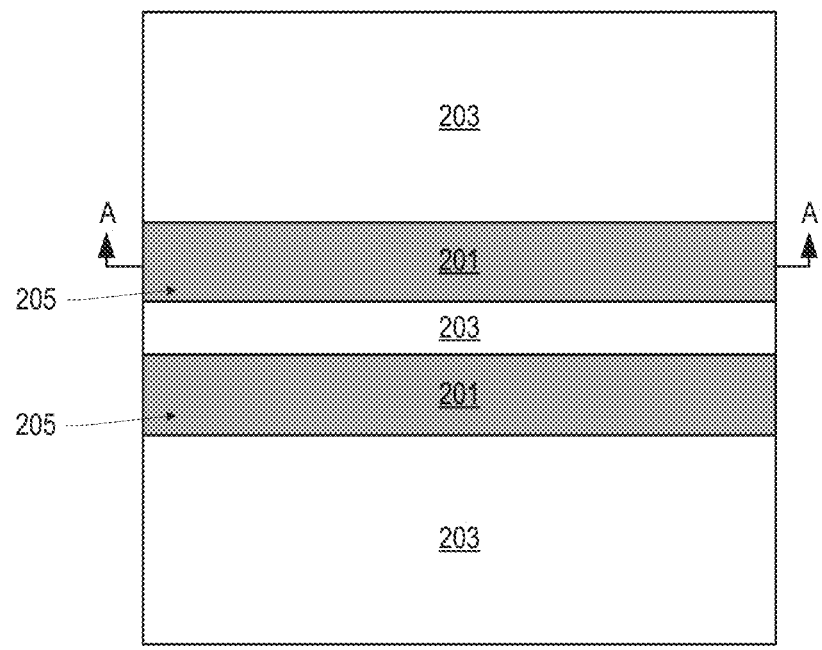

FIG. 14A is a cross-sectional view of an assembly 216 subsequent to patterning trenches 205 in the resist material 203 of the assembly 214 (FIGS. 13A and 13B). FIG. 14B is a top view of the assembly 216; the cross-sectional view of FIG. 14A is taken along the section A-A of FIG. 14B. In particular, the view of FIG. 14A is taken along a trench 205. The trenches 205 may be parallel, and when patterned using conventional lithography, may have a width between 20 and 150 nanometers (e.g., between 30 and 80 nanometers) and a pitch between 60 and 300 nanometers (e.g., between 80 and 160 nanometers). Only two trenches 205 are illustrated in FIG. 14B for economy of illustration, but any desired number of trenches 205 may be formed. The resist material 203 may be patterned using any suitable technique (e.g., any suitable lithographic technique).

Figure 15A:
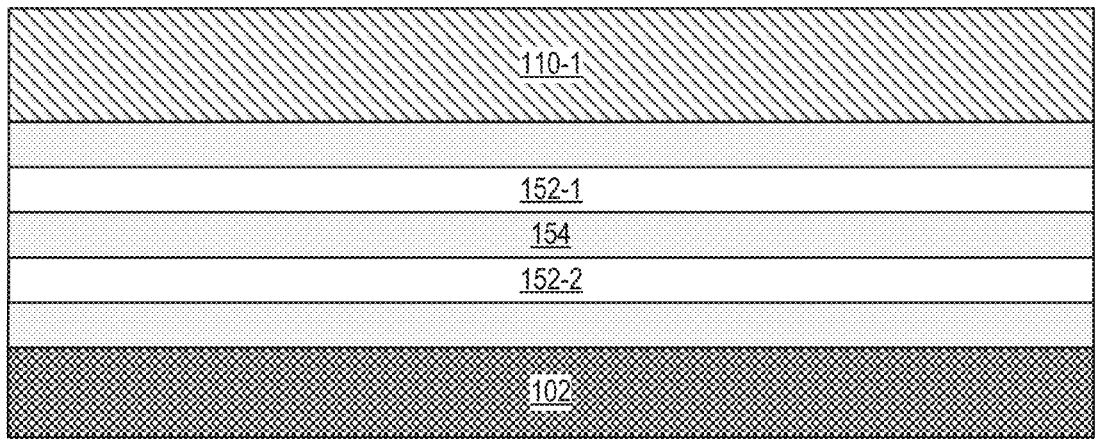
Figure 15B:
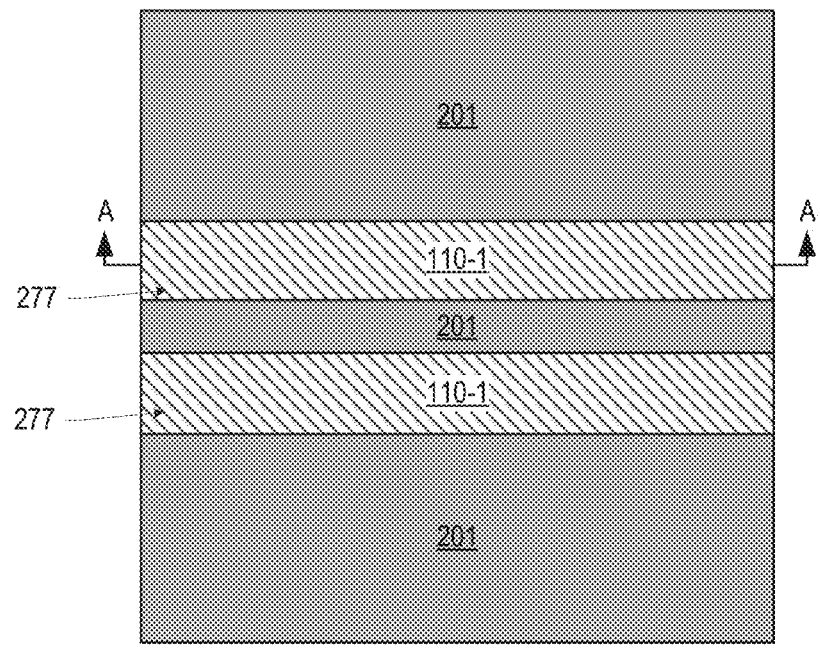

FIG. 15A is a cross-sectional view of an assembly 218 subsequent to patterning the hardmask 201 in accordance with the pattern of the resist material 203 of the assembly 216 (FIGS. 14A and 14B), and then removing the remaining resist material 203. FIG. 15B is a top view of the assembly 218; the cross-sectional view of FIG. 15A is taken along the section A-A of FIG. 15B. The resulting patterned hardmask 201 may include trenches 277 corresponding to the trenches 205 in the resist material 203. The hardmask 201 may be patterned using any suitable technique (such as dry etching).

Figure 16A:
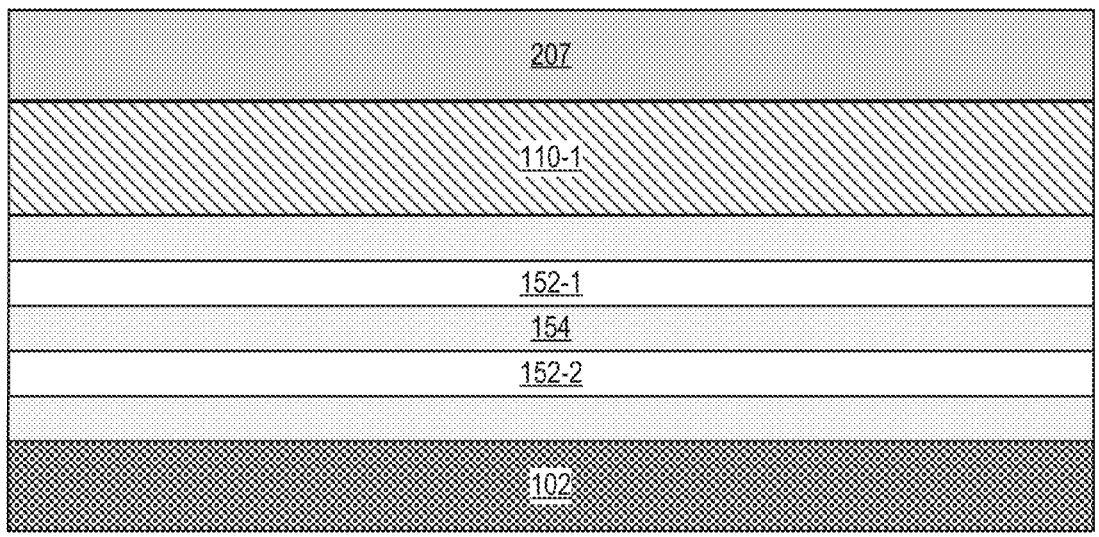
Figure 16B:
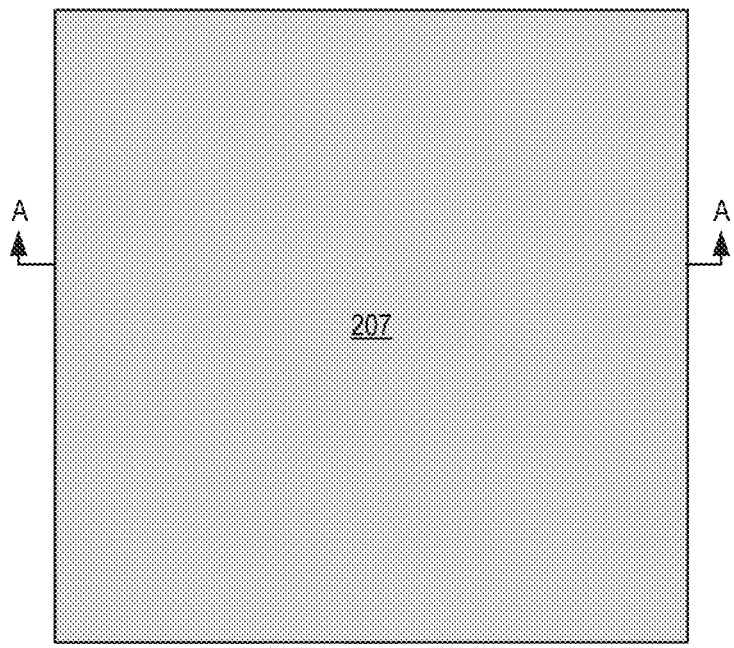

FIG. 16A is a cross-sectional view of an assembly 220 subsequent to providing a hardmask 207 on the insulating material 110-1 and the patterned hardmask 201 of the assembly 218 (FIGS. 15A and 15B). FIG. 16B is a top view of the assembly 220; the cross-sectional view of FIG. 16A is taken along the section A-A of FIG. 16B. The hardmask 207 may be formed of any suitable material, such as any of the materials discussed above with reference to the hardmask 201.

Figure 17A:
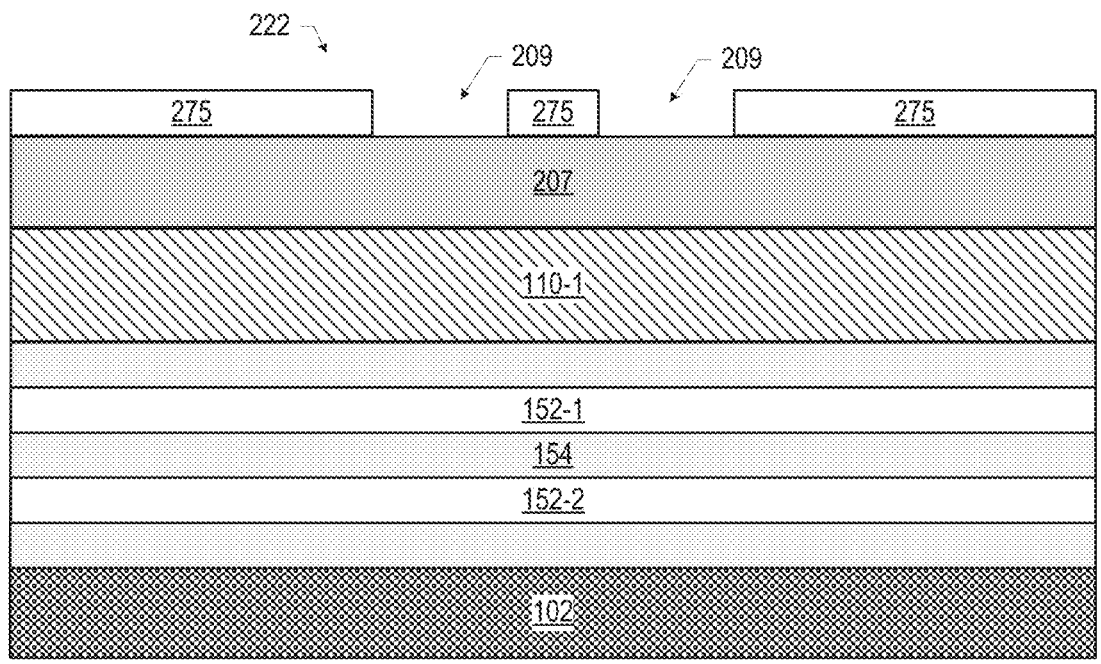
Figure 17B:
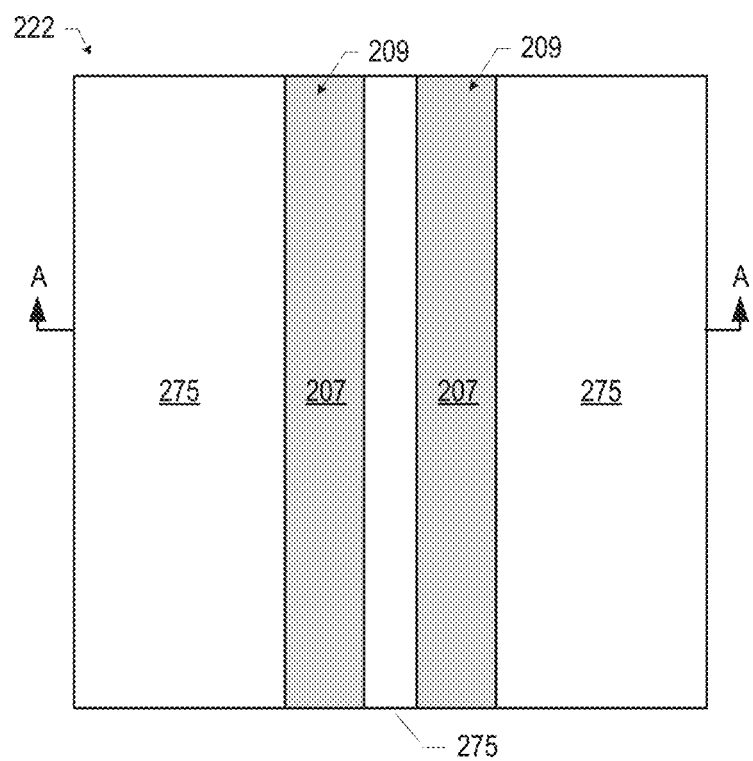

FIG. 17A is a cross-sectional view of an assembly 222 subsequent to providing a resist material 275 on the hardmask 207 of the assembly 220 (FIGS. 16A and 16B), and patterning trenches 209 in the resist material 275. FIG. 17B is a top view of the assembly 222; the cross-sectional view of FIG. 17A is taken along the section A-A of FIG. 17B. The resist material 275 may take any suitable form (e.g., a photoresist). The trenches 209 in the resist material 275 may be oriented differently than the trenches 205 in the assembly 216 (FIGS. 14A and 14B); for example, as illustrated in FIGS. 17A and 17B, the trenches 209 may be perpendicular to, and overlap with, the trenches 205. The trenches 209 may be parallel, and may have any of the widths and spacings discussed above with reference to the trenches 205. Only two trenches 209 are illustrated in FIGS. 17A and 17B for economy of illustration, but any desired number of trenches 209 may be formed. The resist material 275 may be patterned using any suitable technique (e.g., any suitable lithographic technique).

Figure 18A:
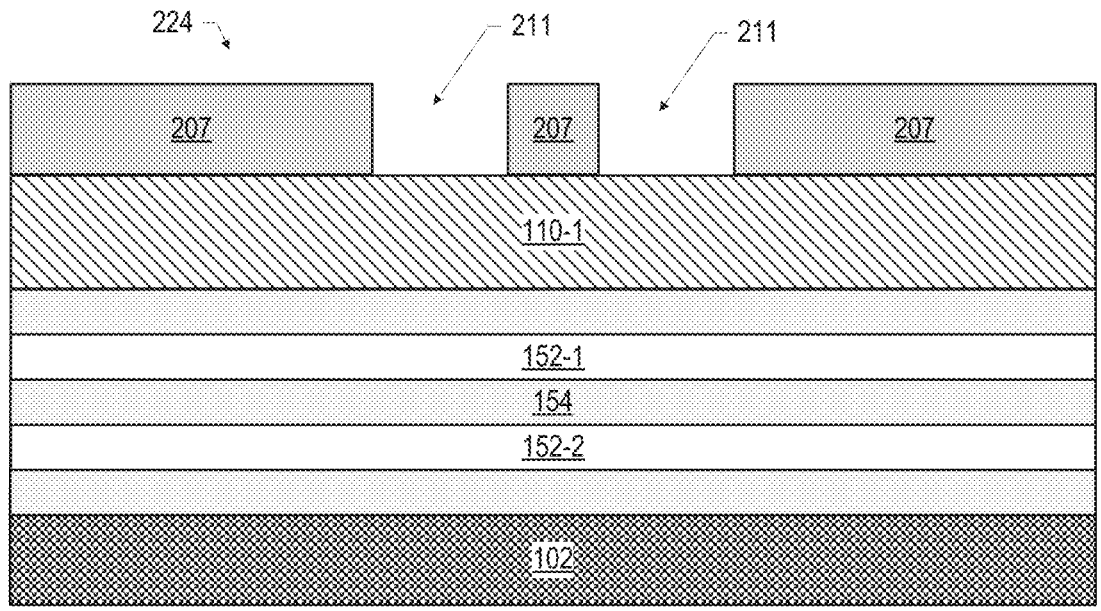
Figure 18B:
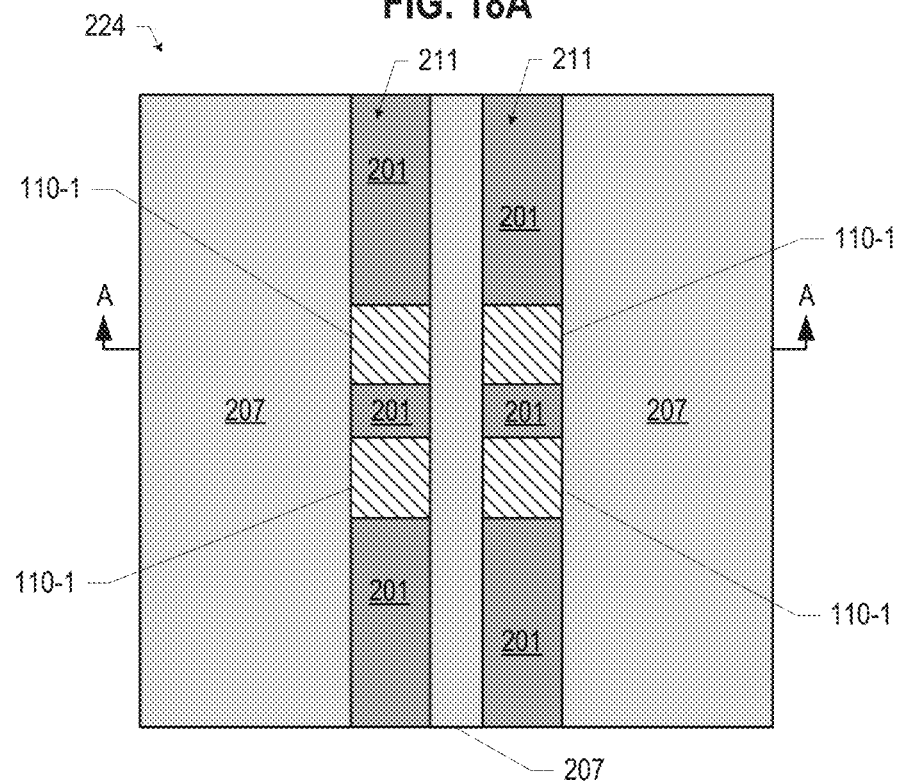

FIG. 18A is a cross-sectional view of an assembly 224 subsequent to patterning the hardmask 207 in accordance with the pattern of the resist material 275 of the assembly 222 (FIGS. 17A and 17B), and then removing the remaining resist material 275. FIG. 18B is a top view of the assembly 224; the cross-sectional view of FIG. 18A is taken along the section A-A of FIG. 18B. The resulting patterned hardmask 207 may include trenches 211 corresponding to the trenches 209 in the resist material 275. The hardmask 207 may be patterned using any suitable technique (such as dry etching). As illustrated in FIGS. 18A and 18B, rectangular portions of the surface of the insulating material 110-1 may be exposed in the assembly 224, while the remainder of the insulating material 110-1 is covered by the hardmask 201 and/or the hardmask 207.

Figure 19A:
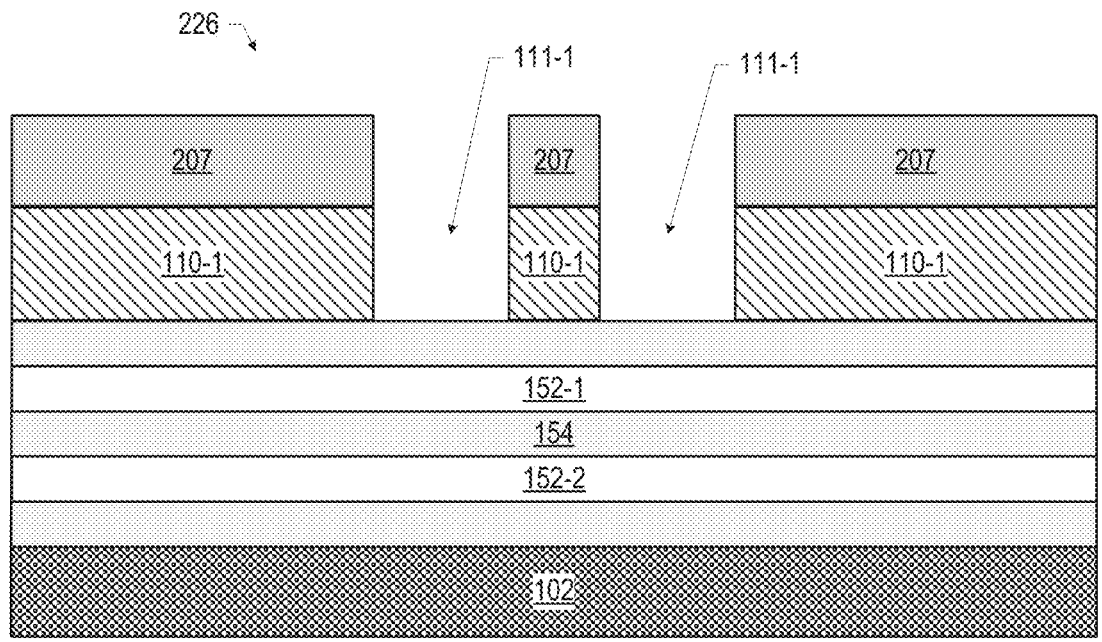
Figure 19B:
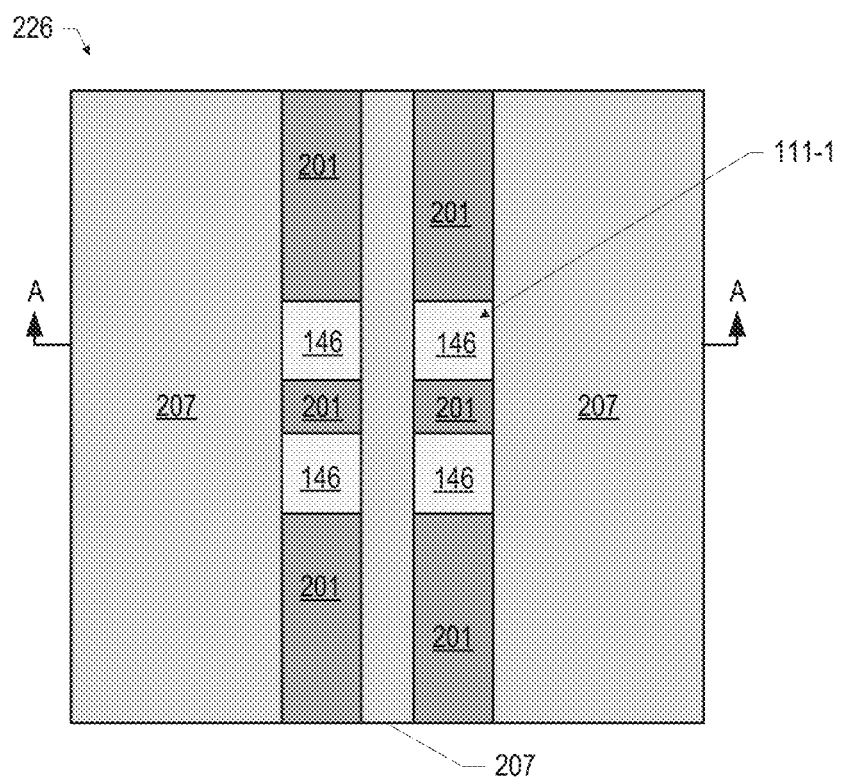

FIG. 19A is a cross-sectional view of an assembly 226 subsequent to patterning the insulating material 110-1 in accordance with the pattern of the hardmask 201 and the hardmask 207 of the assembly 224 (FIGS. 18A and 18B) so as to etch away the portions of the insulating material 110-1 that are not covered by at least one of the hardmasks 201 and 207. FIG. 19B is a top view of the assembly 226; the cross-sectional view of FIG. 19A is taken along the section A-A of FIG. 19B. The resulting patterned insulating material 110-1 may include openings 111-1 that have rectangular footprints (corresponding to the areas where the trenches 277 of the hardmask 201 "overlapped" with the trenches 211 of the hardmask 207 to expose the insulating material 110-1).

As noted above, FIGS. 20-26 illustrate alternative techniques for patterning the insulating material 110-1 of the assembly 212 (FIG. 12), which may be used instead of the techniques illustrated in FIGS. 13-19.

Figure 20A:
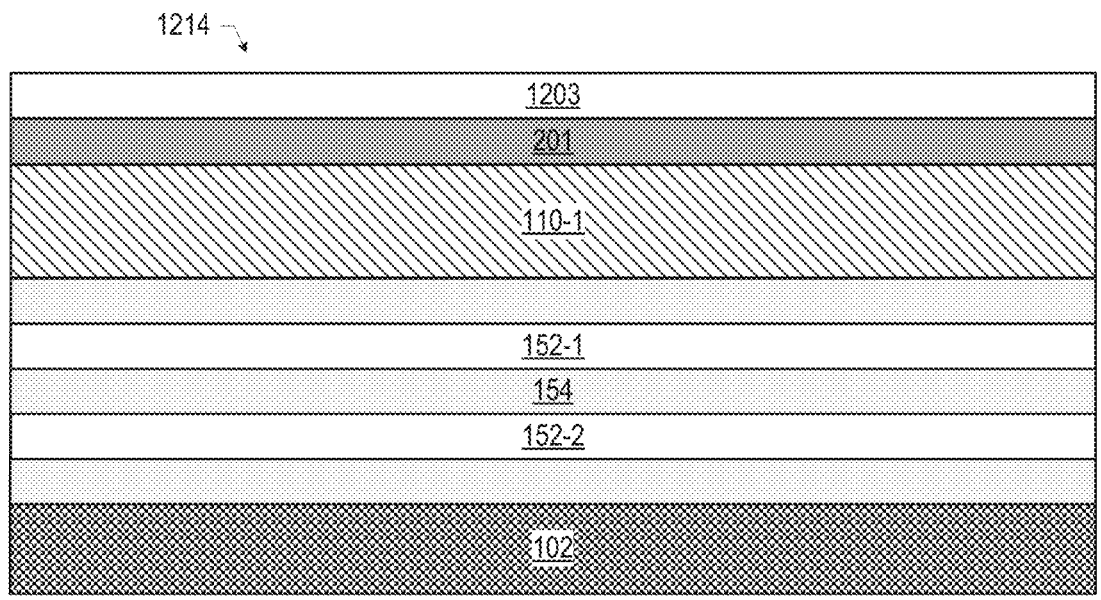
Figure 20B:
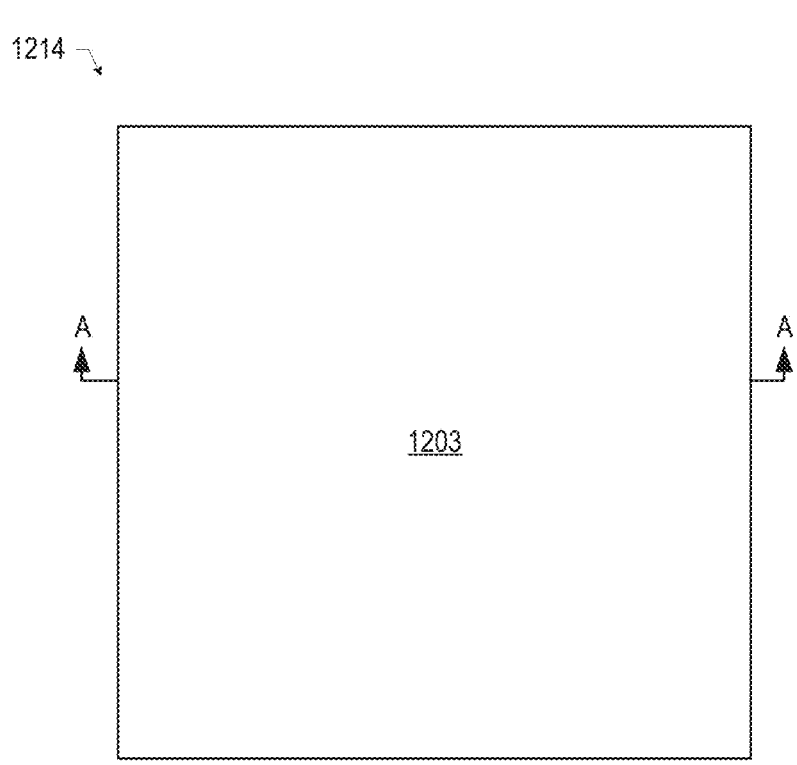

FIG. 20A is a cross-sectional view of an assembly 1214 subsequent to providing a resist material 1203 on the hardmask 201 of the assembly 212 (FIG. 12). FIG. 20B is a top view of the assembly 1214; the cross-sectional view of FIG. 20A is taken along the section A-A of FIG. 20B. The resist material 1203 may be a photoresist, and may be pre-baked after deposition. Any ones of the resist materials disclosed herein may be pre-baked after deposition, as appropriate.

Figure 21A:
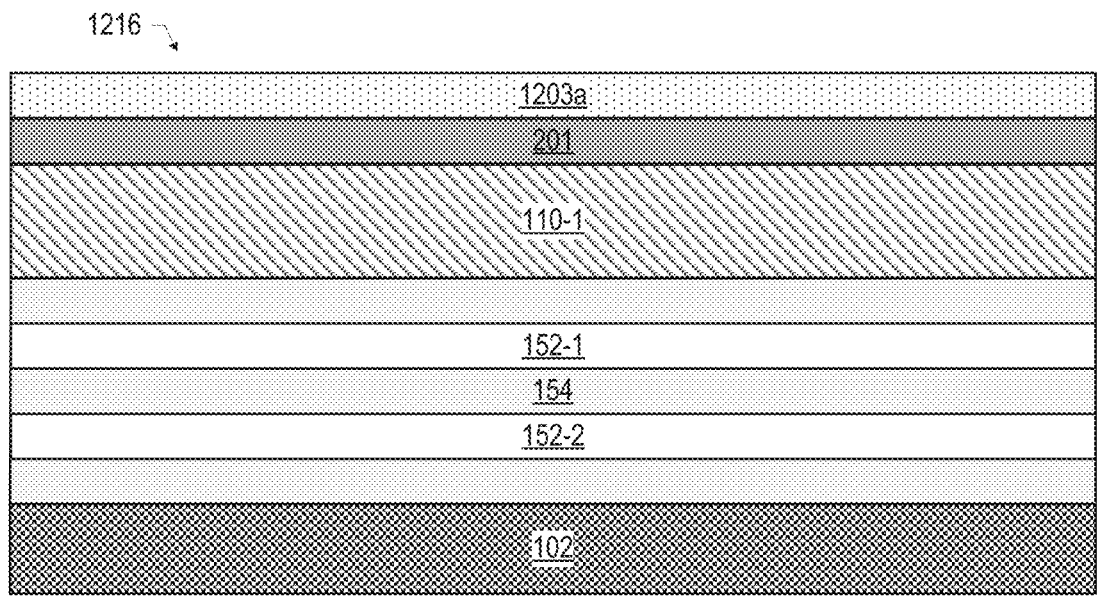
Figure 21B:
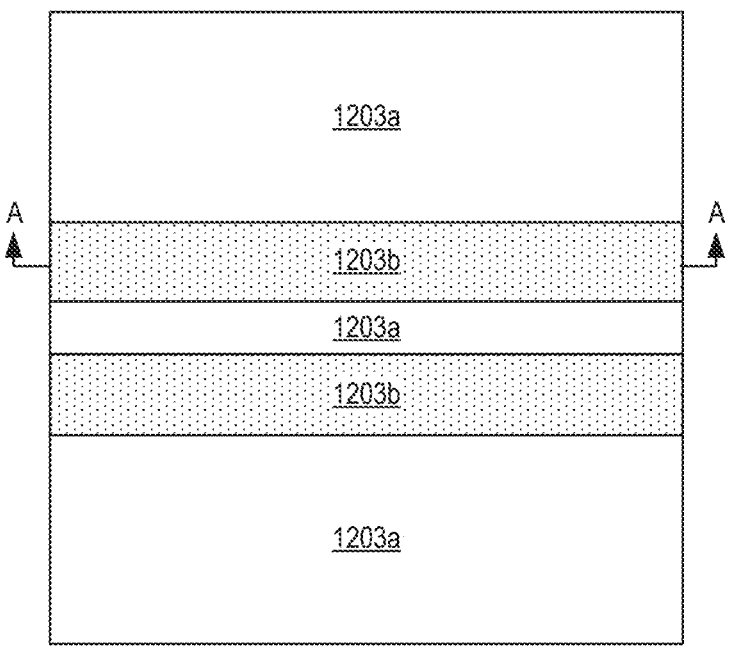

FIG. 21A is a cross-sectional view of an assembly 1216 subsequent to exposing the resist material 1203 to form unexposed resist material 1203*a* and strips of exposed resist material 1203*b* in the resist material 1203 of the assembly 1214 (FIGS. 20A and 20B). FIG. 21B is a top view of the assembly 1216; the cross-sectional view of FIG. 21A is taken along the section A-A of FIG. 21B. In particular, the view of FIG. 21A is taken along a strip of exposed resist material 1203*b*. Only two strips of exposed resist material 1203*b* are illustrated in FIG. 21B for economy of illustration, but any desired number of strips of exposed resist material 1203*b* may be formed. The resist material 1203 of the assembly 1216 may be subject to a post-exposure bake, in some embodiments. Any of the resist materials disclosed herein may be subject to a post-exposure bake, as appropriate.

Figure 22A:
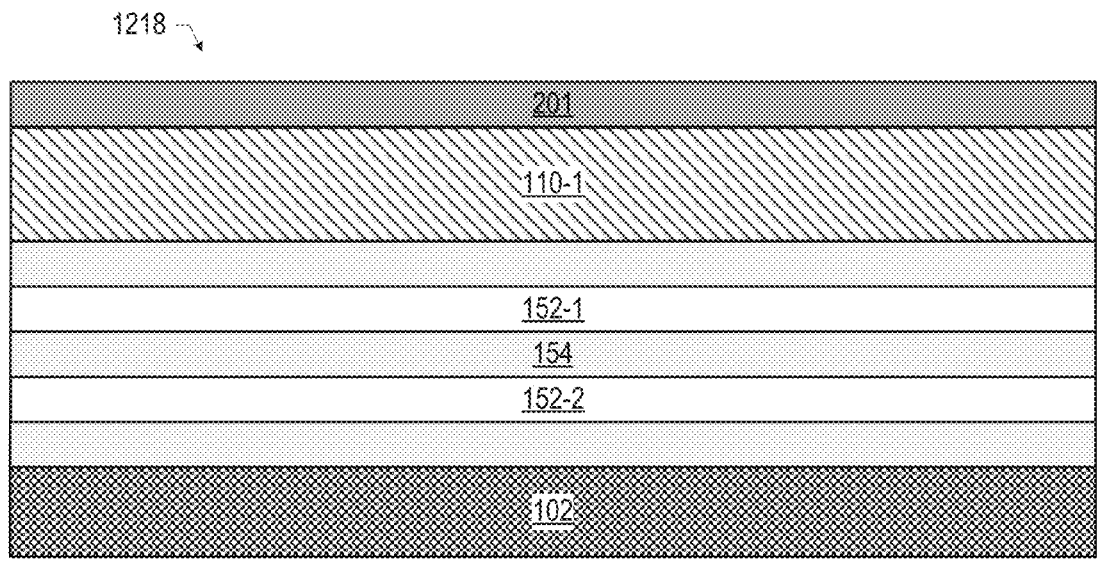
Figure 22B:
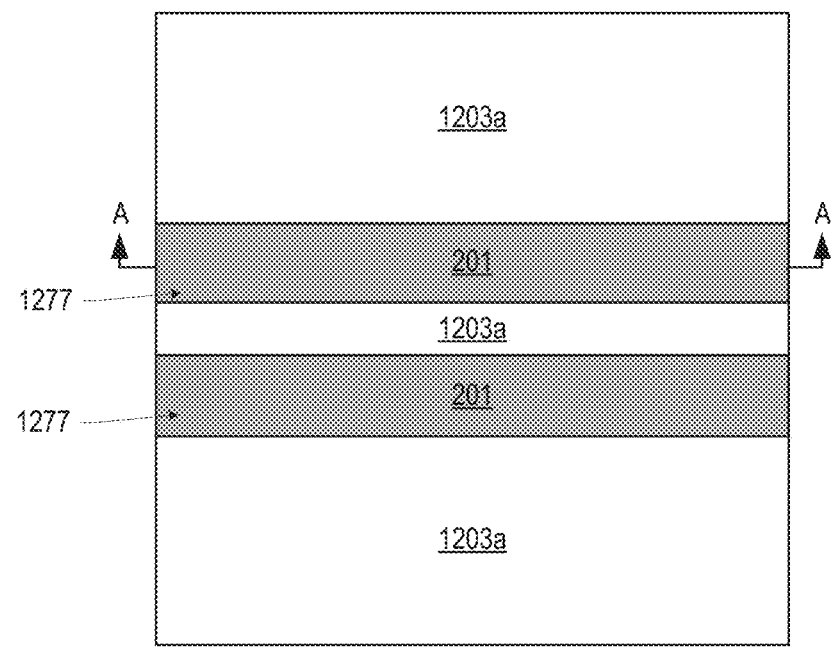

FIG. 22A is a cross-sectional view of an assembly 1218 subsequent to developing the resist material 1203 of the assembly 1216 (FIGS. 21A and 21B) to remove the strips of exposed resist material 1203*b* to form trenches 1277 in the resist material 1203. FIG. 22B is a top view of the assembly 1218; the cross-sectional view of FIG. 22A is taken along the section A-A of FIG. 22B. The remaining unexposed resist material 1203a may be hard-baked, in some embodiments. Any of the resist materials disclosed herein may be hard-baked, as appropriate.

Figure 23A:
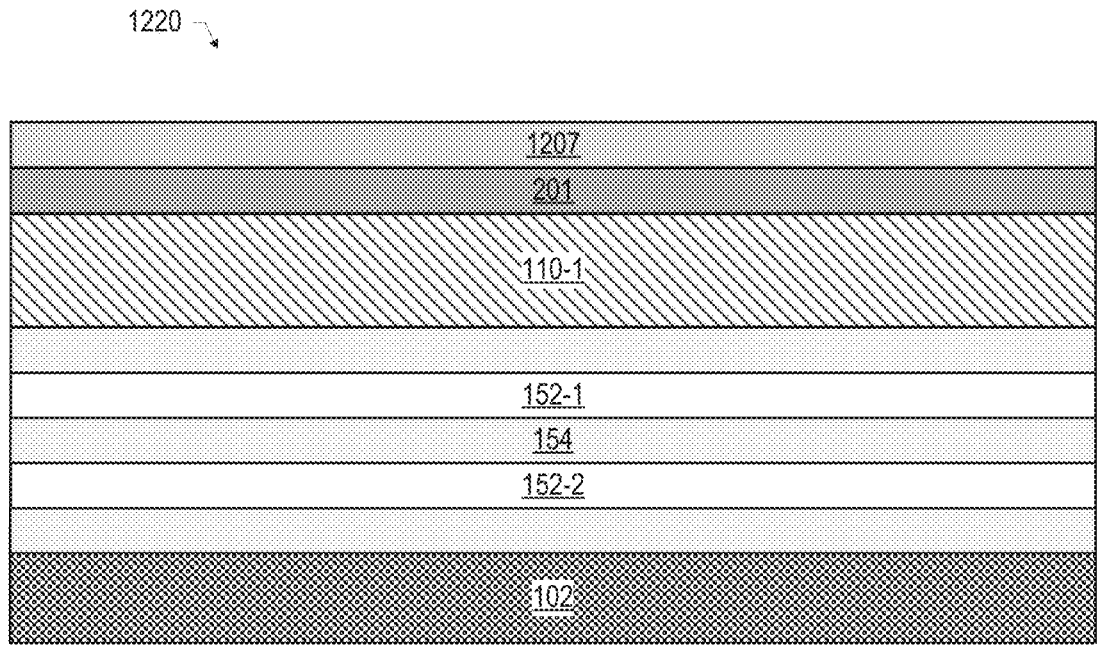
Figure 23B:
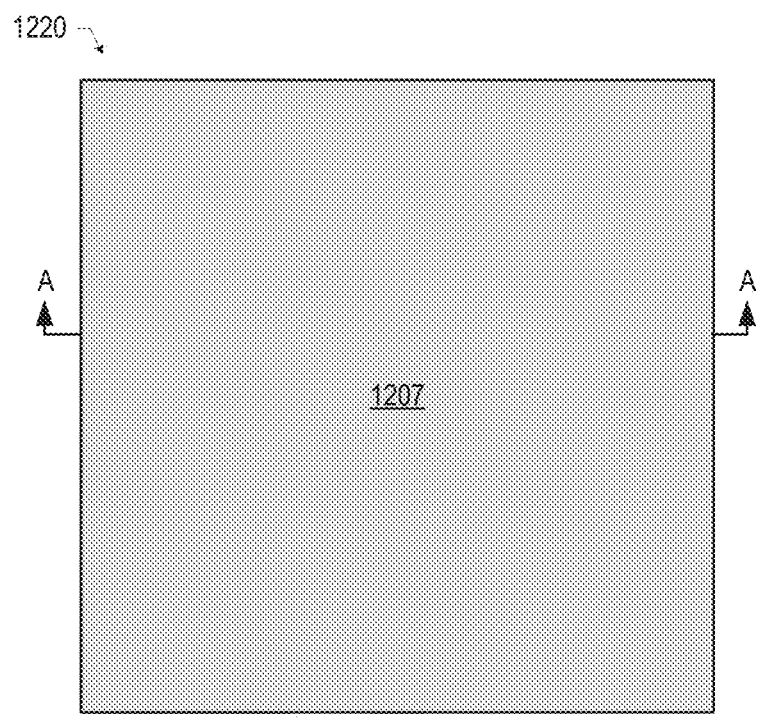

FIG. 23A is a cross-sectional view of an assembly 1220 subsequent to providing another layer of resist material 1207 on the assembly 1218 (FIGS. 22A and 22B). FIG. 23B is a top view of the assembly 1220; the cross-sectional view of FIG. 23A is taken along the section A-A of FIG. 23B. The resist material 1207 may take any of the forms discussed above with reference to the resist material 1203, for example. In some embodiments, the resist material 1207 may be pre-baked after deposition.

Figure 24A:
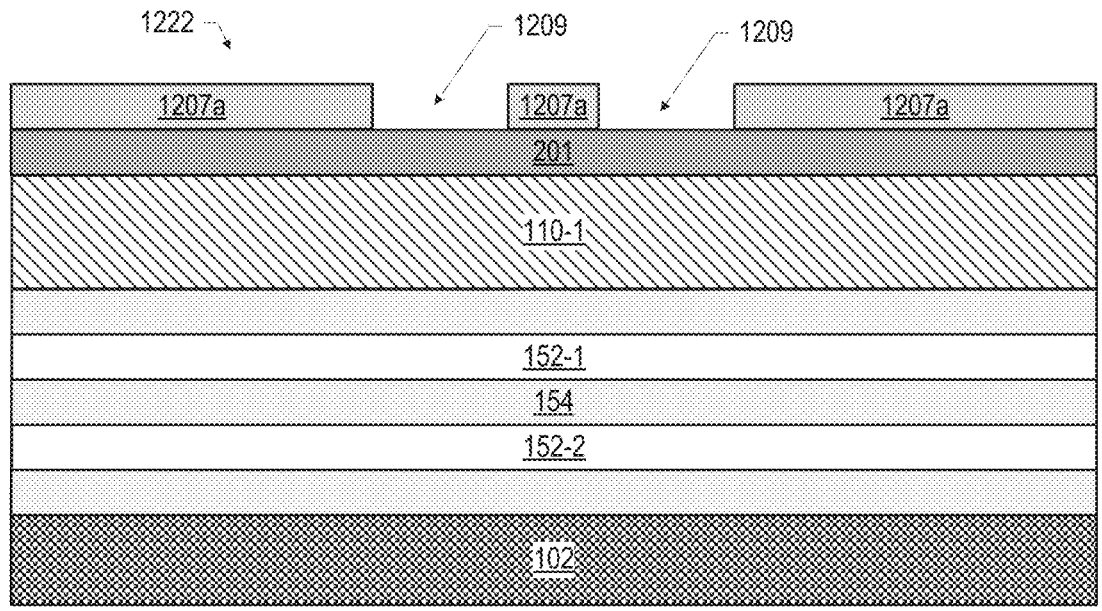
Figure 24B:
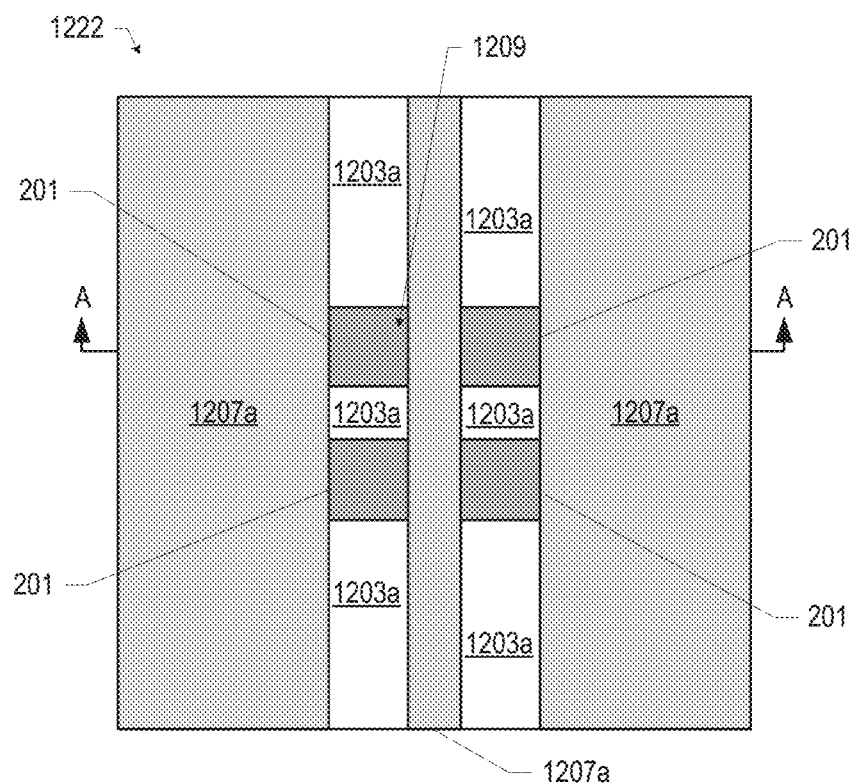

FIG. 24A is a cross-sectional view of an assembly 1222 subsequent to exposing and developing the resist material 1207 of the assembly 1220 (FIGS. 23A and 23B) to form trenches 1209 in the resist material 1207. FIG. 24B is a top view of the assembly 1222; the cross-sectional view of FIG. 24A is taken along the section A-A of FIG. 24B. The resist material 1207 may be exposed in accordance with any of the embodiments discussed above with reference to FIGS. 21A and 21B (leaving unexposed resist material 1207a in which the trenches 1209 are defined), and may be developed in accordance with any of the embodiments discussed above with reference to FIGS. 22A and 22B. The trenches 1209 in the resist material 1207 may be oriented differently than the trenches 1277 in the assembly 1218 (FIGS. 22A and 22B); for example, as illustrated in FIGS. 24A and 24B, the trenches 1209 may be perpendicular to, and overlap with, the trenches 1277 to expose the hardmask 201. The trenches 1209 may be parallel, and may have any of the widths and spacings discussed above with reference to the trenches 1277. Only two trenches 1209 are illustrated in FIGS. 24A and 24B for economy of illustration, but any desired number of trenches 1209 may be formed.

Figure 25A:
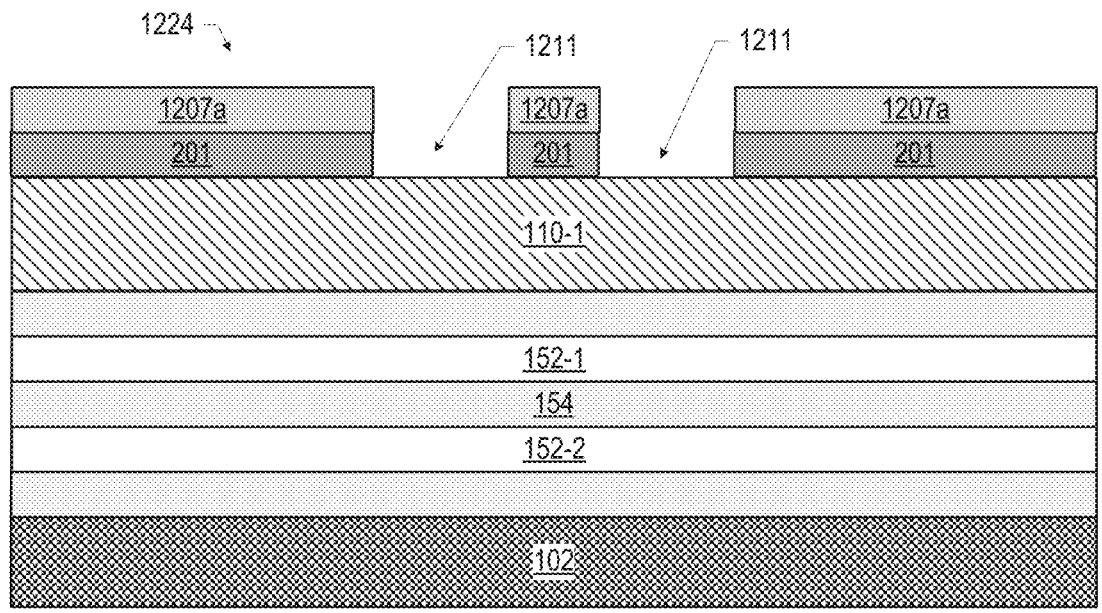
Figure 25B:
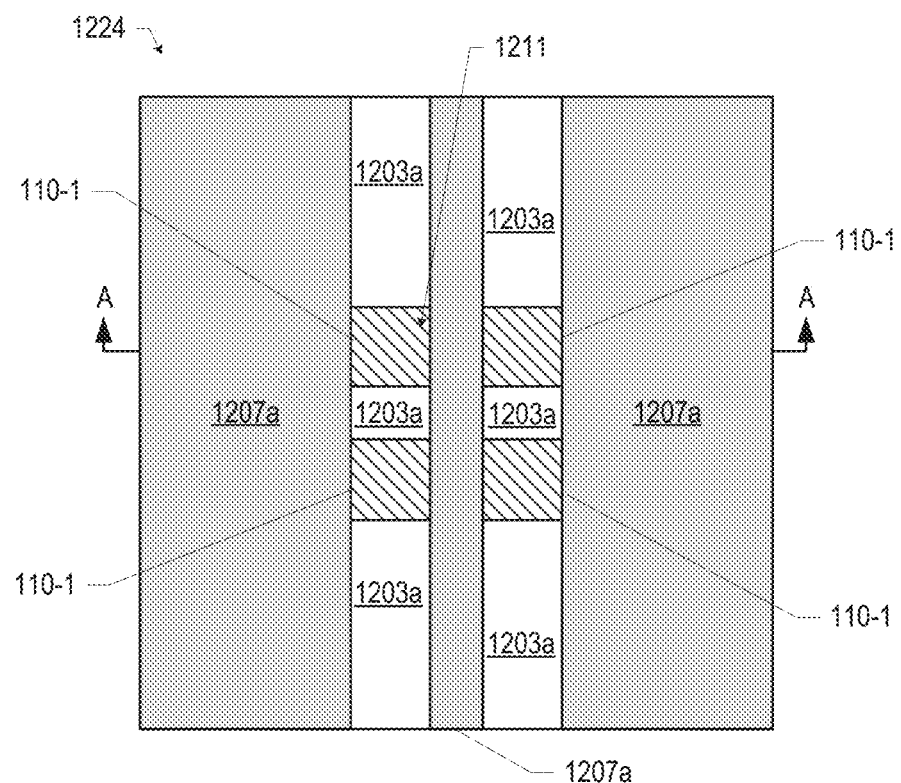

FIG. 25A is a cross-sectional view of an assembly 1224 subsequent to etching the hardmask 201 of the assembly 1222 (FIGS. 24A and 24B) to remove portions of the hardmask 201 that are not covered by the unexposed resist material 1207a or the unexposed resist material 1203a. FIG. 25B is a top view of the assembly 1224; the cross-sectional view of FIG. 25A is taken along the section A-A of FIG. 25B. The resulting patterned hardmask 201 may include trenches 1211 corresponding to the areas of overlap between the trenches 1209 and the trenches 1277. The hardmask 201 may be patterned using any suitable technique (such as dry etching). As illustrated in FIGS. 25A and 25B, rectangular portions of the surface of the insulating material 110-1 may be exposed in the assembly 1224, while the remainder of the insulating material 110-1 is covered by the hardmask 201.

Figure 26A:
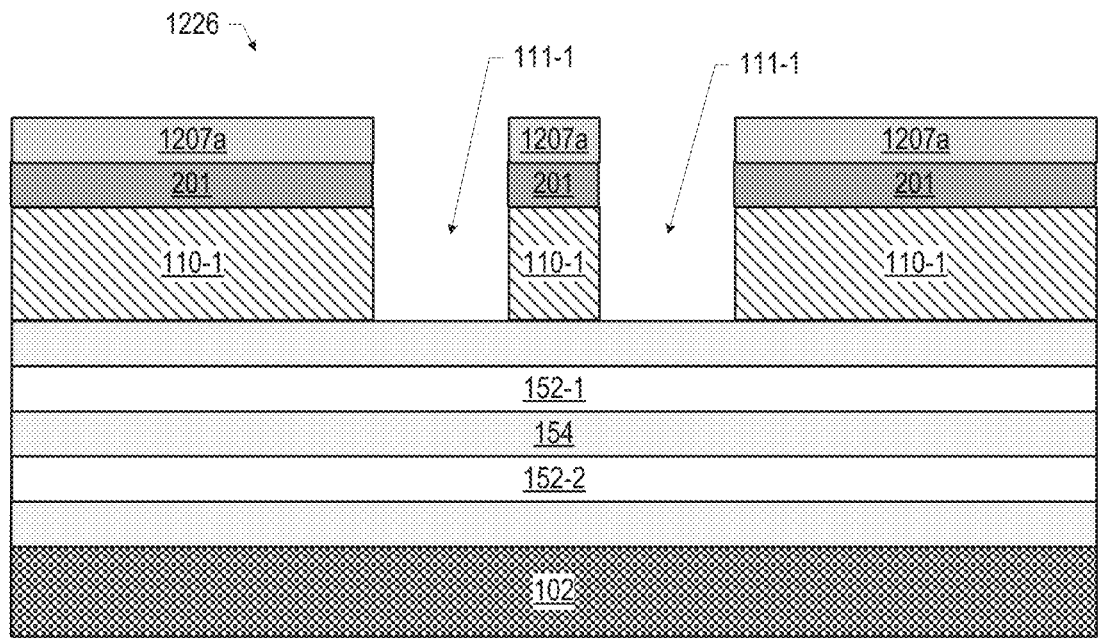
Figure 26B:
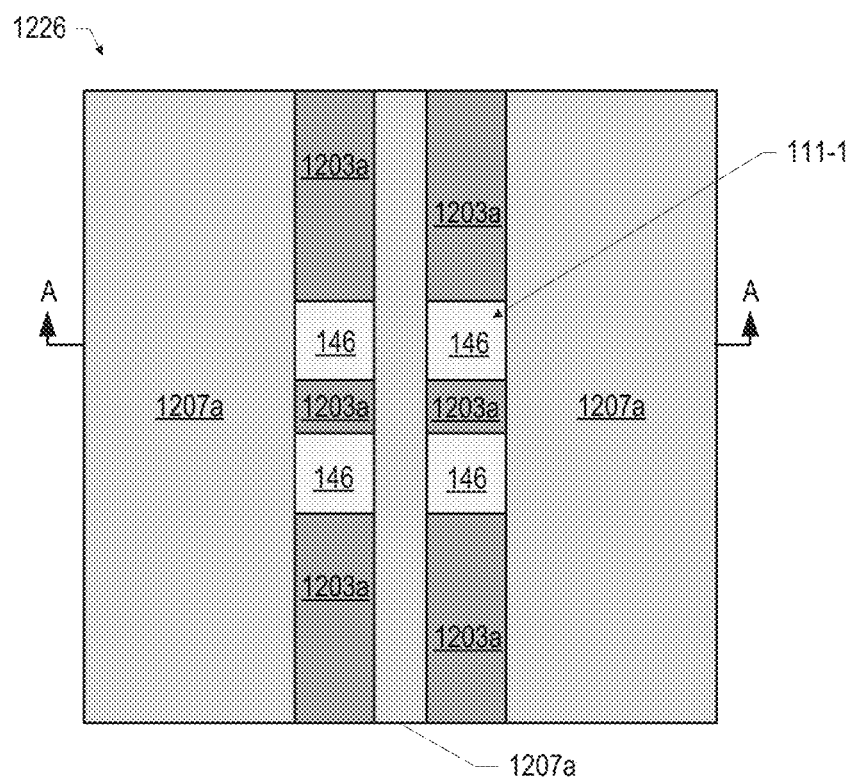

FIG. 26A is a cross-sectional view of an assembly 1226 subsequent to patterning the insulating material 110-1 in accordance with the pattern of the hardmask 201 of the assembly 1224 (FIGS. 25A and 25B) so as to etch away the portions of the insulating material 110-1 that are not covered by the hardmask 201. FIG. 26B is a top view of the assembly 1226; the cross-sectional view of FIG. 26A is taken along the section A-A of FIG. 26B. The resulting patterned insulating material 110-1 may include openings 111-1 that have rectangular footprints (corresponding to the areas where the trenches 1209 "overlapped" with the trenches 1211 to expose the insulating material 110-1).

Figure 27:
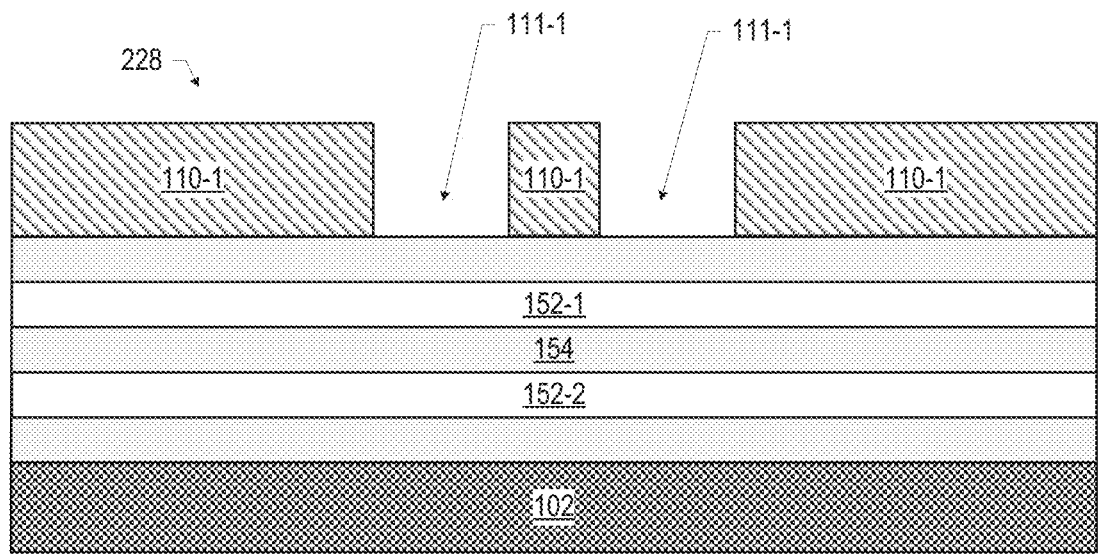
Figure 28:
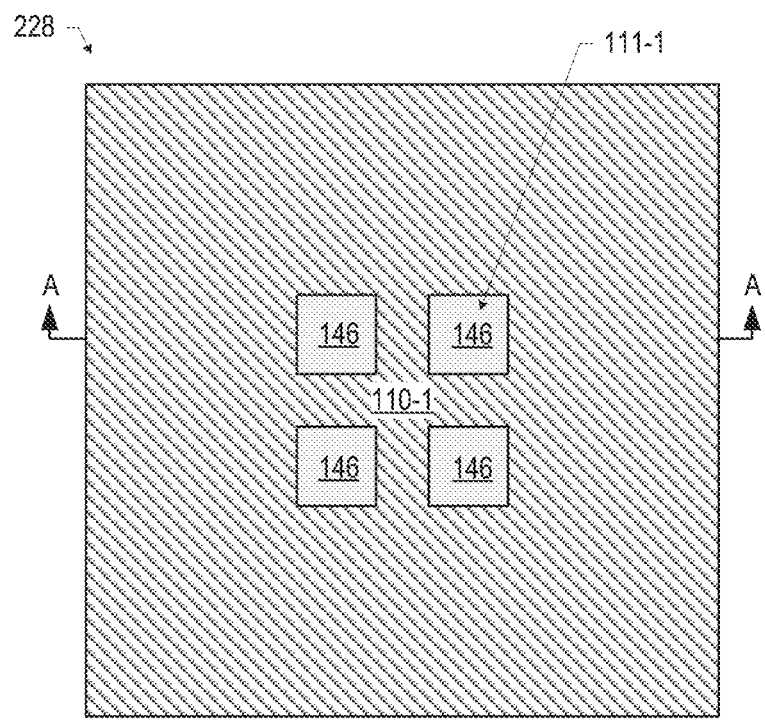

FIG. 27 is a cross-sectional view of an assembly 228 subsequent to removing the hardmasks 201 and 207 of the assembly 226 (FIGS. 19A and 19B), or subsequent to removing the resist layers 1203 and 1207 and the hardmask 201 of the assembly 1226 (FIGS. 26A and 26B). FIG. 28 is a top view of the assembly 228; the cross-sectional view of FIG. 27 is taken along the section A-A of FIG. 28. In the assembly 228, the insulating material 110-1 may have a grid or cross-grating shape around the rectangular openings 111-1, and the quantum well stack 146 may be exposed through these openings. As noted above, although only four openings 111-1 arranged in a 2×2 array are illustrated in FIGS. 27 and 28, any array of openings 111-1 of any desired number and size may be formed using the techniques disclosed herein. Although FIGS. 19A-19B illustrated an embodiment in which the insulating material 110-1 is etched after the hardmasks 201 and 207 are patterned, in some embodiments, an additional hardmask may be disposed between the insulating material 110-1 and the hardmasks 201/207; in such an embodiment, instead of patterning the insulating material 110-1 after patterning the hardmasks 201/207, the pattern in the hardmasks 201/207 may be used to etch the grid/grating pattern into this additional hardmask, and this pattern may then be subsequently transferred to the insulating material 110-1. Such an approach may improve the tailoring of etch selectivity and reduce potential damage to the insulating material 110-1.

Figure 29:
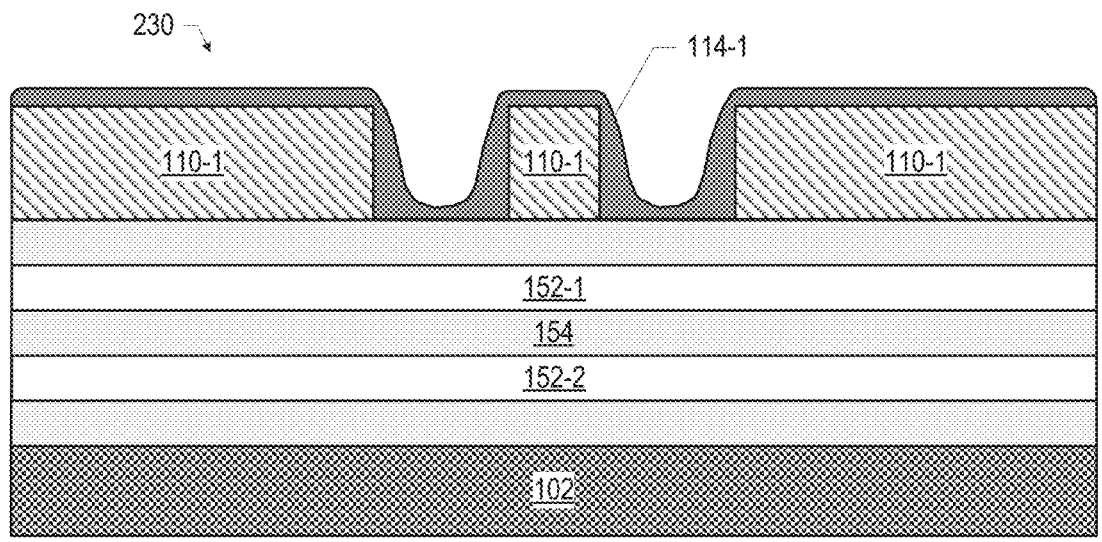

FIG. 29 is a cross-sectional view of an assembly 230 subsequent to providing a gate dielectric 114-1 on the quantum well stack 146 in the openings 111-1 between portions of the insulating material 110-1 of the assembly 228 (FIGS. 27 and 28). In some embodiments, the gate dielectric 114-1 of the assembly 230 may be formed by atomic layer deposition (ALD) and, as illustrated in FIG. 29, may cover the exposed quantum well stack 146 in the openings 111-1 and may extend onto the adjacent insulating material 110-1.

Figure 30:
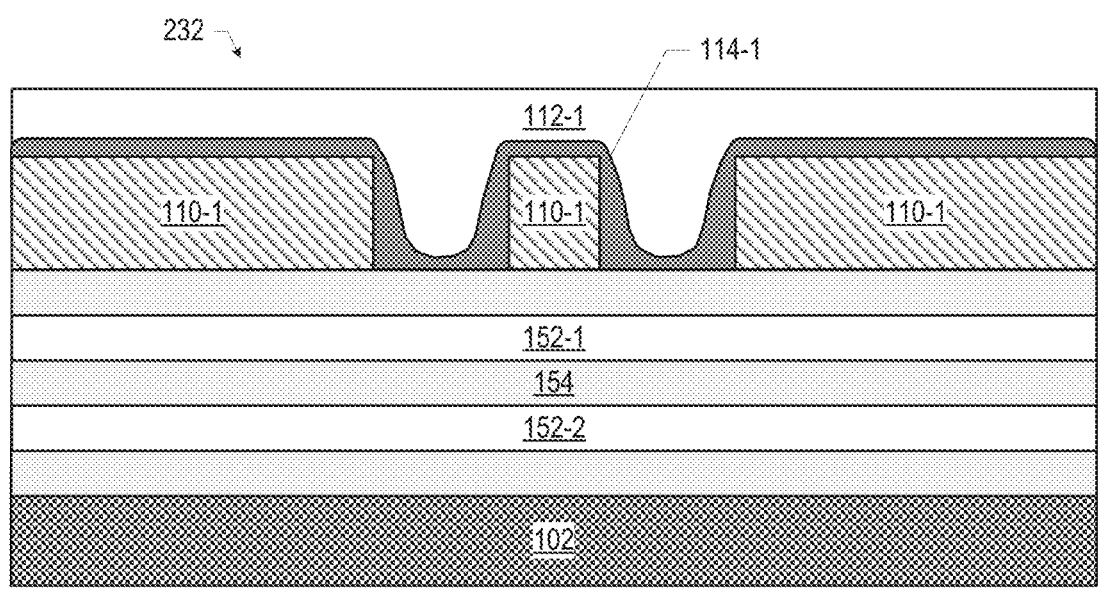

FIG. 30 is a cross-sectional view of an assembly 232 subsequent to providing the gate metal 112-1 on the assembly 230 (FIG. 29). The gate metal 112-1 may fill the openings 111-1 between the gate dielectric 114-1 disposed on adjacent side walls of the insulating material 110-1, and may extend over the insulating material 110-1. The gate metal 112-1 may be provided using any suitable technique.

Figure 31:
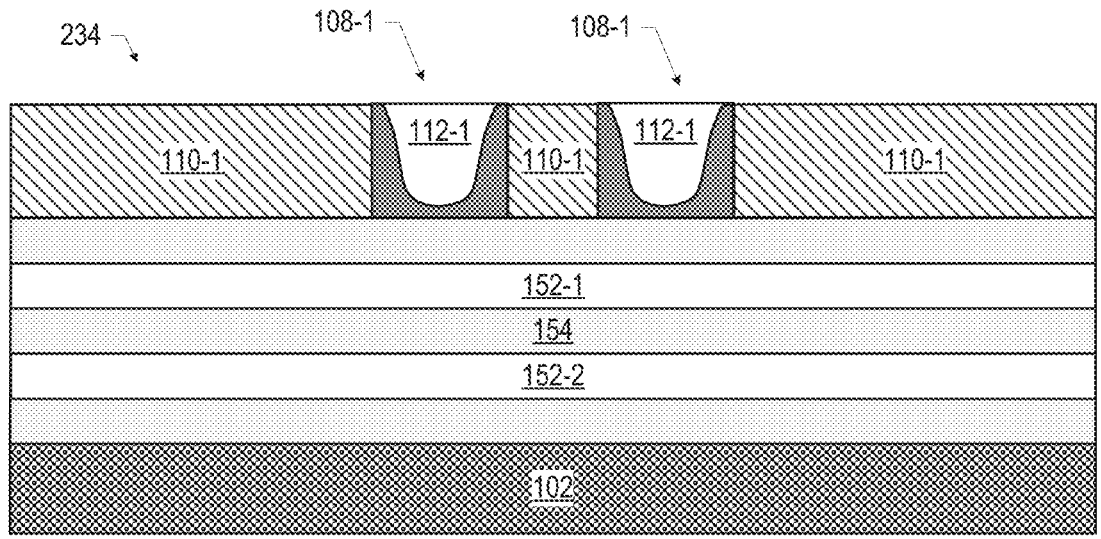

FIG. 31 is a cross-sectional view of an assembly 234 subsequent to planarizing the assembly 232 (FIG. 30) to remove the gate metal 112-1 and the gate dielectric 114-1 above the insulating material 110-1. In some embodiments, the assembly 232 may be planarized to form the assembly 234 using a CMP technique. The remaining gate metal 112-1 may fill the openings 111-1 in the insulating material 110-1.

Figure 32:
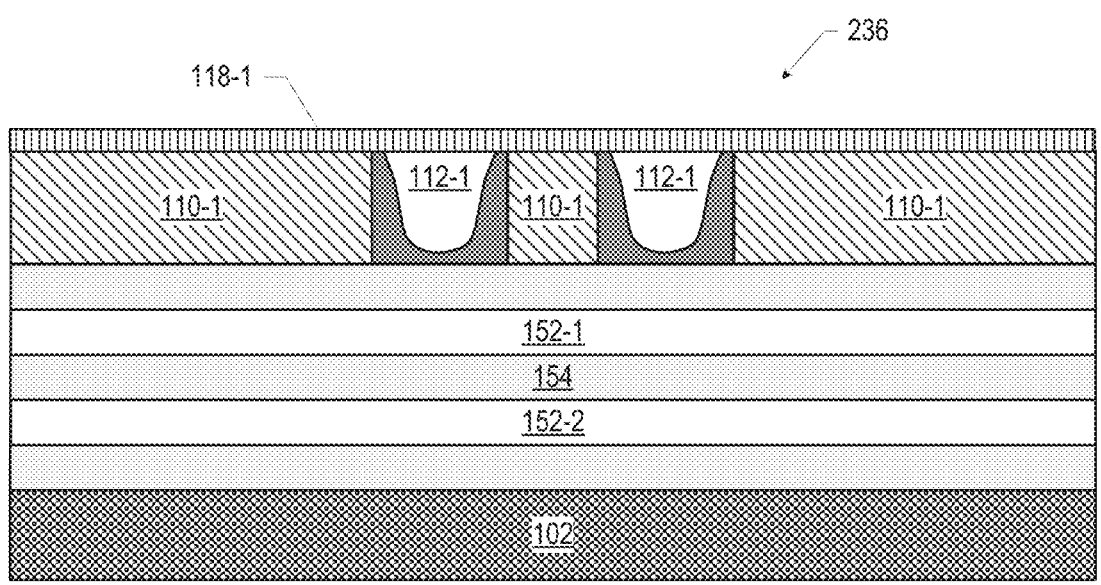

FIG. 32 is a cross-sectional view of an assembly 236 subsequent to providing a hardmask 118-1 on the planarized surface of the assembly 234 (FIG. 31). The hardmask 118-1 may be formed of an electrically insulating material, such as silicon nitride or carbon-doped nitride, or any of the other materials discussed above.

Figure 33:
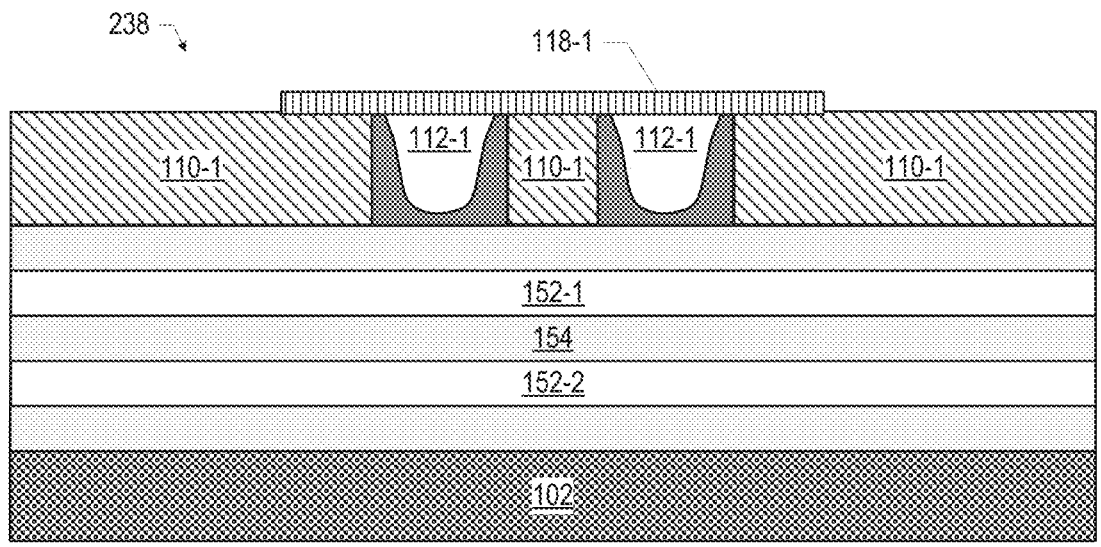

FIG. 33 is a cross-sectional view of an assembly 238 subsequent to patterning the hardmask 118-1 of the assembly 236 (FIG. 32). The pattern applied to the hardmask 118-1 may extend over the gate metal 112-1 and onto adjacent portions of the insulating material 110-1. The hardmask 118-1 may be patterned by applying a resist, patterning the resist using lithography, and then etching the hardmask (using dry etching or any appropriate technique).

Figure 34:
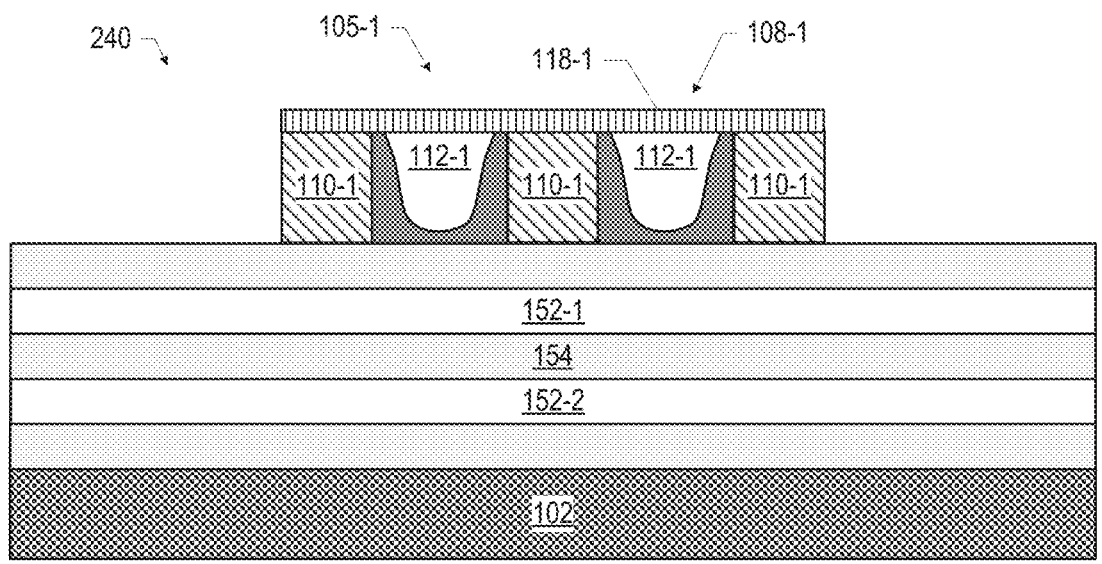

FIG. 34 is a cross-sectional view of an assembly 240 subsequent to etching the assembly 238 (FIG. 33) to remove the portions of insulating material 110-1 that are not protected by the patterned hardmask 118-1. The patterned hardmask 118-1 may remain on top of the insulating material 110-1 and gates 108-1, as shown.

Figure 35:
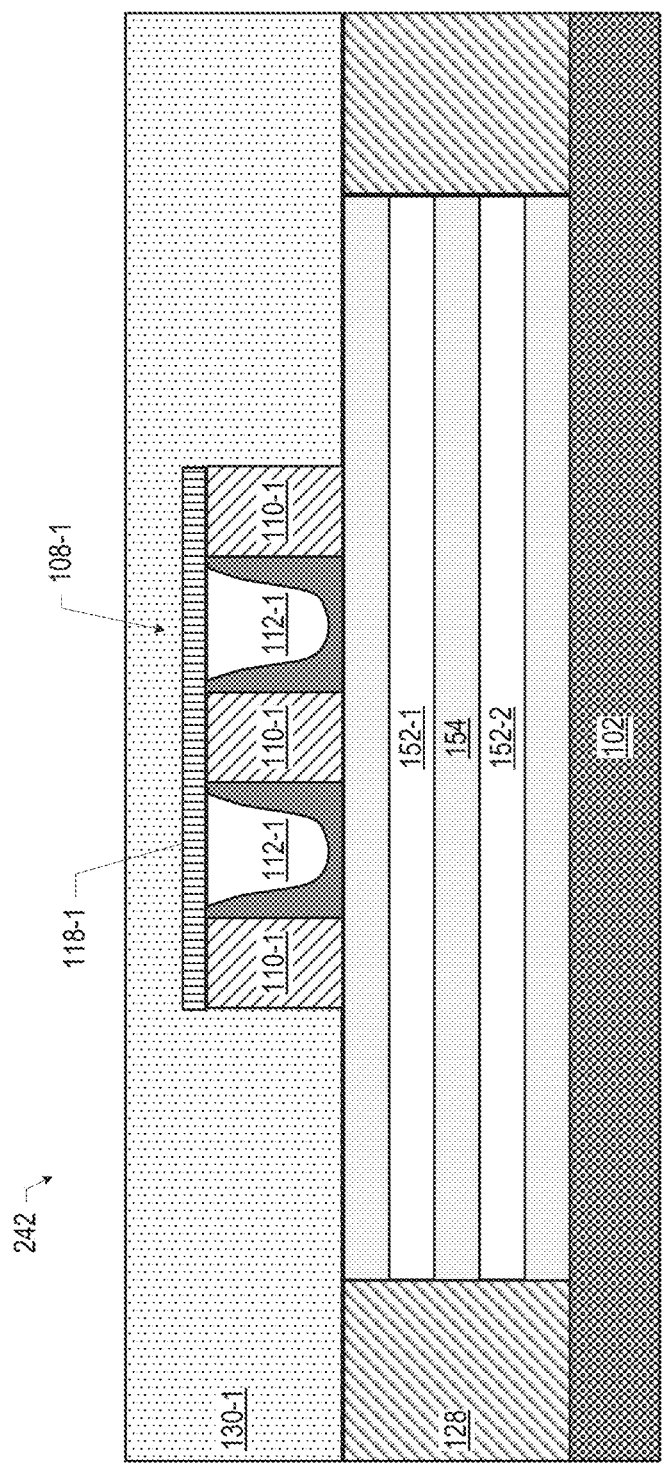

FIG. 35 is a cross-sectional view of an assembly 242 subsequent to providing an insulating material 130-1 on the assembly 240 (FIG. 34). As noted above, FIGS. 35-47 represent a "zoomed out" view, showing the insulating material 128 disposed at the side faces of the quantum well stack 146. The insulating material 130-1 may take any of the forms discussed above. For example, the insulating material 130-1 may be a dielectric material, such as silicon oxide. The insulating material 130-1 may be provided on the assembly 228 using any suitable technique, such as spin coating, chemical vapor deposition (CVD), or plasma-enhanced CVD (PECVD). In some embodiments, the insulating material 130-1 may be polished back after deposition, and before further processing. In some embodiments, the assembly 242 may be planarized to remove the hardmask 118-1, then additional insulating material 130-1 may optionally be provided on the planarized surface; in such an embodiment, the hardmask 118-1 would not be present in the quantum dot device 100.

Figure 36:
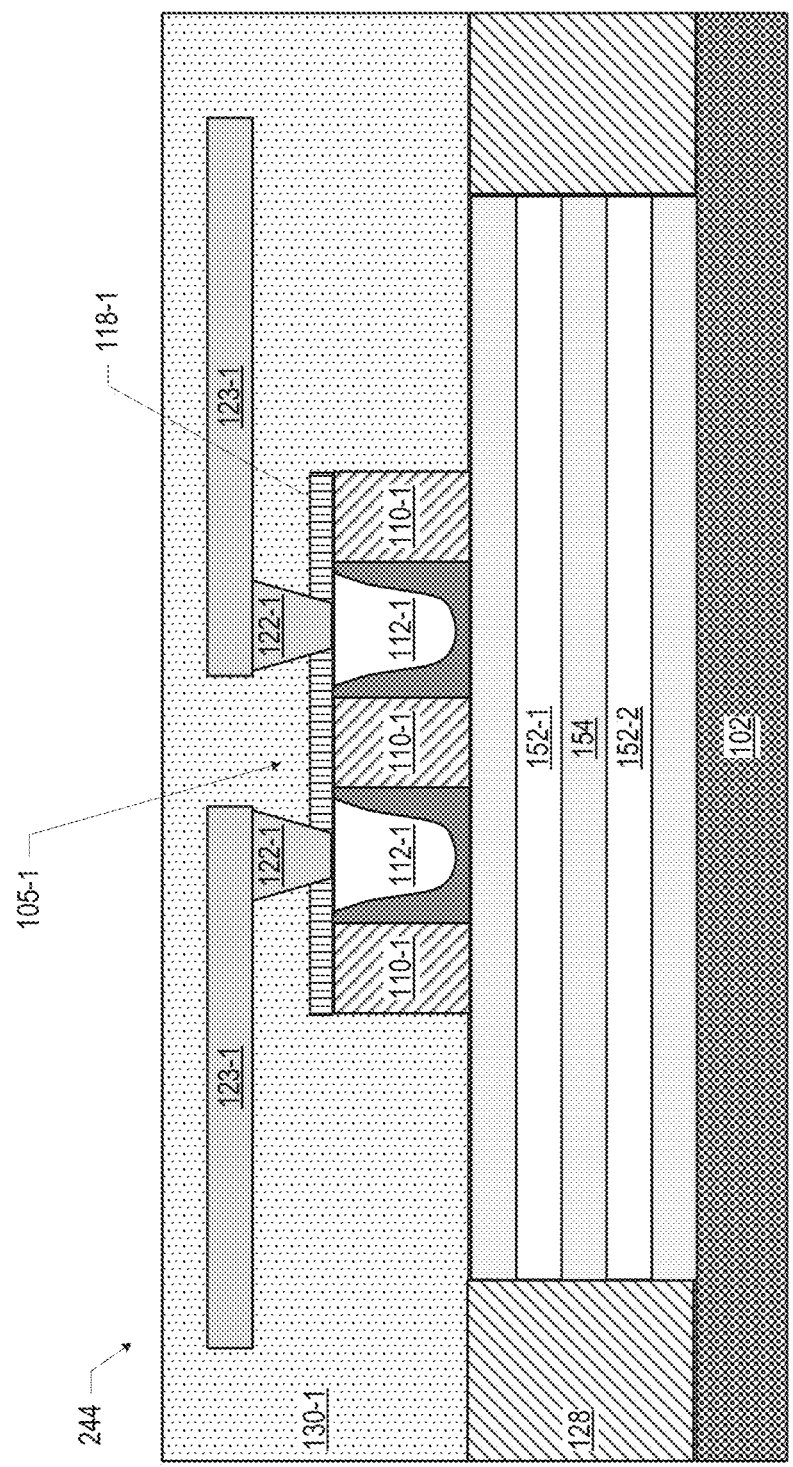

FIG. 36 is a cross-sectional view of an assembly 244 subsequent to forming conductive vias 122-1 and conductive lines 123-1 in electrical contact with the gate metal 112-1 of the gates 108-1 of the assembly 242 (FIG. 35). The conductive vias and lines may be formed using any conventional interconnect technique (e.g., depositing the insulating material 130-1, forming cavities for the vias, filling the cavities with conductive material for the vias, depositing additional insulating material 130-1, forming trenches for the lines, filling the trenches with conductive material for the lines, etc.). Generally, conductive vias and lines included in the quantum dot devices 100 disclosed herein may be formed using any suitable additive, subtractive, semi-additive/subtractive, or other known interconnect formation technique.

Figure 37:
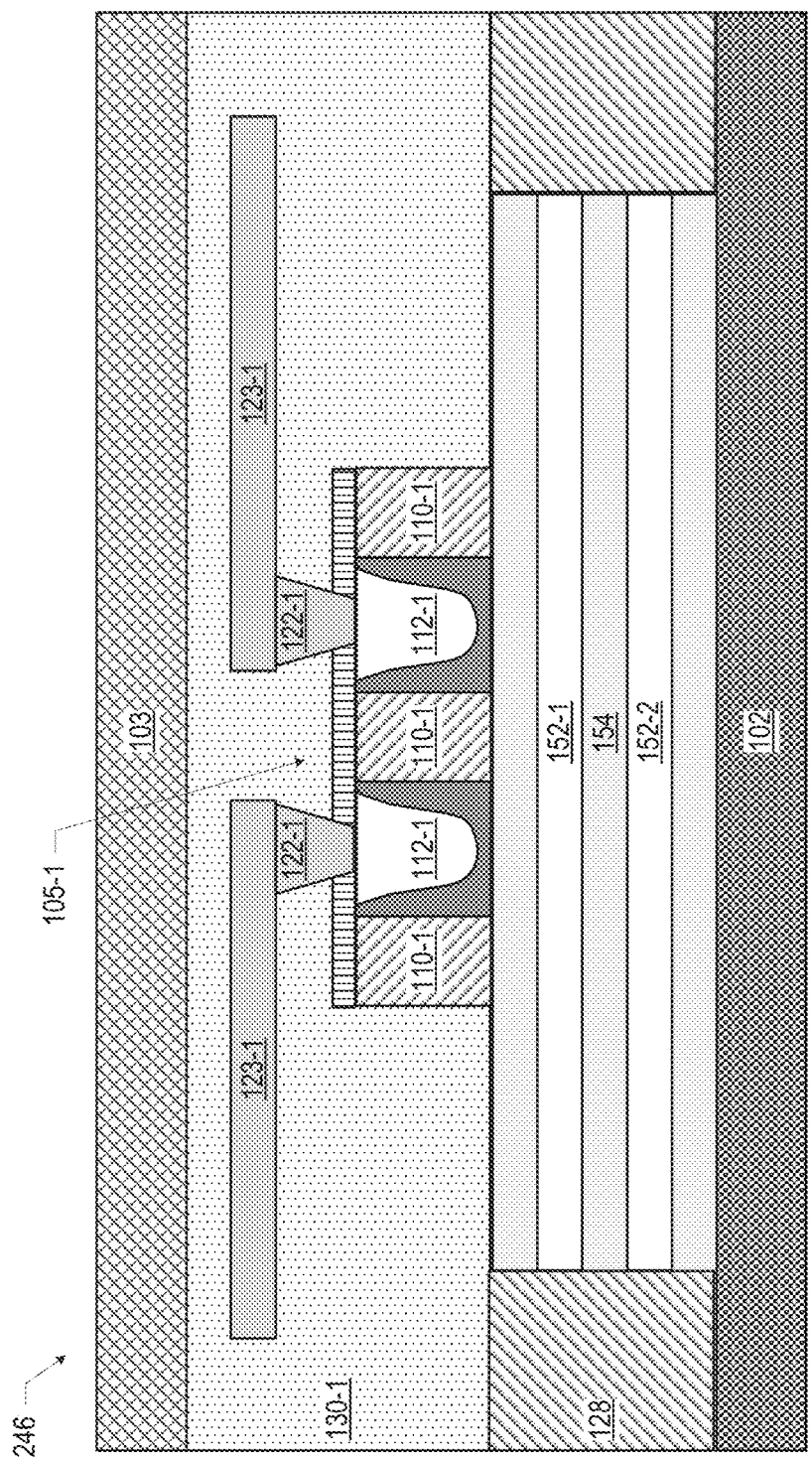

FIG. 37 is a cross-sectional view of an assembly 246 subsequent to attaching a support 103 to the insulating material 130-1 of the assembly 244 (FIG. 36). The support 103 may take any suitable form for providing mechanical support for the operations discussed below. For example, in some embodiments, the support 103 may be a carrier wafer and may be secured to the insulating material 130-1 using an adhesive. In some embodiments, the support 103 may be a mechanical fixture that may be temporarily secured to the insulating material 130-1 (e.g., by clamping or using a fastener), and removed when no longer needed.

Figure 38:
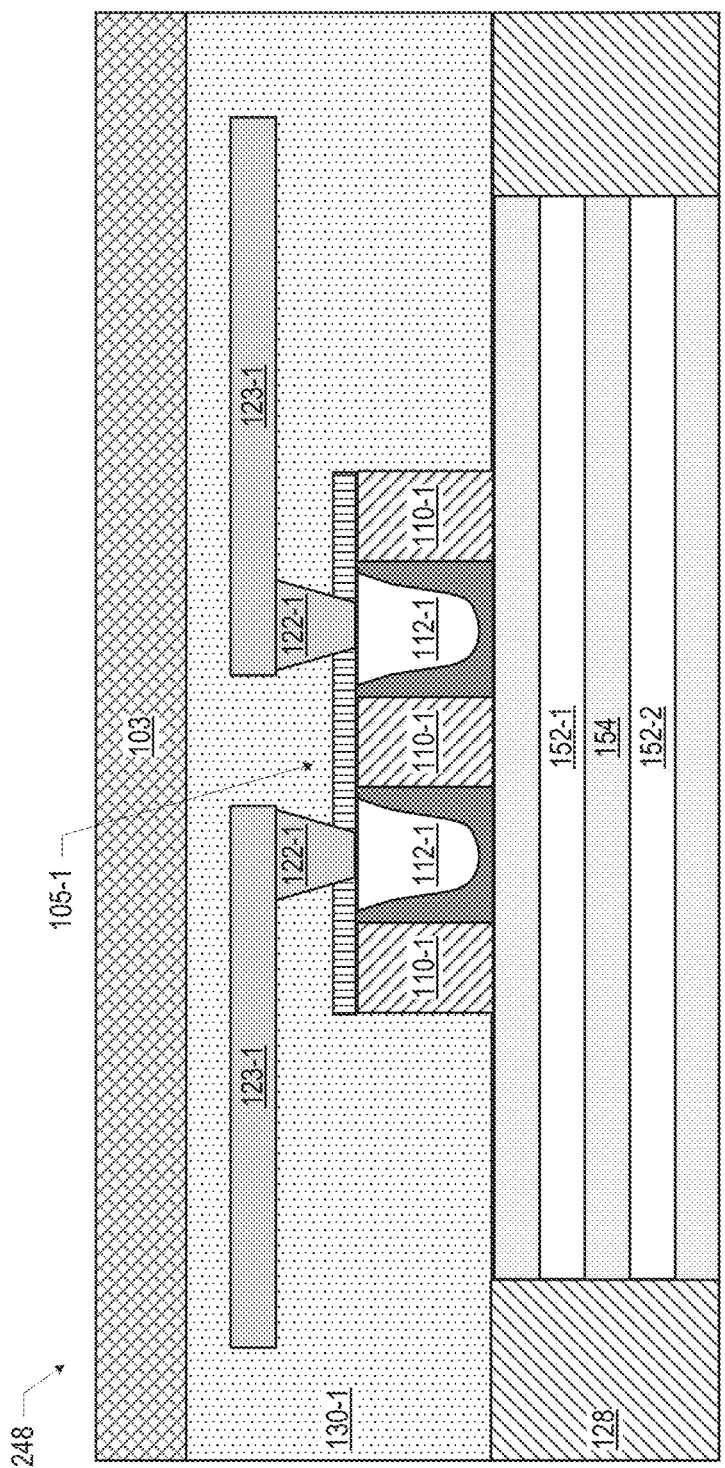

FIG. 38 is a cross-sectional view of an assembly 248 subsequent to removing the base 102 from the assembly 246 (FIG. 37). The quantum well stack 146 may remain secured to the gates 108-1, the insulating material 110-1, and the insulating material 130-1 (which may be mechanically supported by the support 103). Any suitable technique may be used to separate the base 102 from the rest of the assembly 246. For example, in some embodiments, an ion implantation and wafer bonding technique may be used in which the support 103 is adhered to the assembly 244 (as discussed above with reference to FIG. 37) and then the base 102 is polished or etched away. In some embodiments, the base 102 may be mechanically separated from the rest of the assembly 246, and then the "broken" surface of the assembly 246 may be polished or etched.

Figure 39:
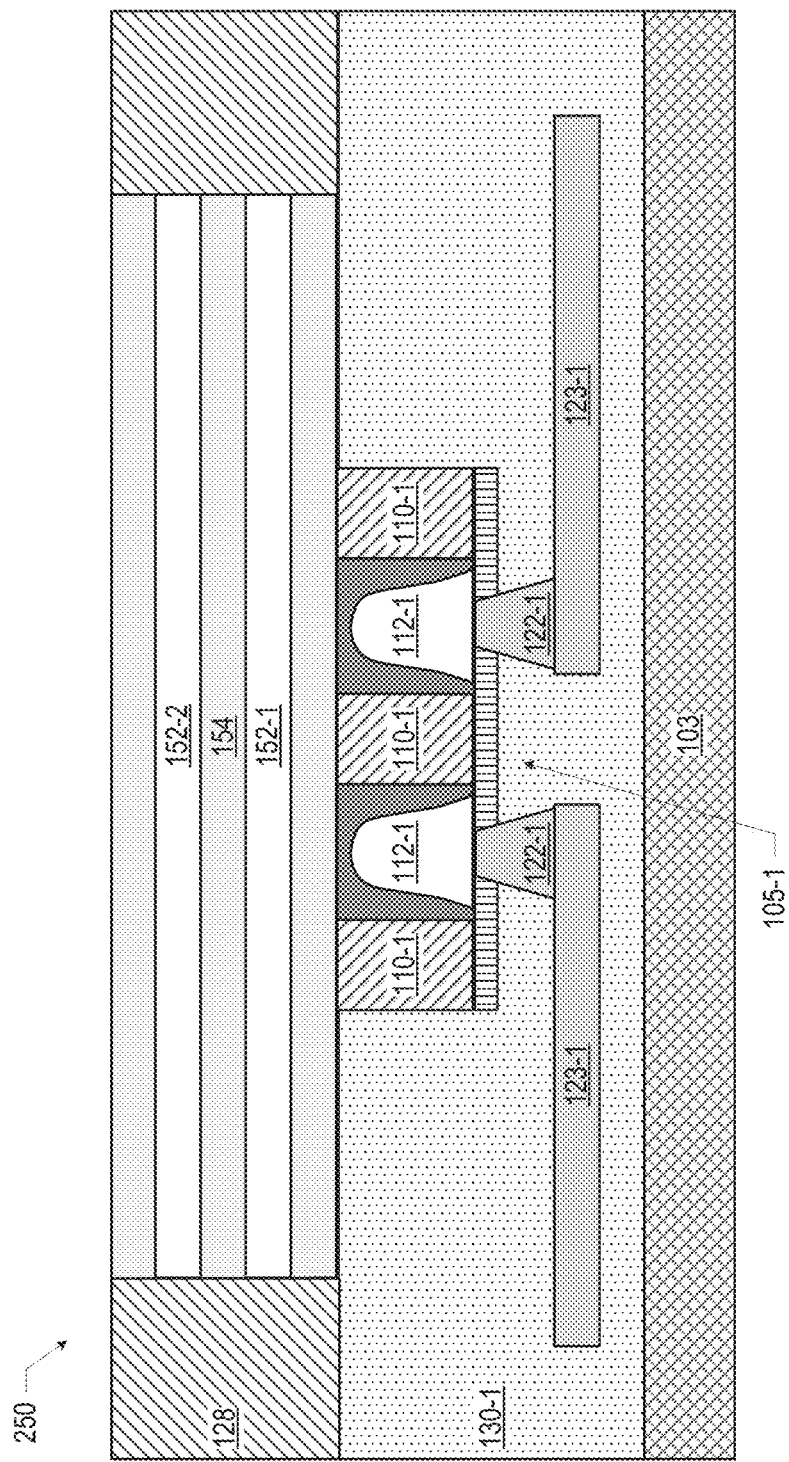

FIG. 39 is a cross-sectional view of an assembly 250 subsequent to turning the assembly 248 (FIG. 38) "upside down" so that further processing may be performed on the exposed quantum well stack 146. In some embodiments, the assembly 248 need not be physically reoriented (as illustrated in FIG. 39) in order for subsequent processing operations to be performed.

Figure 40:
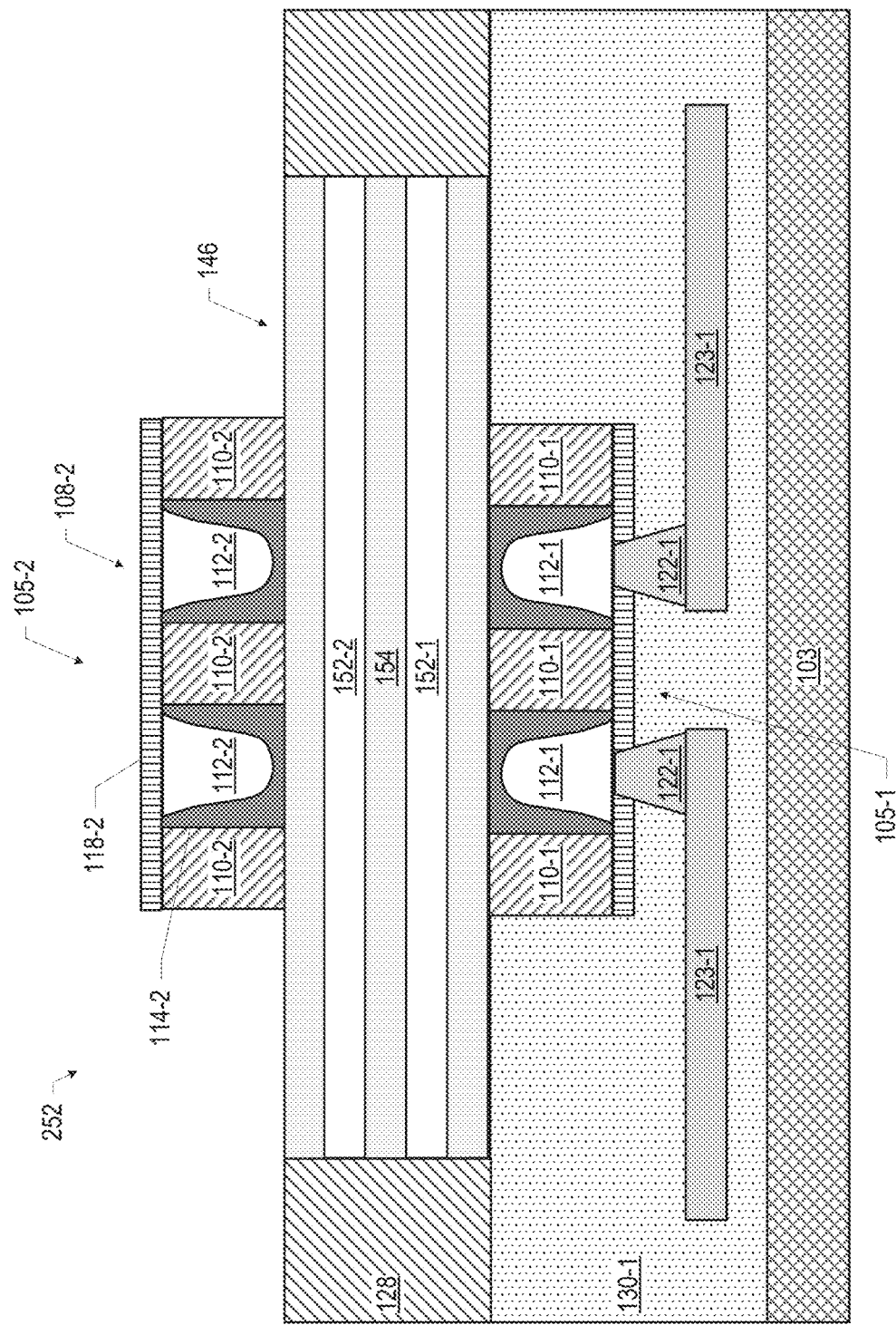

FIG. 40 is a cross-sectional view of an assembly 252 subsequent to forming a patterned insulator material 110-2 and gates 108-2 with a gate dielectric 114-2 on the quantum well stack 146 proximate to the quantum well layer 152-2. The patterned insulator material 110-2 and the gates 108-2 may be formed using any of the techniques discussed above with reference to the formation of the patterned insulator material and the gates 108-1 (e.g., discussed above with reference to FIGS. 11-34), or any other suitable technique (such as any of the other techniques discussed herein, including the techniques discussed below with reference to FIGS. 48-67 and FIGS. 68-80). For example, as shown in FIG. 40, a hardmask 118-2 may be disposed on the gate metal 112-2 of the gates 108-2, analogously to the hardmask 118-1 of the gates 108-1.

Figure 41:
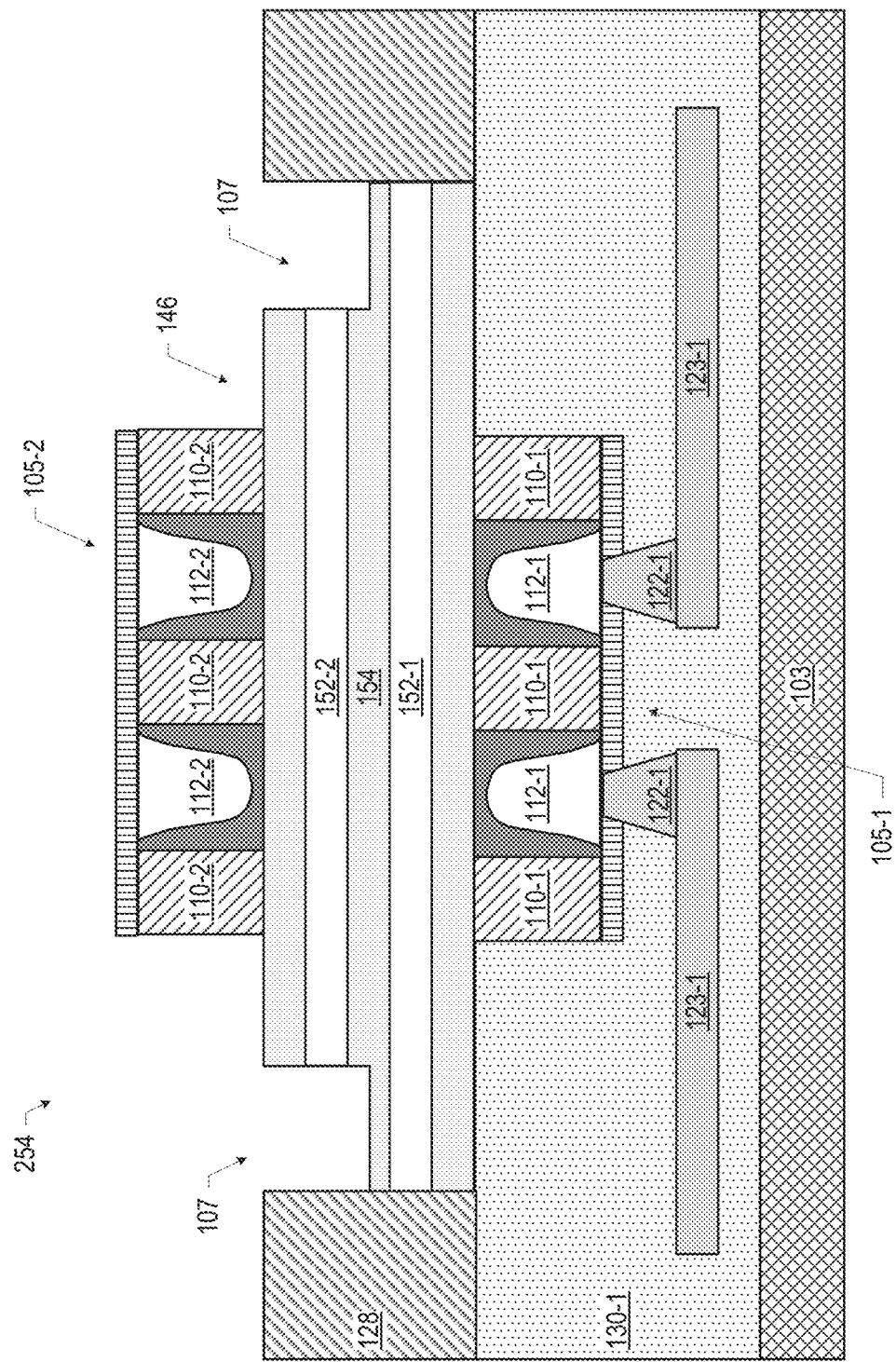

FIG. 41 is a cross-sectional view of an assembly 254 subsequent to forming recesses 107 in the quantum well stack 146 of the assembly 252 (FIG. 40). The recesses 107 may be formed using any of the patterning techniques discussed above with reference to FIG. 7, and as discussed above, may extend down to the barrier layer 154. In some embodiments, the recesses 107 may extend down into the quantum well layer 152-1. In embodiments in which the quantum well stack 146 includes a single quantum well layer 152, the recesses 107 may not be formed.

Figure 42:
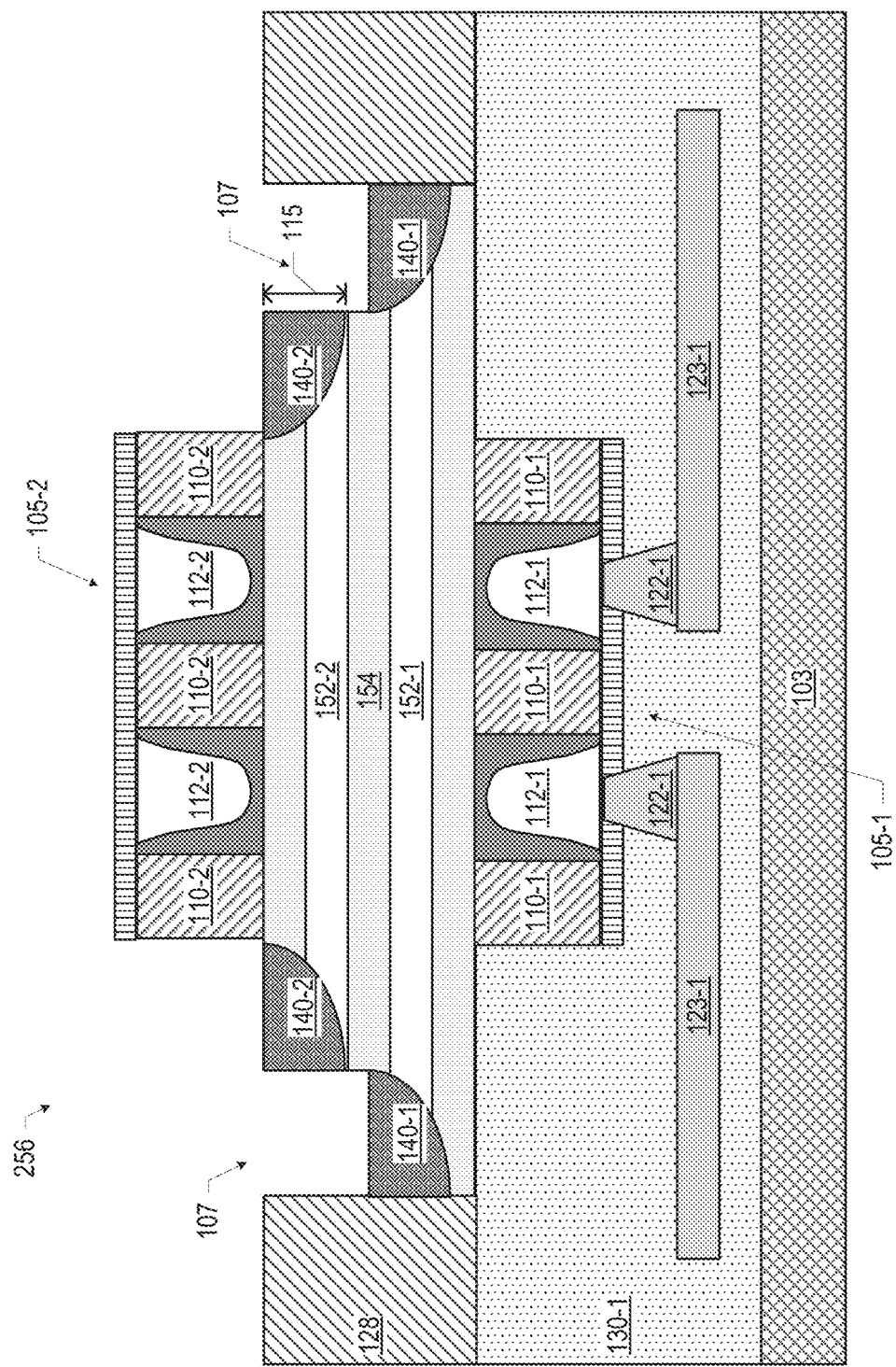
Figure 43:
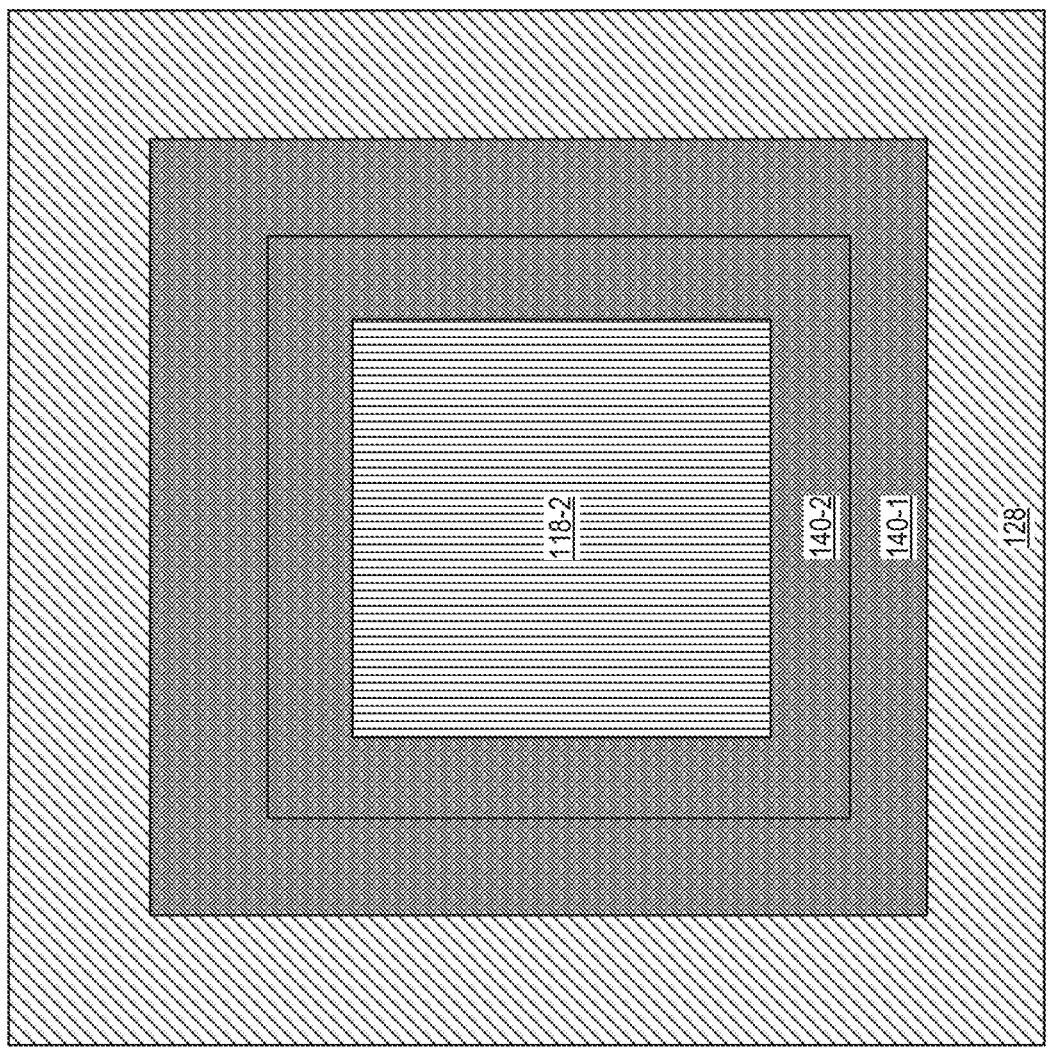

FIG. 42 is a cross-sectional view of an assembly 256 subsequent to doping the quantum well stack 146 of the assembly 254 (FIG. 41) to form doped regions 140-1 at the bottoms of the recesses 107 in the quantum well stack 146, and doped regions 140-2 adjacent to the insulating material 110-2. The doped regions 140-1 may be in conductive contact with the quantum well layer 152-1, and the doped regions 140-2 may be in conductive contact with the quantum well layer 152-2. FIG. 43 is a top view of the assembly 256, showing the doped regions 140-1 and 140-2.

The type of dopant used to form the doped regions 140 may depend on the type of quantum dot desired, as discussed above. In some embodiments, the doping may be performed by ion implantation. For example, when a quantum dot 142 is to be an electron-type quantum dot 142, the doped regions 140 may be formed by ion implantation of phosphorous, arsenic, or another n-type material. When a quantum dot 142 is to be a hole-type quantum dot 142, the doped regions 140 may be formed by ion implantation of boron or another p-type material. An annealing process that activates the dopants and causes them to diffuse farther into the quantum well stack 146 may follow the ion implantation process. The depth of the doped regions 140 may take any suitable value; for example, in some embodiments, the doped regions 140 may each have a depth 115 between 500 and 1000 Angstroms.

The portions of the insulating material 110-2 on the outer faces of the gates 108-2 may provide a doping boundary, limiting diffusion of the dopant from the doped regions 140-2 into the area under the gates 108-2. In some embodiments, the doped regions 140-2 may extend under the adjacent insulating material 110-2. In some embodiments, the doped regions 140-2 may extend past the adjacent insulating material 110-2, or may terminate under the adjacent insulating material 110-2 and not reach the boundary between the adjacent insulating material 110-2 and the proximate gate metal 112-2. The doping concentration of the doped regions 140 may, in some embodiments, be between $10^{17}/cm^3$ and $10^{20}/cm^3$.

Figure 44:
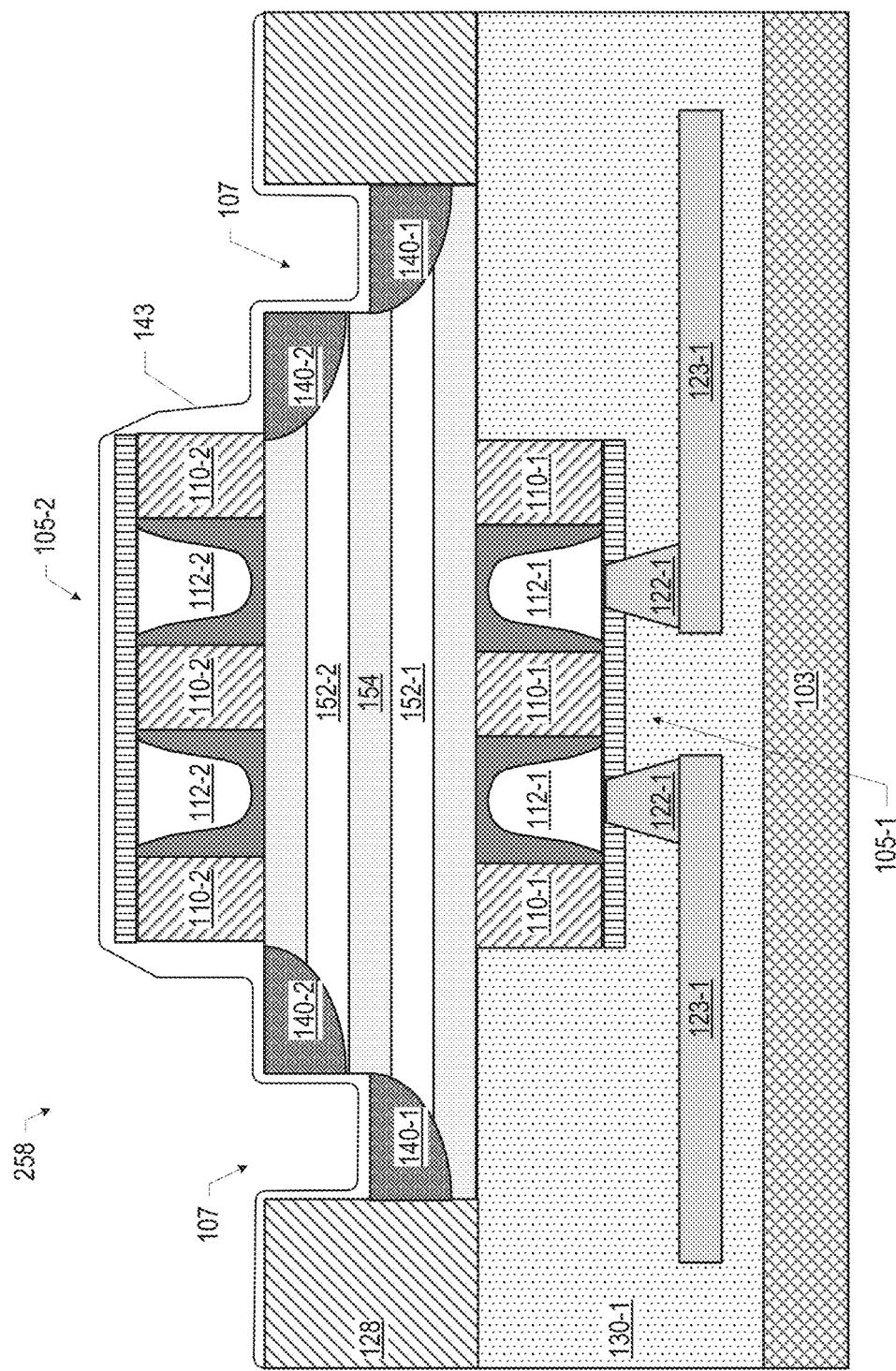

FIG. 44 is a cross-sectional side view of an assembly 258 subsequent to providing a layer of nickel or other material 143 over the assembly 256 (FIGS. 42-43). The nickel or other material 143 may be deposited on the assembly 256 using any suitable technique (e.g., a plating technique, chemical vapor deposition, or atomic layer deposition).

Figure 45:
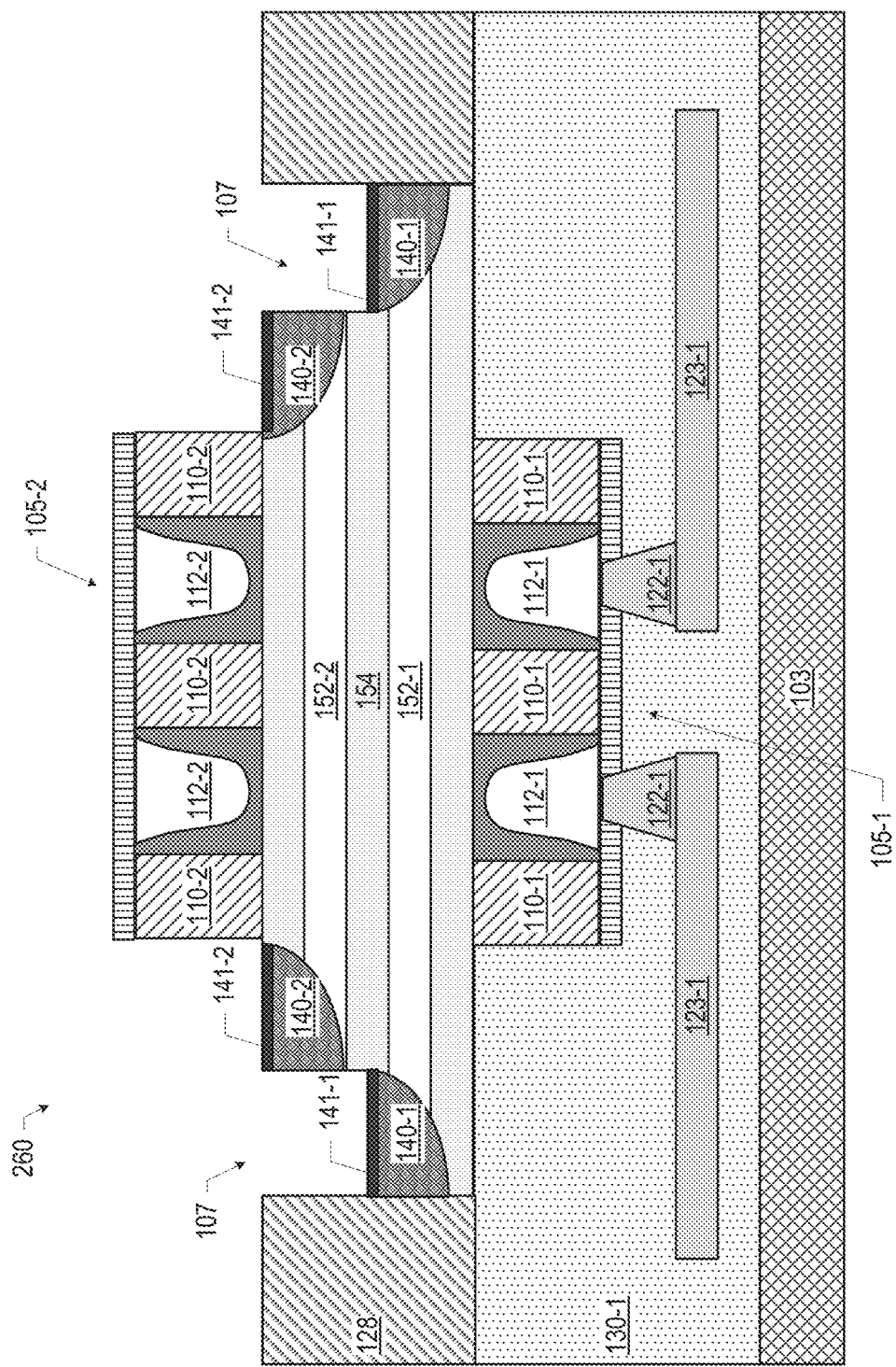

FIG. 45 is a cross-sectional side view of an assembly 260 subsequent to annealing the assembly 258 (FIG. 44) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 44 in order to form other interface materials 141, including titanium, aluminum, molybdenum, cobalt, tungsten, or platinum, for example. More generally, the interface material 141 of the assembly 260 may include any of the materials discussed herein with reference to the interface material 141.

Figure 46:
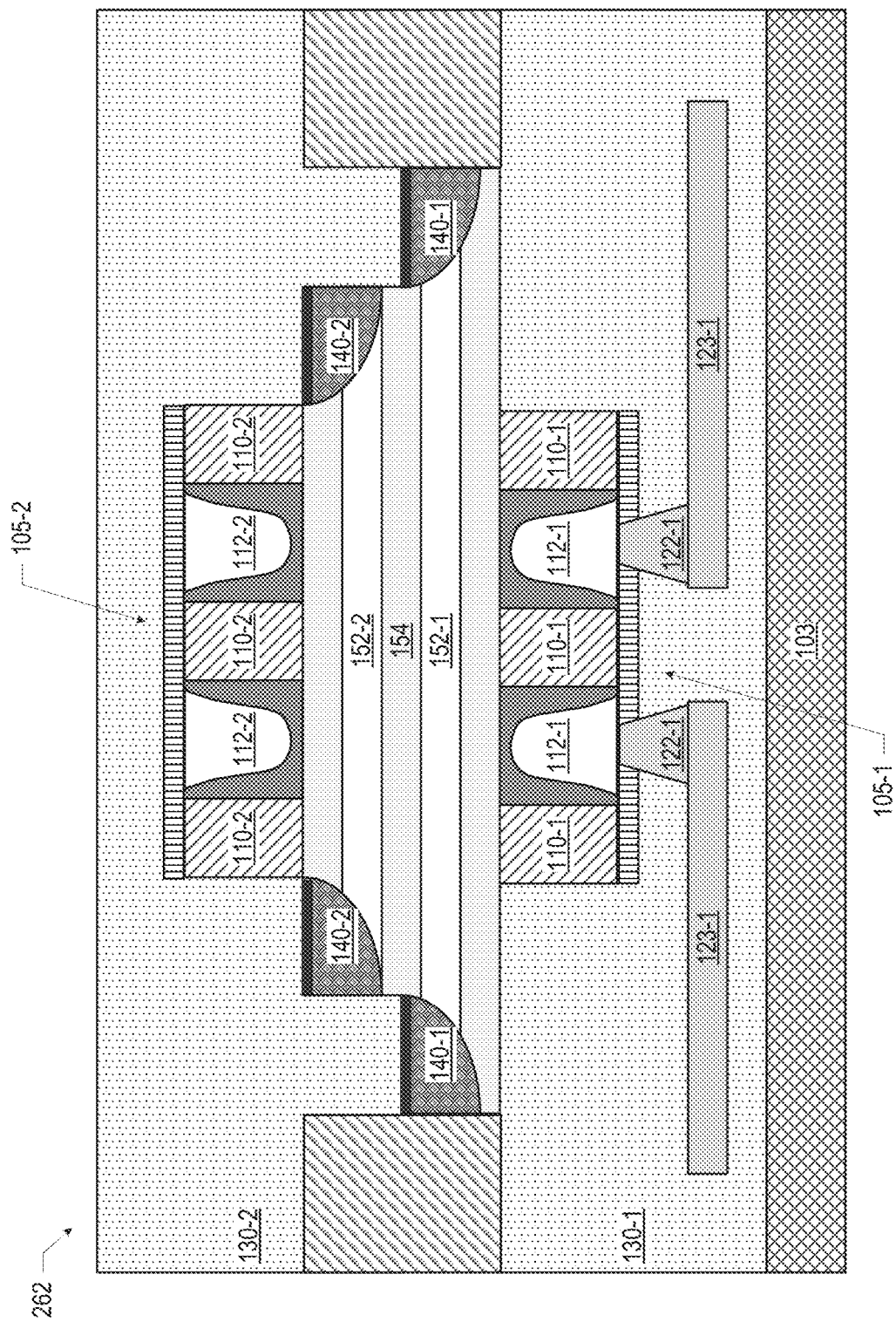

FIG. 46 is a cross-sectional view of an assembly 262 subsequent to providing an insulating material 130-2 on the assembly 260 (FIG. 45). The insulating material 130-2 may take any of the forms discussed above. For example, the insulating material 130-2 may be a dielectric material, such as silicon oxide. The insulating material 130-2 may be provided on the assembly 260 using any suitable technique, such as spin coating, chemical vapor deposition (CVD), or plasma-enhanced CVD (PECVD). In some embodiments, the insulating material 130-2 may be polished back after deposition, and before further processing.

Figure 47:
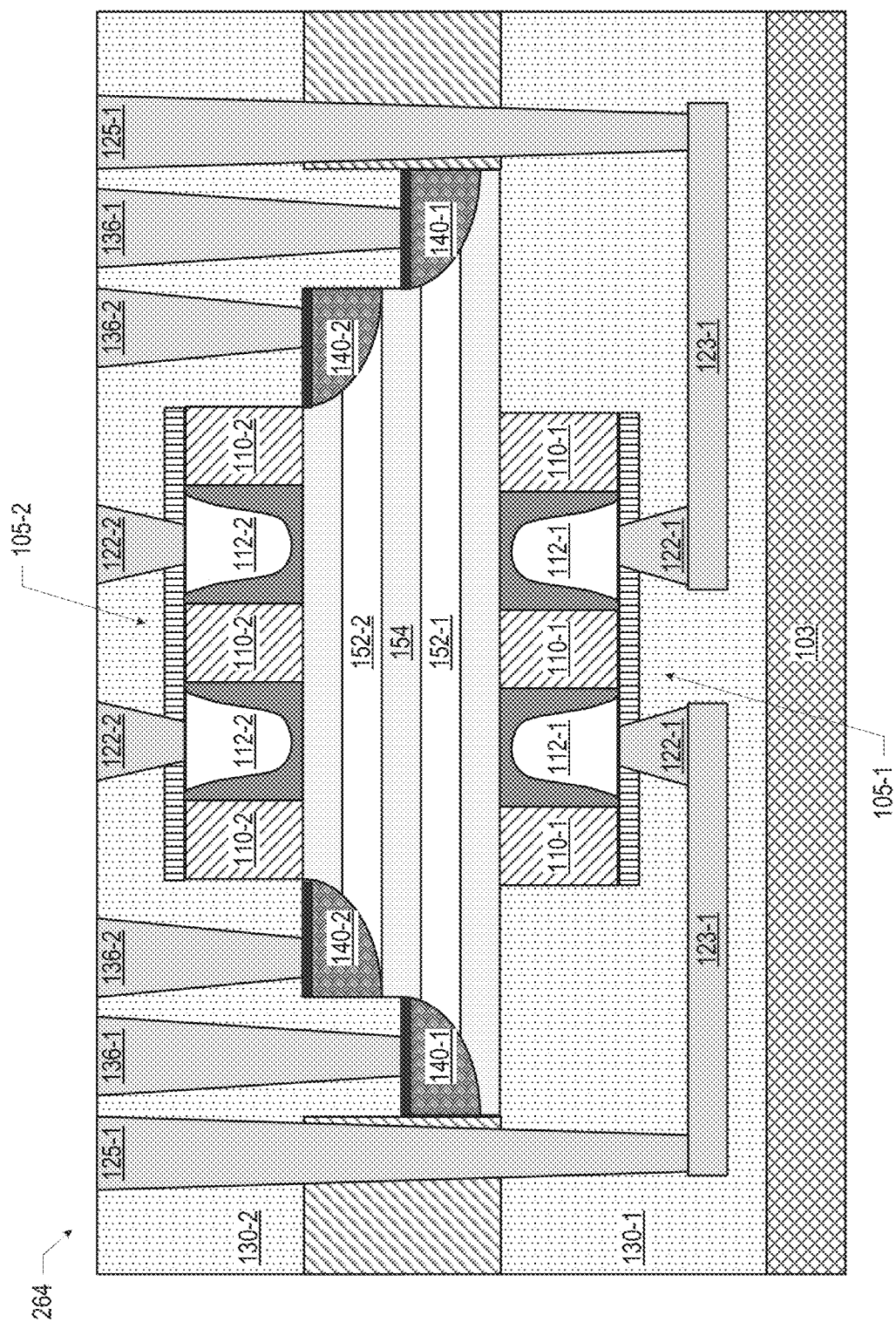

FIG. 47 is a cross-sectional view of an assembly 264 subsequent to forming, in the assembly 262 (FIG. 46), conductive vias 122-2 through the insulating material 130-2 (and the hardmask 118-2) to contact the gate metal 112-2 of the gates 108-2, conductive vias 136-2 through the insulating material 130-2 to contact the interface material 141-2 of the doped regions 140-2, conductive vias 136-1 through the insulating material 130-2 to contact the interface material 141-1 of the doped regions 140-1, and conductive vias 125-1 through the insulating material 130-2, the insulating material 128, and the insulating material 130-1 to contact the conductive lines 123-1 (to make electrical contact with the gate metal 112-1 of the gates 108-1). Further conductive vias and/or lines may be formed on the assembly 262 using conventional interconnect techniques, if desired. The resulting assembly 264 may take the form of the quantum dot device 100 discussed above with reference to FIGS. 1-4. In some embodiments, the assembly 262 may be planarized to remove the hardmask 118-2, then additional insulating material 130-2 may be provided on the planarized surface before forming the conductive vias 122, 125, and 136; in such an embodiment, the hardmask 118-2 would not be present in the quantum dot device 100.

In some embodiments, an alternative technique for patterning the insulating material 110 may be used, resulting in openings 111 (and thus gates 108) that have a different shape from what would be achievable using the technique of FIGS. 12-28. FIGS. 48-67 illustrate an example of such an alternative technique that may take the place of the patterning technique of FIGS. 12-28.

Figure 48:
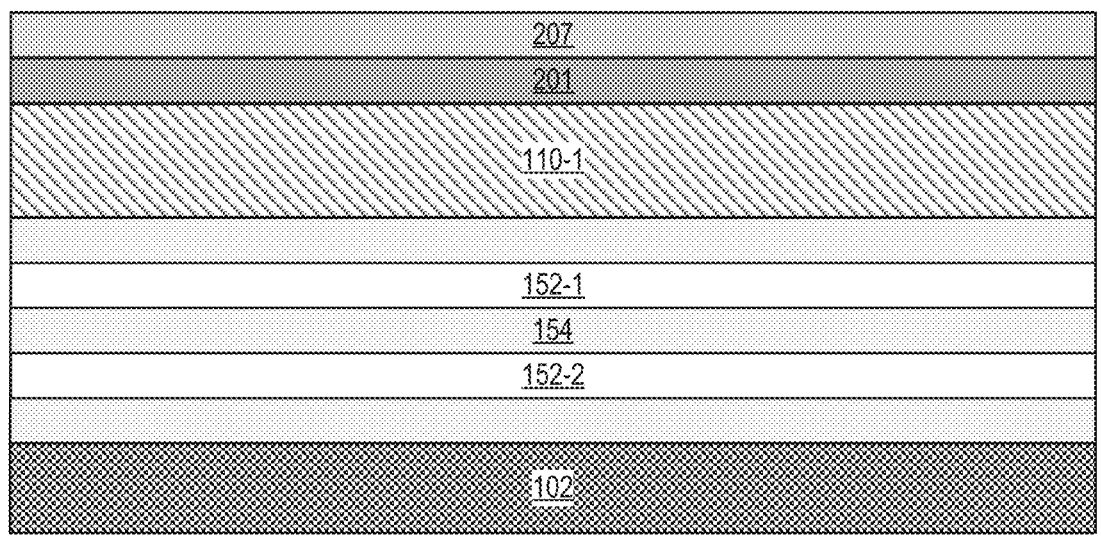
FIGS. 48-67 illustrate various alternative stages in the manufacture of a quantum dot device, in accordance with various embodiments.
Figure 49:
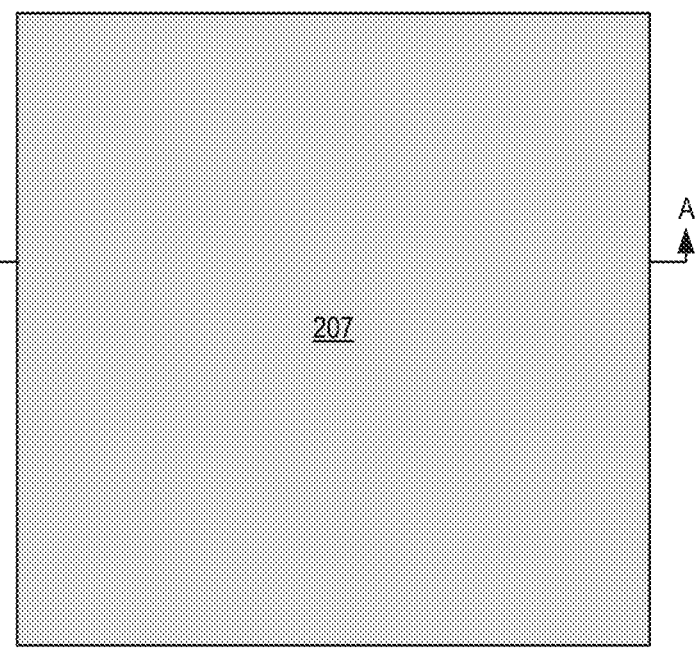

FIG. 48 is a cross-sectional view of an assembly 266 subsequent to providing a hardmask 201 and a hardmask 207 on the insulating material 110-1 of the assembly 210 (FIG. 11). FIG. 49 is a top view of the assembly 266; the cross-sectional view of FIG. 48 is taken along the section A-A of FIG. 49. The hardmasks 201 and 207 may take the form of any of the embodiments discussed above.

Figure 50:
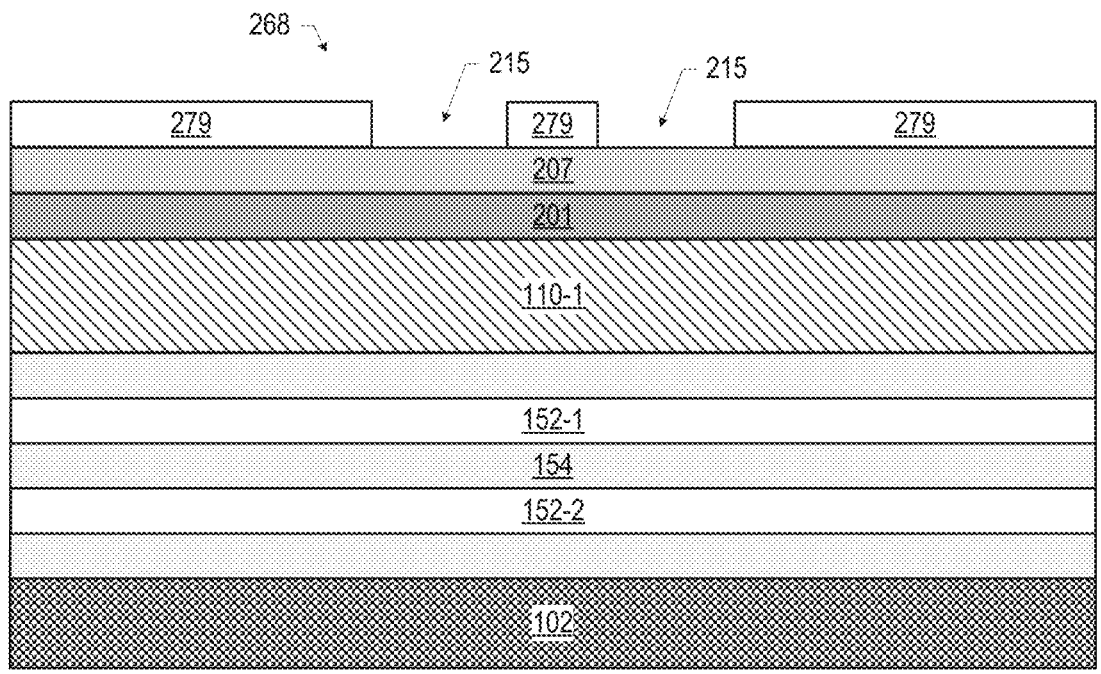
Figure 51:
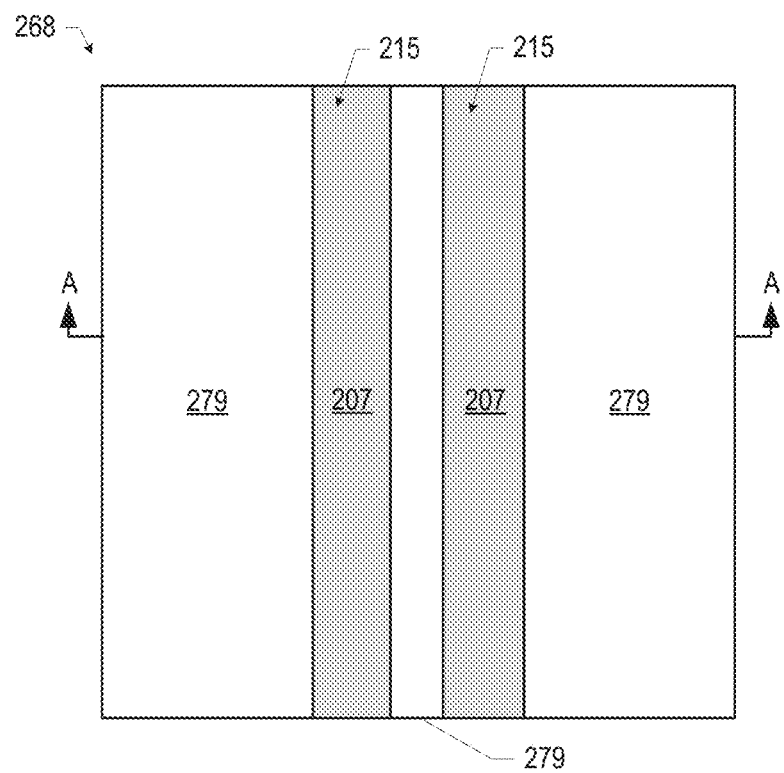

FIG. 50 is a cross-sectional view of an assembly 268 subsequent to providing a resist material 279 on the hardmask 207 of the assembly 266 (FIGS. 48 and 49), and patterning trenches 215 in the resist material 279. FIG. 51 is a top view of the assembly 268; the cross-sectional view of FIG. 50 is taken along the section A-A of FIG. 51. The resist material 279 may take any suitable form (e.g., a photoresist). The trenches 215 in the resist material 279 may be parallel, and may have any of the widths and spacings discussed above with reference to the trenches 205. Only two trenches 215 are illustrated in FIGS. 50 and 51 for economy of illustration, but any desired number of trenches 215 may be formed. The resist material 279 may be patterned using any suitable technique (e.g., any suitable lithographic technique).

Figure 52:
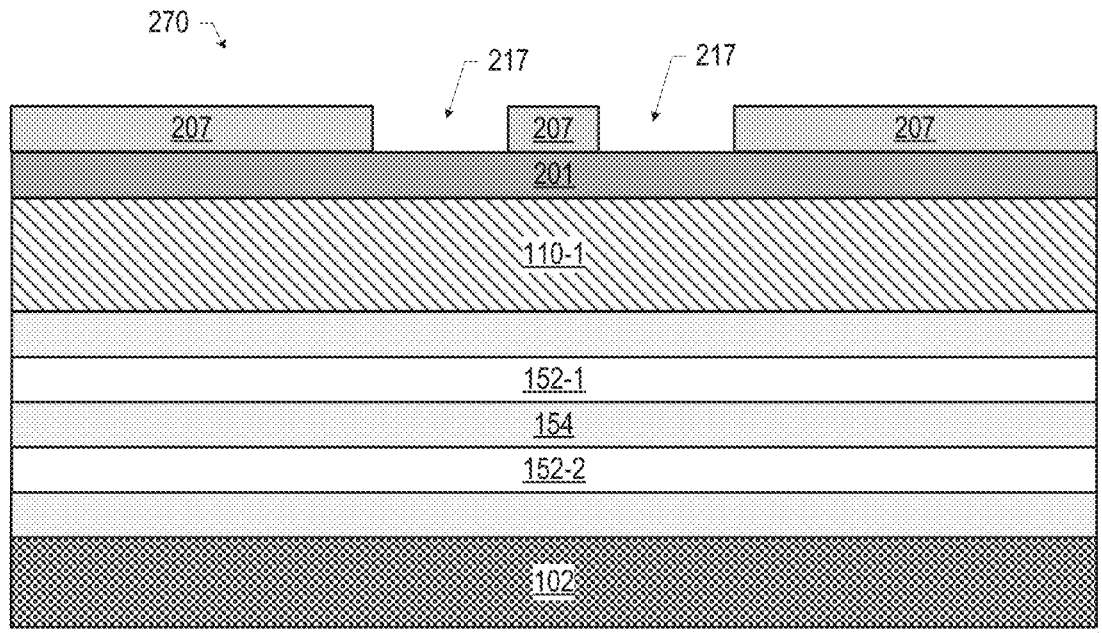
Figure 53:
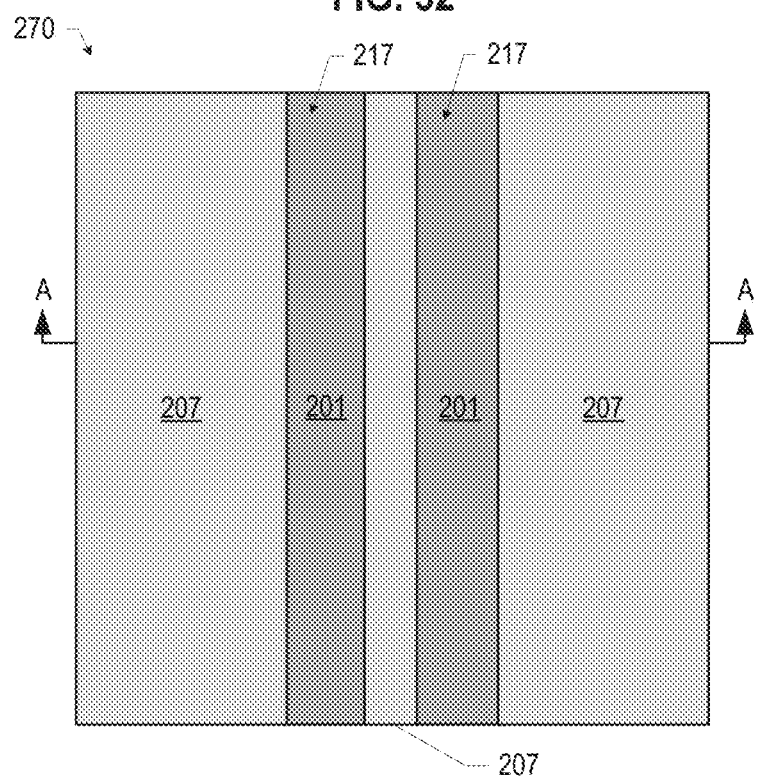

FIG. 52 is a cross-sectional view of an assembly 270 subsequent to patterning the hardmask 207 in accordance with the pattern of the resist material 279 of the assembly 268 (FIGS. 50 and 51), and then removing the remaining resist material 279. FIG. 53 is a top view of the assembly 270; the cross-sectional view of FIG. 52 is taken along the section A-A of FIG. 53. The resulting patterned hardmask 207 may include trenches 217 corresponding to the trenches 215 in the resist material 279. The hardmask 207 may be patterned using any suitable technique (such as dry etching).

Figure 54:
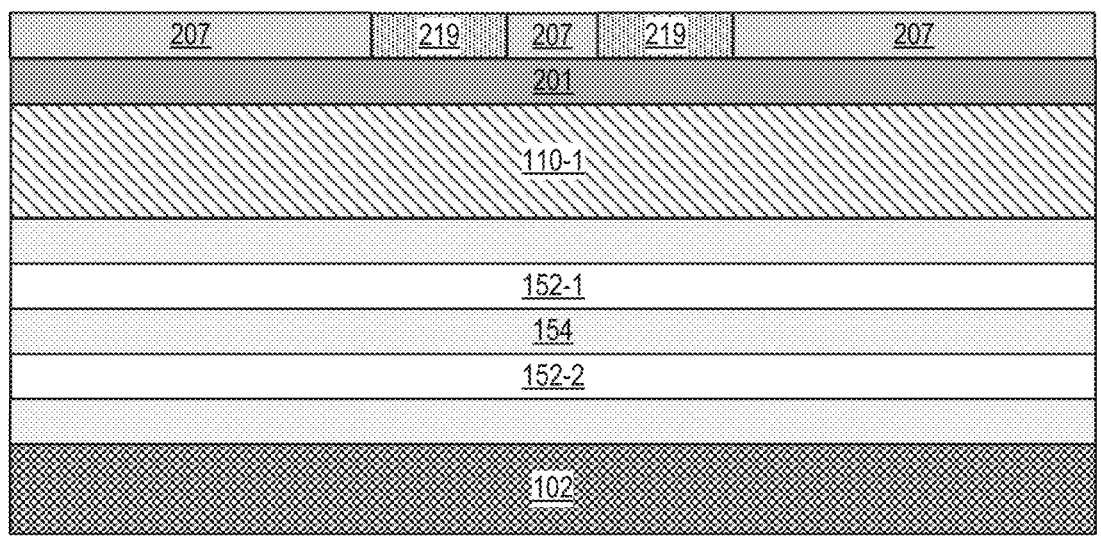
Figure 55:
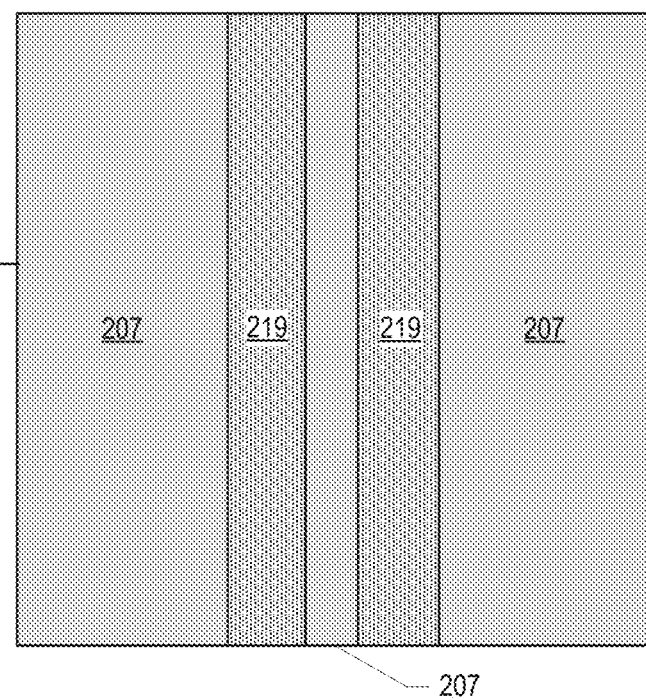

FIG. 54 is a cross-sectional view of an assembly 272 subsequent to filling the trenches 217 in the hardmask 207 of the assembly 270 (FIGS. 52 and 53) with a fill material 219. FIG. 55 is a top view of the assembly 272; the cross-sectional view of FIG. 54 is taken along the section A-A of FIG. 55. The fill material 219 may be a material that may be etched away without etching the hardmask 207, as discussed below. In some embodiments, the fill material 219 may be an amorphous material, such as amorphous silicon or a bottom antireflective coating (BARC). The fill material 219 may be provided in the trenches 217 using any suitable technique (e.g., plasma-enhanced chemical vapor deposition for amorphous silicon, or spin-on for BARC).

Figure 56:
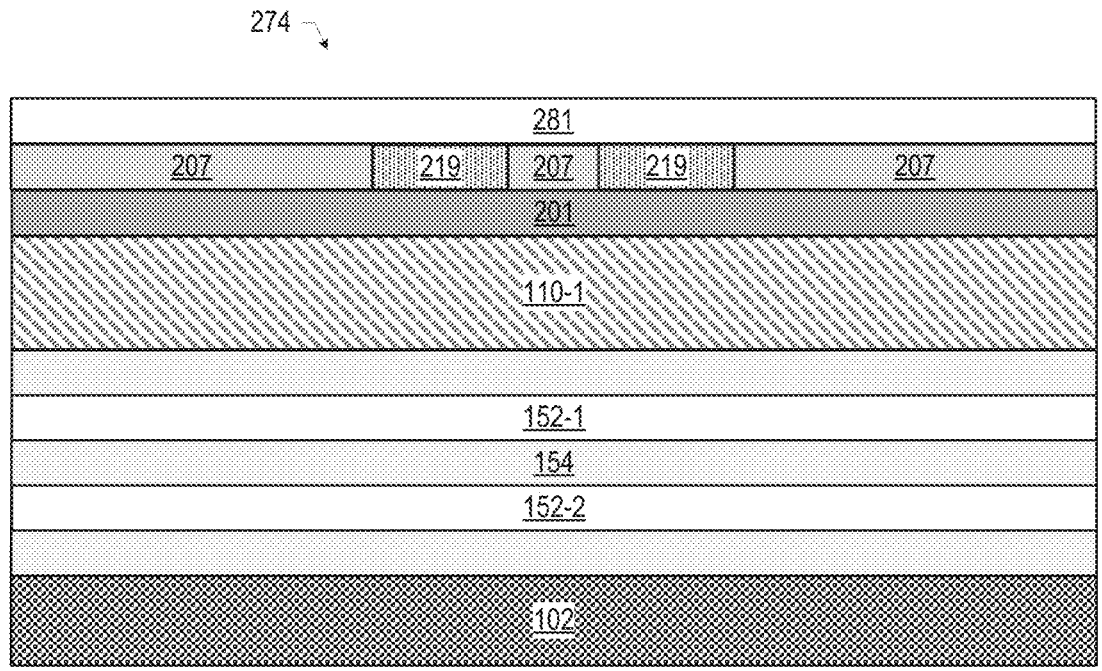
Figure 57:
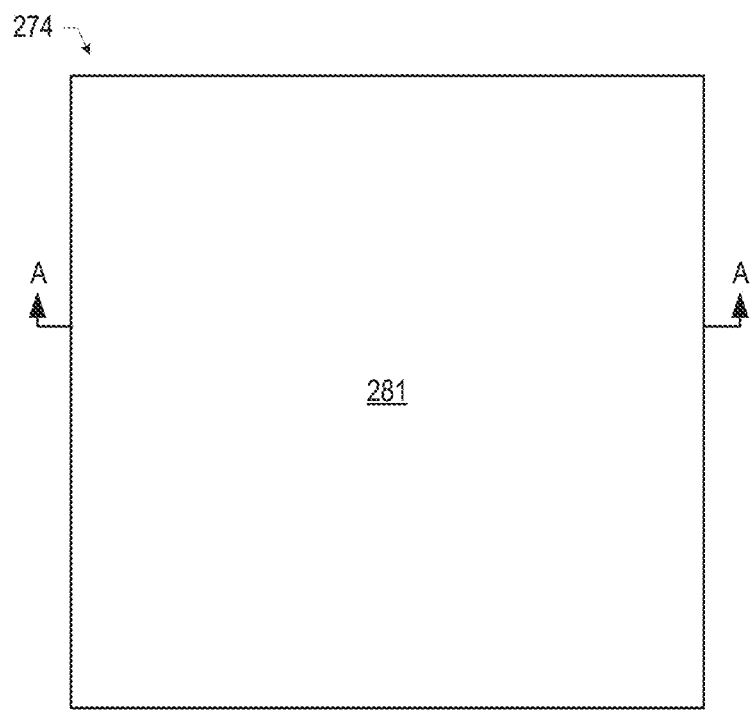

FIG. 56 is a cross-sectional view of an assembly 274 subsequent to providing a resist material 281 on the hardmask 207 and the fill material 219 of the assembly 272 (FIGS. 54 and 55). FIG. 57 is a top view of the assembly 274; the cross-sectional view of FIG. 56 is taken along the section A-A of FIG. 57. In some embodiments, the resist material 281 may be a photoresist, and when patterned, may serve as a mask for subsequent operations, as discussed below.

Figure 58:
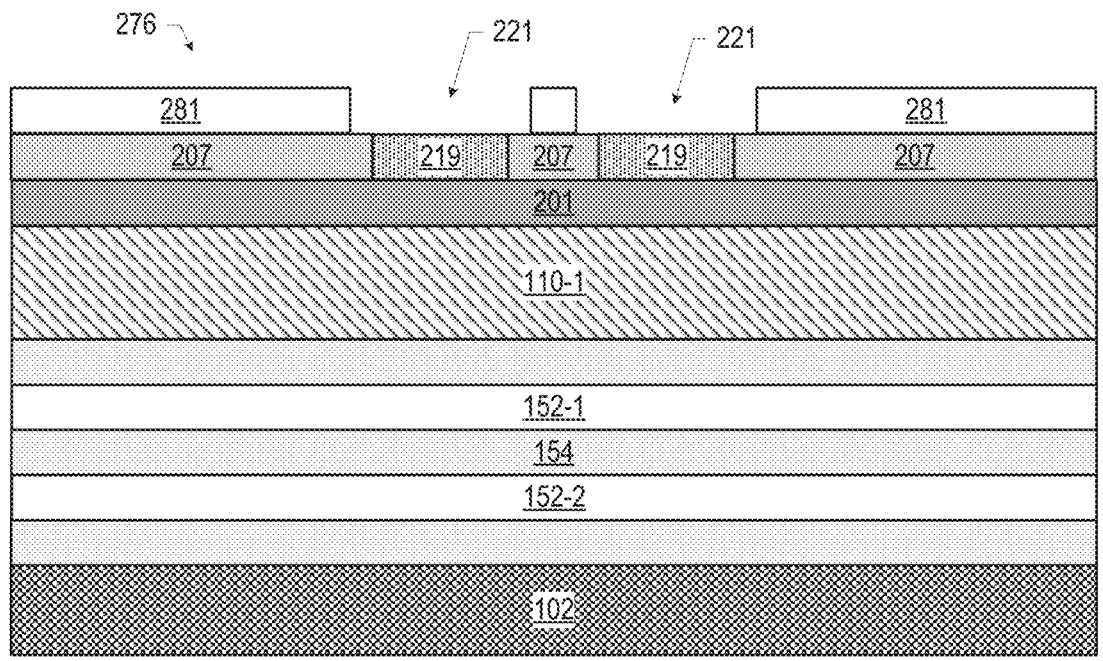
Figure 59:
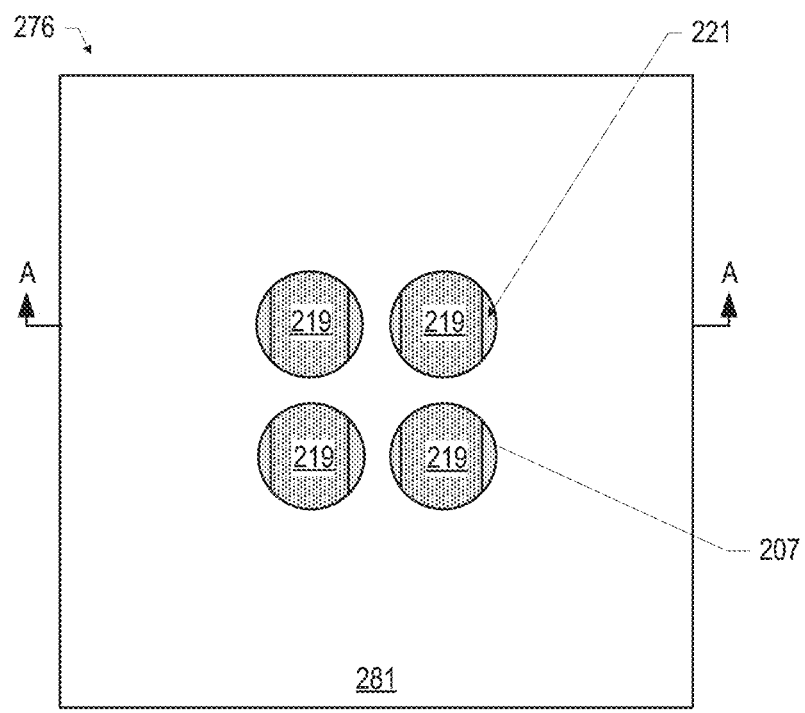

FIG. 58 is a cross-sectional view of an assembly 276 subsequent to patterning holes 221 in the resist material 281 of the assembly 274 (FIGS. 56 and 57). FIG. 59 is a top view of the assembly 276; the cross-sectional view of FIG. 58 is taken along the section A-A of FIG. 59. The holes 221 may be formed using any suitable technique, such as extreme ultraviolet (EUV) lithography. As shown in FIGS. 58 and 59, the holes 221 may be substantially circular, and may be provided in a regular array or any other desired pattern in the resist material 281. In particular, the holes 221 may overlap with the segments of the fill material 219, and as illustrated, may extend beyond the fill material 219 and may expose at least some of the hardmask 207 proximate to the fill material 219. Only four holes 221 are illustrated in FIG. 59 for economy of illustration, but any desired number of holes 221 may be formed. The dimensions of the holes 221 may be selected to limit the likelihood that adjacent holes 221 will inadvertently merge (e.g., due to process variation).

Figure 60:
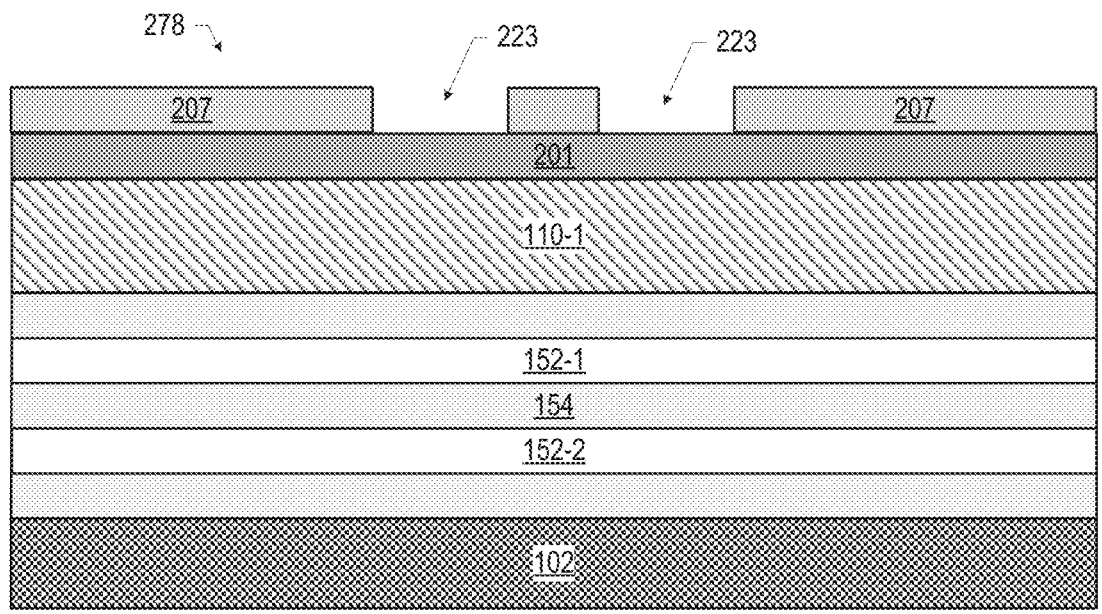
Figure 61:
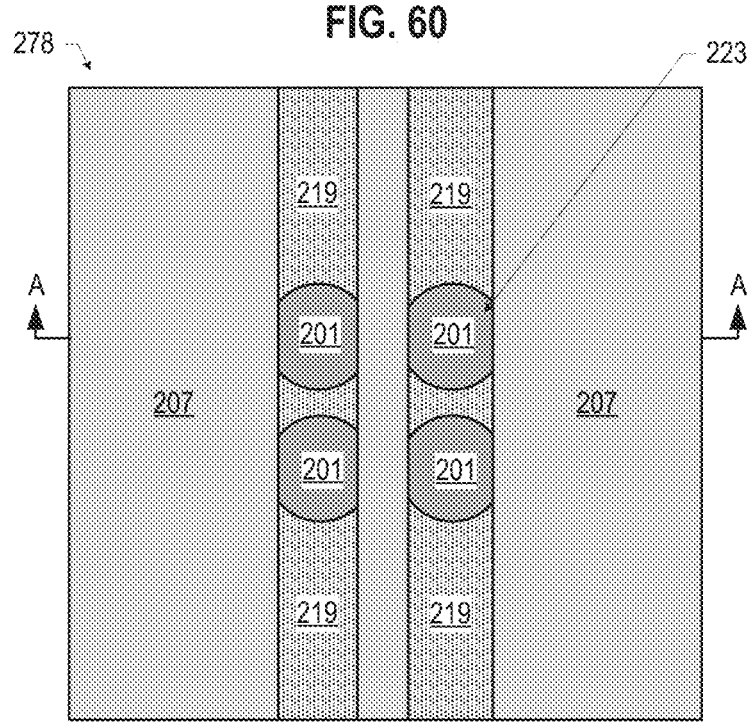

FIG. 60 is a cross-sectional view of an assembly 278 subsequent to patterning the fill material 219 in accordance with the pattern of the resist material 281 of the assembly 276 (FIGS. 58 and 59), and then removing the remaining resist material 281. FIG. 61 is a top view of the assembly 278; the cross-sectional view of FIG. 60 is taken along the section A-A of FIG. 61. The resulting patterned fill material 219 may include openings 223 corresponding to areas in which the holes 221 and the fill material 219 overlapped in the assembly 276 (FIGS. 58 and 59); the etching of the fill material 219 may not etch the hardmask 207, and thus the holes 221 are not transferred in their entireties to the underlying layers. In particular, the openings 223 may have two opposing sides that are substantially flat or linear (corresponding to the border between the hardmask 207 and the fill material 219) and two opposing sides that are curved or semicircular (corresponding to the edges of the holes 221 that entirely overlap the fill material 219). The fill material 219 may be patterned using any suitable technique (such as dry etching). As illustrated in FIGS. 60 and 61, the openings 223 may expose portions of the surface of the hardmask 201 in the assembly 278, while the remainder of the hardmask 201 is covered by the hardmask 207 and/or the fill material 219.

In some embodiments, the fill material 219 may be a photoresist material. In some such embodiments, the fill material 219 may be patterned directly (e.g., using EUV) instead of applying the resist material 281, patterning the resist material 281, and transferring that pattern to the fill material 219. Thus, in such embodiments, the operations discussed above with reference to FIGS. 59 and 60 may not be performed; instead, the fill material 219 may be directly patterned to form the assembly 278.

Figure 62:
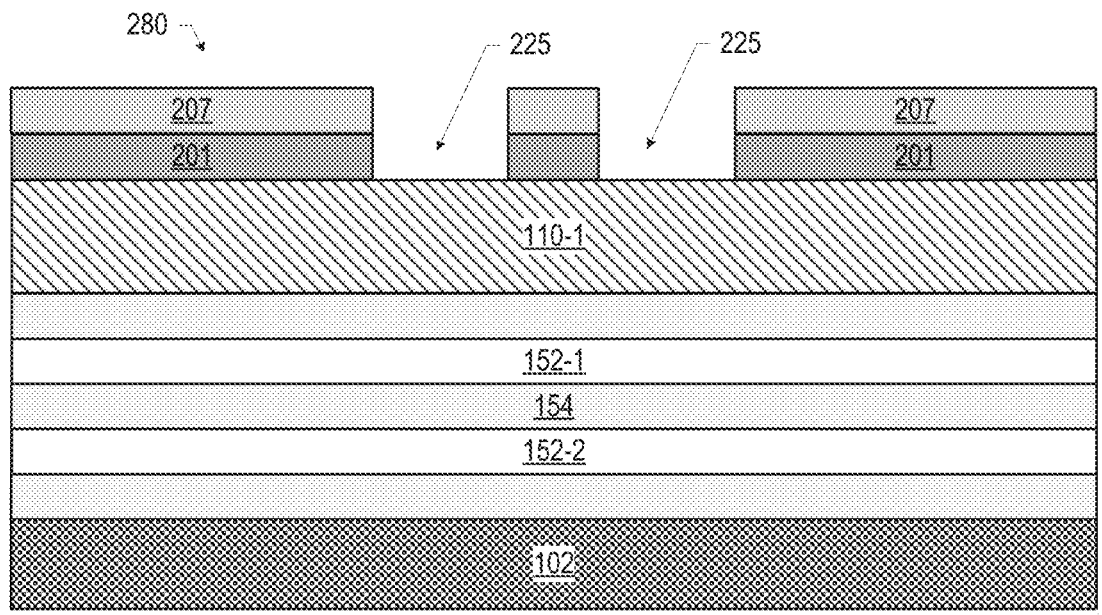
Figure 63:
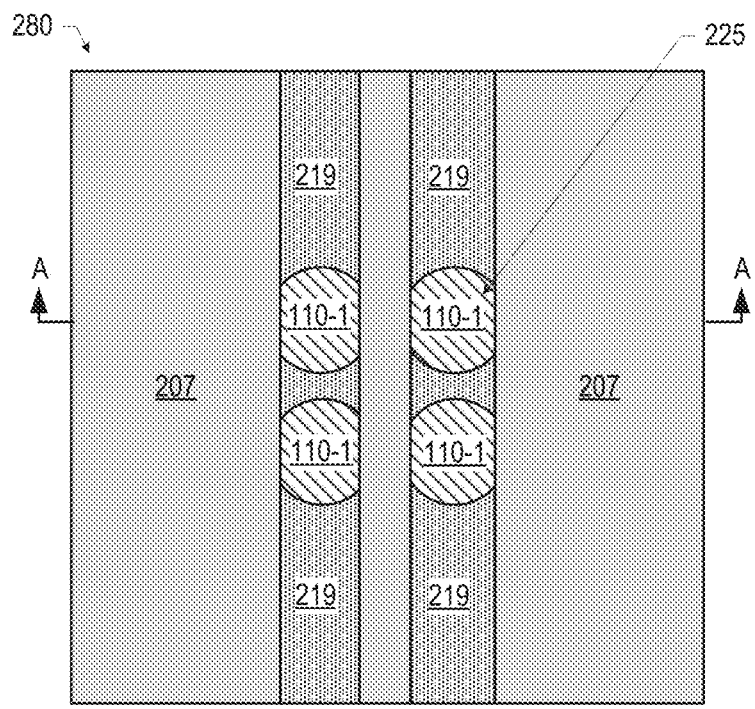

FIG. 62 is a cross-sectional view of an assembly 280 subsequent to patterning the hardmask 201 in accordance with the pattern of the hardmask 207 and the fill material 219 of the assembly 278 (FIGS. 60 and 61). FIG. 63 is a top view of the assembly 280; the cross-sectional view of FIG. 62 is taken along the section A-A of FIG. 63. The resulting patterned hardmask 201 may include openings 225 corresponding to the openings 223, and thus the openings 225 may have two opposing sides that are substantially flat or linear (corresponding to the border between the hardmask 207 and the fill material 219) and two opposing sides that are curved or semicircular (corresponding to the edges of the holes 221 that entirely overlap the fill material 219). As illustrated in FIGS. 62 and 63, the openings 225 may expose portions of the surface of the insulating material 110-1 in the assembly 280, while the remainder of the insulating material 110-1 is covered by the hardmask 201, the hardmask 207 and/or the fill material 219.

Figure 64:
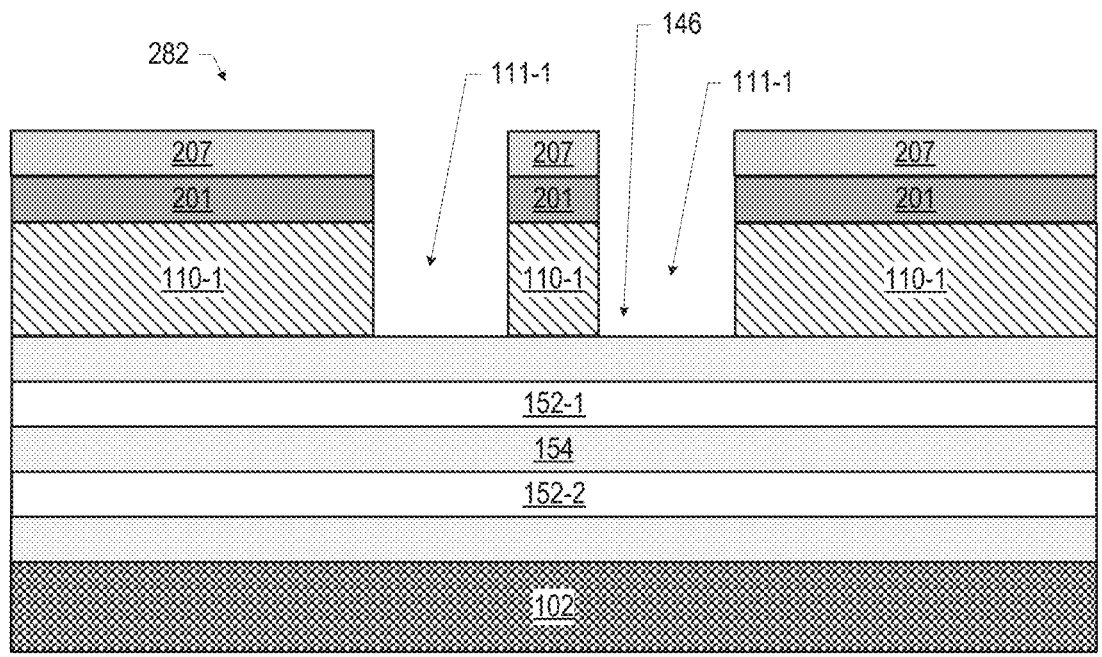
Figure 65:
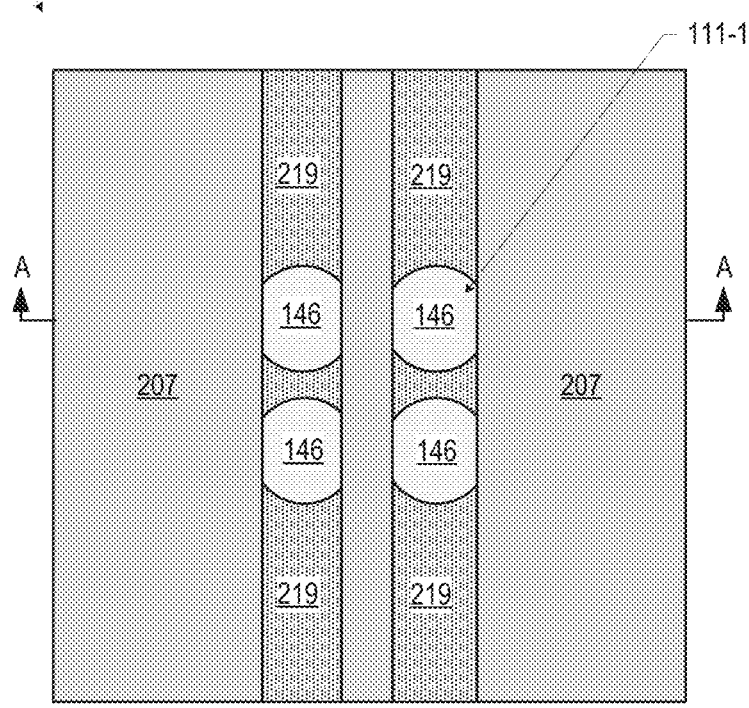

FIG. 64 is a cross-sectional view of an assembly 282 subsequent to patterning the insulating material 110-1 in accordance with the pattern of the hardmask 201 of the assembly 280 (FIGS. 62 and 63) so as to etch away the portions of the insulating material 110-1 that are not covered by the hardmask 201. FIG. 65 is a top view of the assembly 282; the cross-sectional view of FIG. 64 is taken along the section A-A of FIG. 65. The resulting patterned insulating material 110-1 may include openings 111-1 corresponding to the openings 225, and thus the openings 111-1 may have two opposing sides that are substantially flat or linear (corresponding to the border between the hardmask 207 and the fill material 219) and two opposing sides that are curved or semicircular (corresponding to the edges of the holes 221 that entirely overlap the fill material 219). The quantum well stack 146 may be exposed through the openings 111-1.

Figure 66:
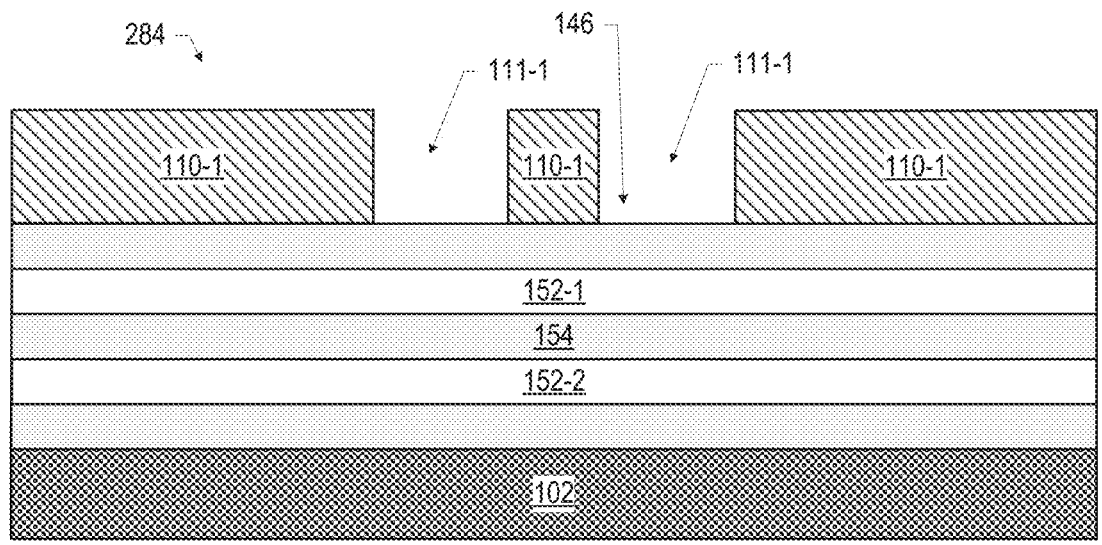
Figure 67:
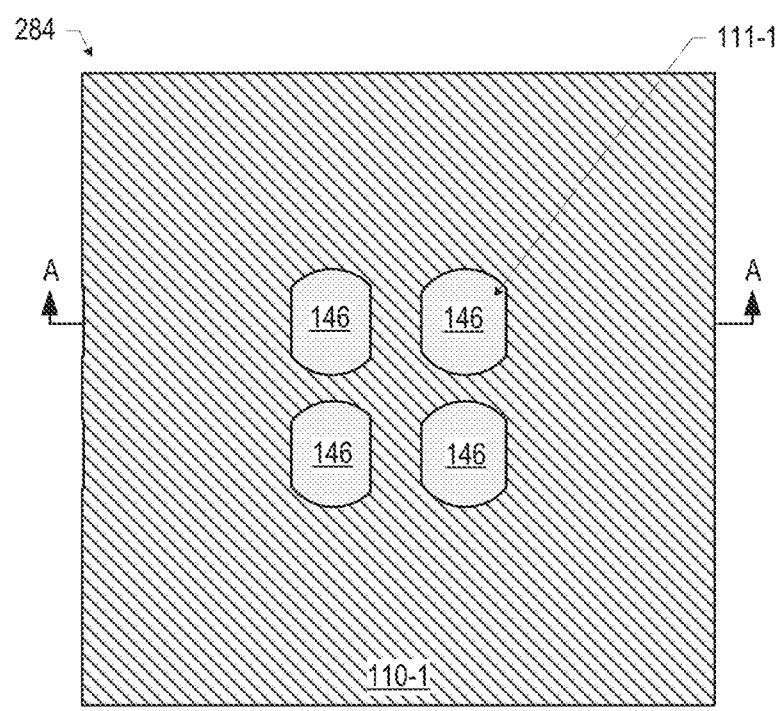

FIG. 66 is a cross-sectional view of an assembly 284 subsequent to removing the hardmasks 201 and 207, as well as the fill material 219, of the assembly 282 (FIGS. 64 and 65). FIG. 67 is a top view of the assembly 284; the cross-sectional view of FIG. 66 is taken along the section A-A of FIG. 69. In the assembly 284, the insulating material 110 may have a grid or cross-grating shape around the openings 111-1, and the quantum well stack 146 may be exposed through these openings. As noted above, although only four openings 111-1 arranged in a 2×2 array are illustrated in FIG. 67, any array of openings 111-1 of any desired number and size may be formed using the techniques disclosed herein.

In some embodiments, the technique discussed above with reference to FIGS. 48-67 may be performed without the use of the hardmask 201; instead, the insulating material 110-1 may be directly patterned when the hardmask 207 and fill material 219 has been patterned. However, as noted above with reference to FIGS. 19A-19B, including the intervening hardmask 201 may improve the tailoring of etch selectivity and reduce potential damage to the insulating material 110-1.

In some embodiments, spacer-based pitch-halving or pitch-quartering techniques may be used to pattern a material, instead of or in addition to photolithographic techniques. In particular, any of the materials that are patterned to include trenches or other structures may be patterned using pitch-halving or pitch-quartering techniques. FIGS. 68-80 illustrate a technique for patterning a material 1217 (which may be a hardmask, or a layer or resist material, for example) using pitch-quartering. Such pitch-quartering techniques may be used to pattern any suitable material discussed herein. For example, pitch-quartering techniques may be used to pattern the hardmask 201 of the assembly 212 of FIG. 12 to form the assembly 216 of FIGS. 14A-14B (instead of using the photoresist patterning technique illustrated in FIGS. 13A-13B). In another example, pitch-quartering techniques may be used to pattern the hardmask 207 of the assembly 220 of FIGS. 16A-16B to form the assembly 224 of FIGS. 18A-18B (instead of using the photoresist patterning technique illustrated in FIGS. 17A-17B). In another example, pitch-quartering techniques may be used to pattern the resist material 1203 of the assembly 1214 (FIGS. 20A and 20B) to form the assembly 1218 of FIGS. 22A and 22B. In another example, pitch-quartering techniques may be used to pattern the resist material 1207 of the assembly 1220 (FIGS. 23A and 23B) to form the assembly 1222 of FIGS. 24A and 24B.

Figure 68:
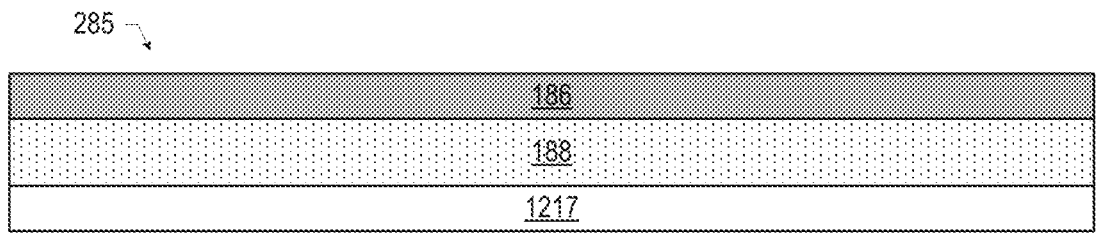
FIGS. 68-80 illustrate various example stages in the manufacture of a quantum dot device using a pitch-quartering technique for patterning gates, in accordance with various embodiments.

FIG. 68 is a cross-sectional view of an assembly 285 subsequent to providing a hardmask 188 and an antireflective coating 186 on the material 1217. The material used for the hardmask 188 may be selected so that the hardmask 188 may be etched without etching the material 1217; any suitable material may be used. The antireflective coating 186 may mitigate optical interference effects during lithography and may be a sacrificial light absorbing material (SLAM), for example.

Figure 69:
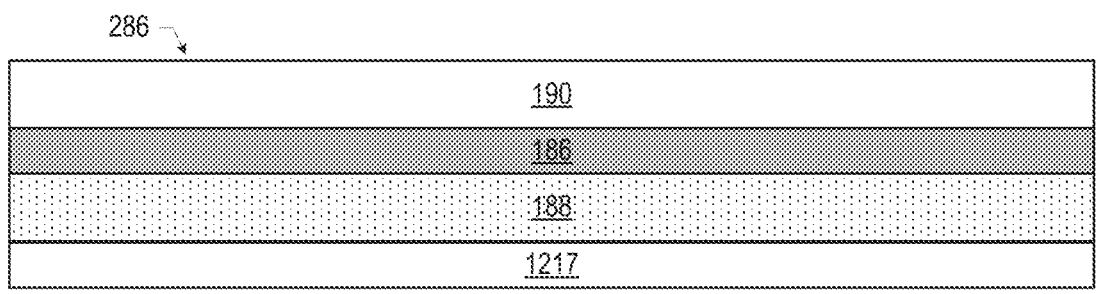

FIG. 69 is a cross-sectional view of an assembly 286 subsequent to providing a resist material 190 on the antireflective coating 186 of the assembly 285 (FIG. 68). In some embodiments, the resist material 190 may be a photoresist.

Figure 70:
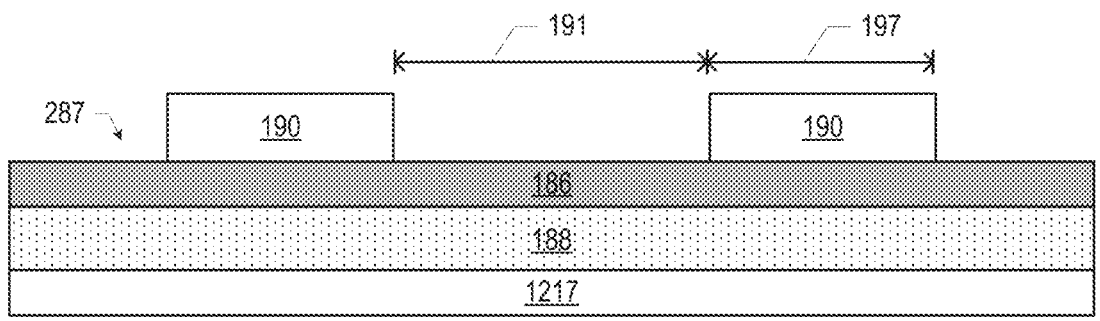

FIG. 70 is a cross-sectional view of an assembly 287 subsequent to etching the resist material 190 to pattern the resist material 190 of the assembly 286 (FIG. 69). The pattern formed in the resist material 190 may be selected based on the final desired patterning of the gates 108, as illustrated in FIGS. 72-80 and discussed below.

Figure 71:
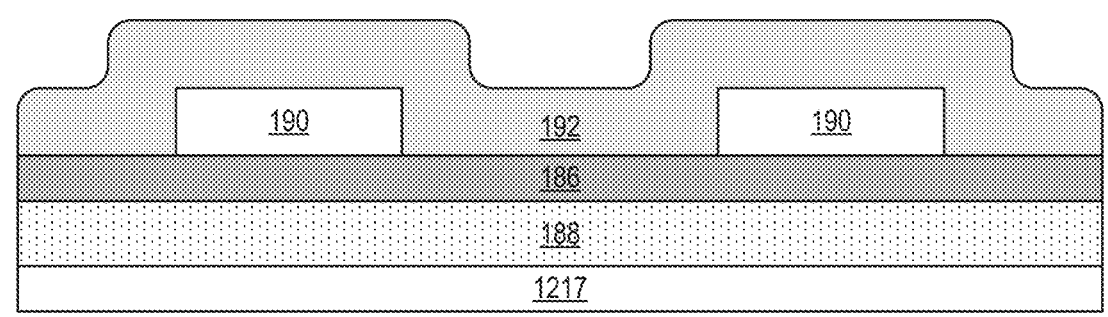

FIG. 71 is a cross-sectional view of an assembly 288 subsequent to providing a template material 192 on the patterned resist material 190 (and the exposed antireflective coating 186) of the assembly 287 (FIG. 70). The template material 192 may be conformal on the patterned resist material 190, and the thickness of the template material 192 may be selected based on the final desired patterning of the gates 108, as illustrated in FIGS. 72-80 and discussed below. The template material 192 may be formed of any suitable material, and may be provided using any suitable technique. For example, the template material 192 may be a nitride material (e.g., silicon nitride), an oxide material, or polysilicon, and may be deposited by sputtering.

Figure 72:
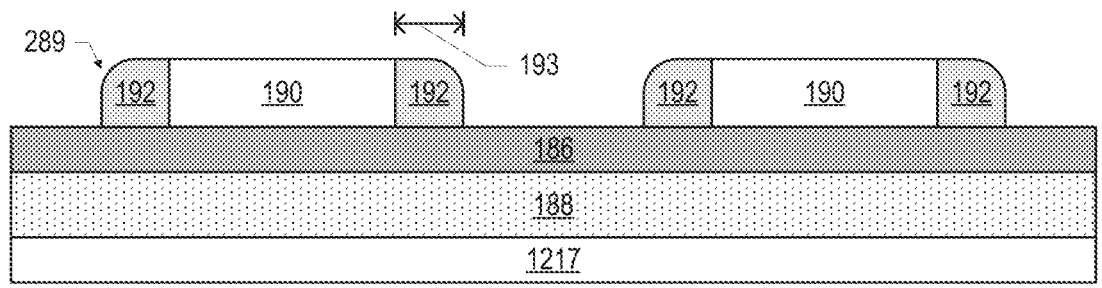

FIG. 72 is a cross-sectional view of an assembly 289 subsequent to etching the template material 192 of the assembly 288 (FIG. 71) to pattern the template material 192. The template material 192 may be anisotropically etched, etching the template material 192 "downward" to remove the template material 192 on top of the patterned resist material 190 and in some of the area between the patterned resist material 190, leaving the patterned template material 192 on the sides of the patterned resist material 190. In some embodiments, the anisotropic etch may be a dry etch. The thickness of the template material 192 when provided (as illustrated in FIG. 71), and the dimensions of the patterned resist material 190, may dictate the dimensions of the patterned template material 192.

Figure 73:
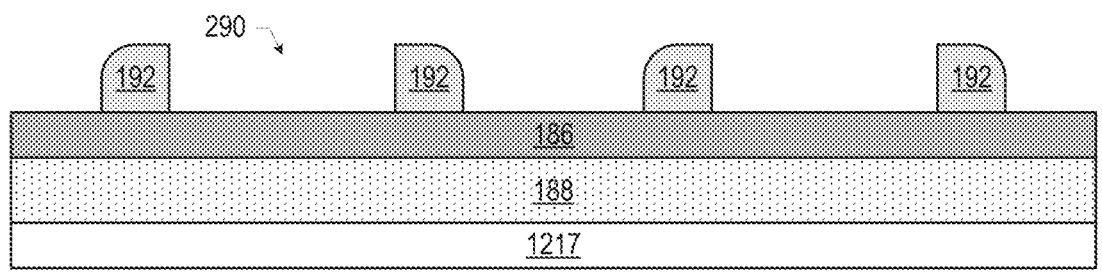

FIG. 73 is a cross-sectional view of an assembly 290 subsequent to removing the patterned resist material 190 of the assembly 289 (FIG. 72). In some embodiments, the patterned resist material 190 may be removed with a solvent, or with an oxygen plasma ash. The patterned template material 192 may remain in the assembly 290.

Figure 74:
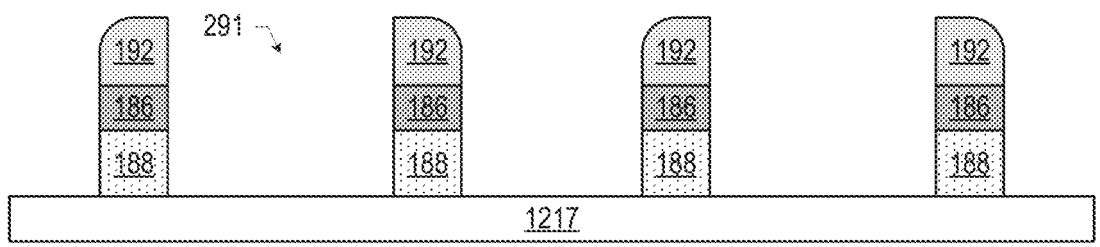

FIG. 74 is a cross-sectional view of an assembly 291 subsequent to etching the antireflective coating 186 and the hardmask 188 in accordance with the pattern provided by the patterned template material 192 of assembly 290 (FIG. 73). In particular, portions of the antireflective coating 186 and the hardmask 188 not covered by the patterned template material 192 may be etched away, and the etch may stop upon reaching the material 1217. This etching may result in a patterned antireflective coating 186 and a patterned hardmask 188, having dimensions that depend on the dimensions of the patterned template material 192, as discussed. In some embodiments, the antireflective coating 186 and the hardmask 188 may be removed with a solvent, or with an oxygen plasma ash.

Figure 75:
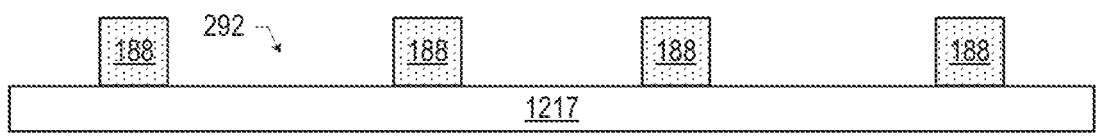

FIG. 75 is a cross-sectional view of an assembly 292 subsequent to removing the patterned template material 192 and the antireflective coating 186 of the assembly 291 (FIG. 74). The patterned hardmask 188 may remain in the assembly 292. In some embodiments, the patterned template material 192 and the antireflective coating 186 may be removed with a solvent, or with an oxygen plasma ash.

Figure 76:
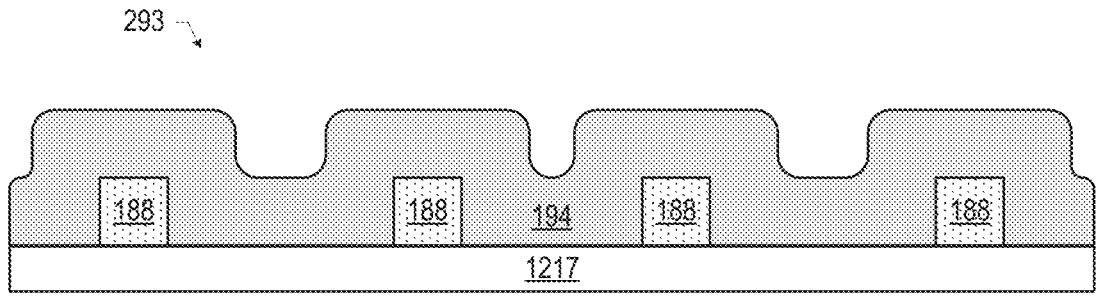

FIG. 76 is a cross-sectional view of an assembly 293 subsequent to providing a template material 194 on the patterned hardmask 188 of the assembly 292 (FIG. 75). In some embodiments, the template material 194 (and its provision) may take the form of any of the embodiments of the template material 192 discussed above. In some embodiments, the template material 194 may have the same material composition as the template material 192; in other embodiments, the template material 194 may have a different material composition from the template material 192.

Figure 77:
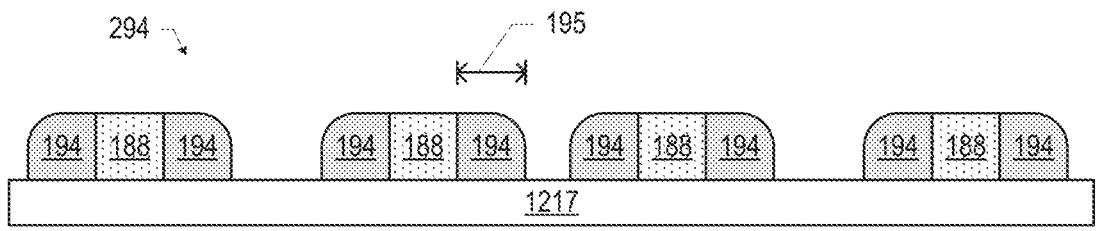

FIG. 77 is a cross-sectional view of an assembly 294 subsequent to etching the template material 194 of the assembly 293 (FIG. 76) to pattern the template material 194. The patterned template material 194 may be disposed on the sides of the patterned hardmask 188, analogously to the etching of the template material 192 discussed above with reference to FIG. 72. In particular, the template material 194 may be etched in accordance with any of the techniques for etching the template material 192 discussed above. The thickness of the template material 194 when provided (as illustrated in FIG. 76), and the dimensions of the patterned hardmask 188, may dictate the dimensions of the patterned template material 194.

Figure 78:
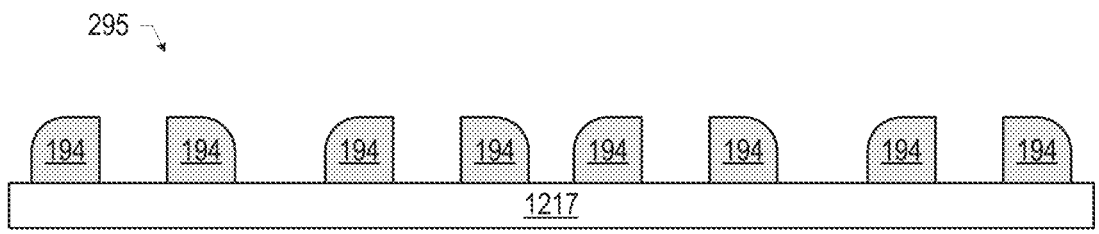

FIG. 78 is a cross-sectional view of an assembly 295 subsequent to removing the patterned hardmask 188 of the assembly 294 (FIG. 77). The patterned template material 194 may remain in the assembly 295. In some embodiments, the patterned hardmask 188 may be removed with a solvent, or with an oxygen plasma ash.

Figure 79:
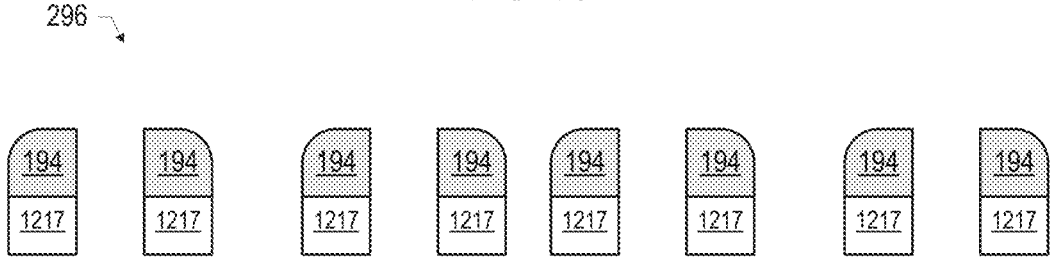

FIG. 79 is a cross-sectional view of an assembly 296 subsequent to etching the material 1217 in accordance with the pattern provided by the patterned template material 194 of the assembly 295 (FIG. 78). In particular, portions of the material 1217 not covered by the patterned template material 194 may be etched away. The etch may stop upon reaching an underlying material (not shown). This etching may result in a patterned material 1217, having dimensions that depend on the dimensions of the patterned template material 194.

Figure 80:
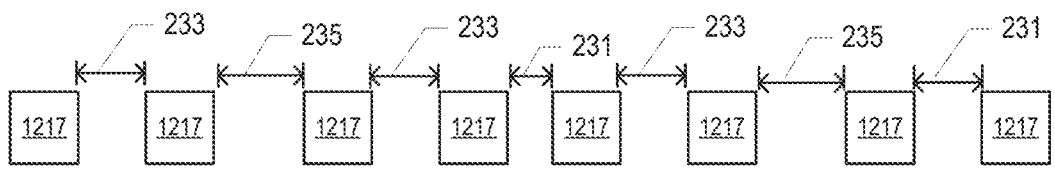

FIG. 80 is a cross-sectional view of an assembly 297 subsequent to removing the patterned template material 194 of the assembly 296 (FIG. 79). The patterned material 1217 may remain in the assembly 297, and the template material 194 may be removed in accordance with any of the embodiments discussed above with reference to the removal of the template material 192. The patterned material 1217 may be further processed in accordance with any of the embodiments disclosed herein.

In the assembly 297, the distances between adjacent ones of the portions of the material 1217 (and when the material 1217 is the insulating material 110, a dimension of the corresponding gates 108) may vary along an array of the gates 108. For example, the distance 231 may be equal to the distance 191 between adjacent portions of the patterned resist material 190 of the assembly 287 (FIG. 70) minus twice the thickness 193 of the patterned template material 192 of the assembly 289 (FIG. 72) minus twice the thickness 195 of the patterned template material 194 of the assembly 294 (FIG. 77), as illustrated. The distance 233 may be equal to the thickness 193 of the patterned template material 192 of the assembly 289 (FIG. 72), as illustrated. The distance 235 may be equal to the length 197 of a portion of the patterned template material 192 of the assembly 287 (FIG. 70) minus twice the thickness 195 of the patterned template material 194 of the assembly 294 (FIG. 77), as illustrated.

Suitable values of the distance 231, the distance 233, and the distance 235 may be achieved by appropriate selection of the distance 191, length 197, and thicknesses 193 and 195. As illustrated in FIG. 80, if the patterned resist material 190 has a regular pattern, and the gates 108 are partially formed by "filling in" between the portions of the patterned insulating material 110 (e.g., as discussed above with reference to FIGS. 29-31), the lengths of adjacent ones of the gates 108 in the assembly 297 (i.e., the x-lengths 170 illustrated in FIGS. 1 and 2) will also follow a regular pattern: distance 233-distance 235-distance 233-distance 231-distance 233-distance 235-distance 233-distance 235-distance 233-distance 231, etc.

References made herein to "pitch-quartering techniques" and "pitch-quartering" also include the use of pitch-halving techniques. In a pitch-halving approach, the hardmask 188 (and optionally the antireflective coating 186) may not be used; instead, the resist material 190 may be applied on the material 1217 as discussed above with reference to FIG. 69, the resist material 190 may be patterned as discussed above with reference to FIG. 70, a template material 192 may be provided as discussed above with reference to FIG. 71, the template material 192 may be etched as discussed above with reference to FIG. 72, the resist material 190 may be removed as discussed above with reference to FIG. 73, and then the material 1217 may be etched as discussed above with reference to FIG. 79 but in accordance with the pattern of the template material 192 (instead of the patterned template material 194). Any of the embodiments discussed herein may be patterned according to such a pitch-halving approach. In some embodiments, using pitch-halving techniques may enable features (e.g., trenches) to be patterned into the material 1217 with a pitch between 40 and 200 nanometers (e.g., between 50 and 70 nanometers) and a width between 15 and 100 nanometers (e.g., between 20 and 35 nanometers). In some embodiments, using pitch-quartering techniques may enable features (e.g., trenches) to be patterned into the material 1217 with a pitch between 15 and 100 nanometers (e.g., between 25 and 35 nanometers) and a width between 5 and 50 nanometers (e.g., between 10 and 18 nanometers).

As noted above, FIGS. 81-87 illustrate alternative techniques for patterning the insulating material 110-1 of the assembly 212 (FIG. 12), which may be used instead of the techniques illustrated in FIGS. 13-19 or the techniques illustrated in FIGS. 20-26. The "photobucket" techniques described with reference to FIGS. 81-87 (which also utilize spacer-based pitch-quartering or pitch-halving, as discussed above with reference to FIGS. 68-80) may enable greater control and smaller pitch than achievable using conventional lithography.

Figure 81A:
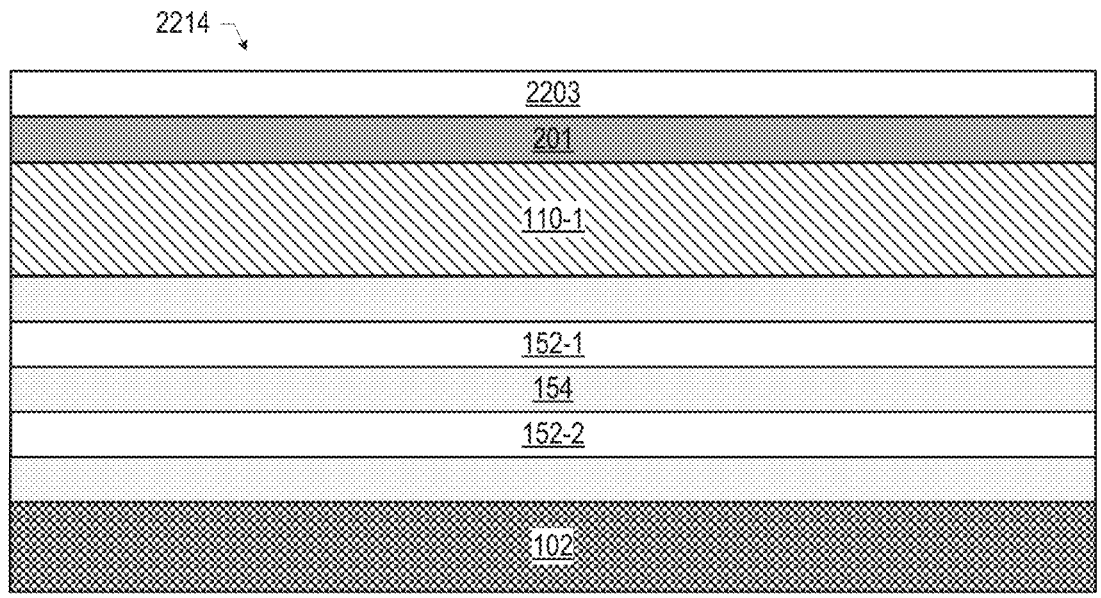
FIGS. 81A-B, 82A-B, 83A-B, 84A-B, 85A-B, 86A-B, and 87A-B illustrate various alternative stages in the manufacture of a quantum dot device, in accordance with various embodiments.
Figure 81B:
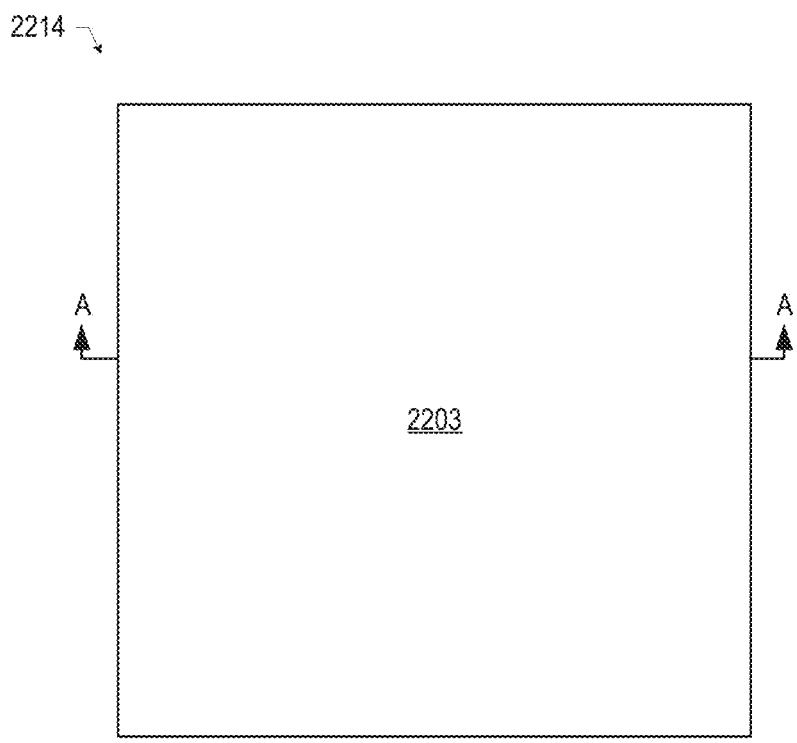

FIG. 81A is a cross-sectional view of an assembly 2214 subsequent to providing a hardmask 2203 on the hardmask 201 of the assembly 212 (FIG. 12). FIG. 81B is a top view of the assembly 2214; the cross-sectional view of FIG. 81A is taken along the section A-A of FIG. 81B. The hardmask 2203 may take the form of any of the hardmasks disclosed herein, for example.

Figure 82A:
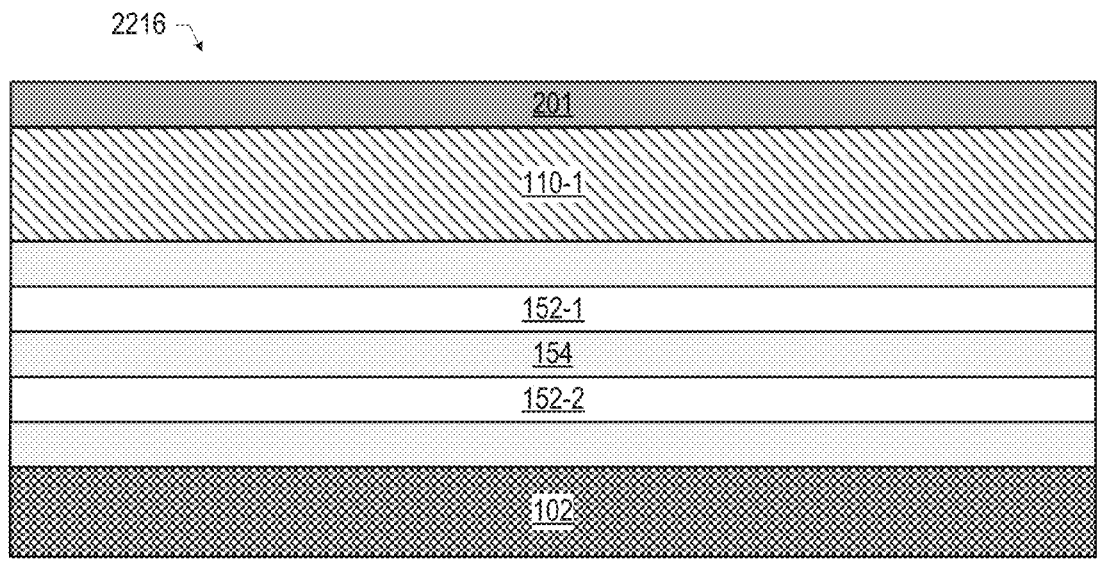
Figure 82B:
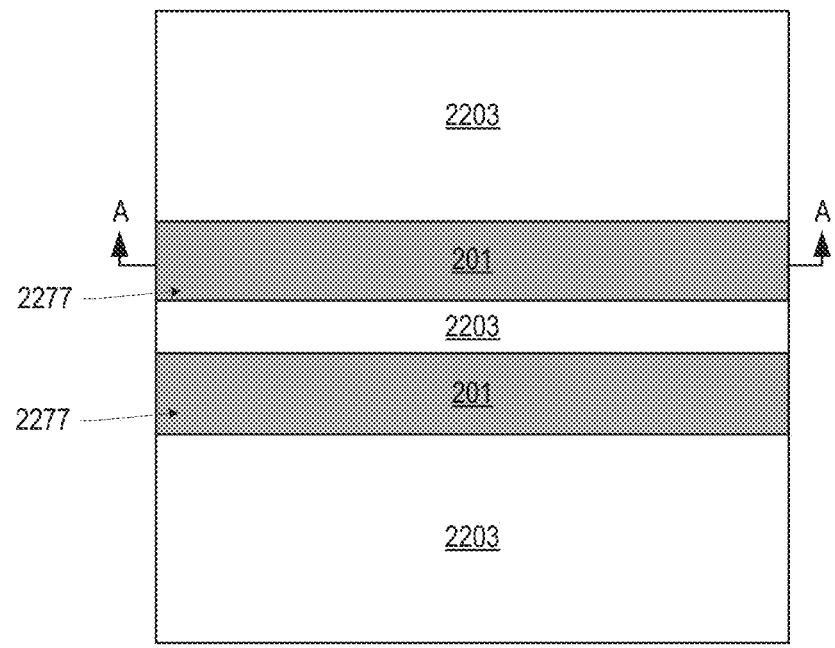

FIG. 82A is a cross-sectional view of an assembly 2216 subsequent to patterning the hardmask 2203 to form trenches 2277 in the hardmask 2203 of the assembly 2214 (FIGS. 81A and 81B) using a pitch-quartering or pitch-halving technique, as discussed above with reference to FIGS. 68-80. FIG. 82B is a top view of the assembly 2216; the cross-sectional view of FIG. 82A is taken along the section A-A of FIG. 82B. In particular, the view of FIG. 82A is taken along a trench 2277. The trenches 2277 may be parallel, and may have any suitable dimensions in accordance with the spacer-based patterning technique applied. Only two trenches 2277 are illustrated in FIG. 82B for economy of illustration, but any suitable number of trenches 2277 may be formed.

Figure 83A:
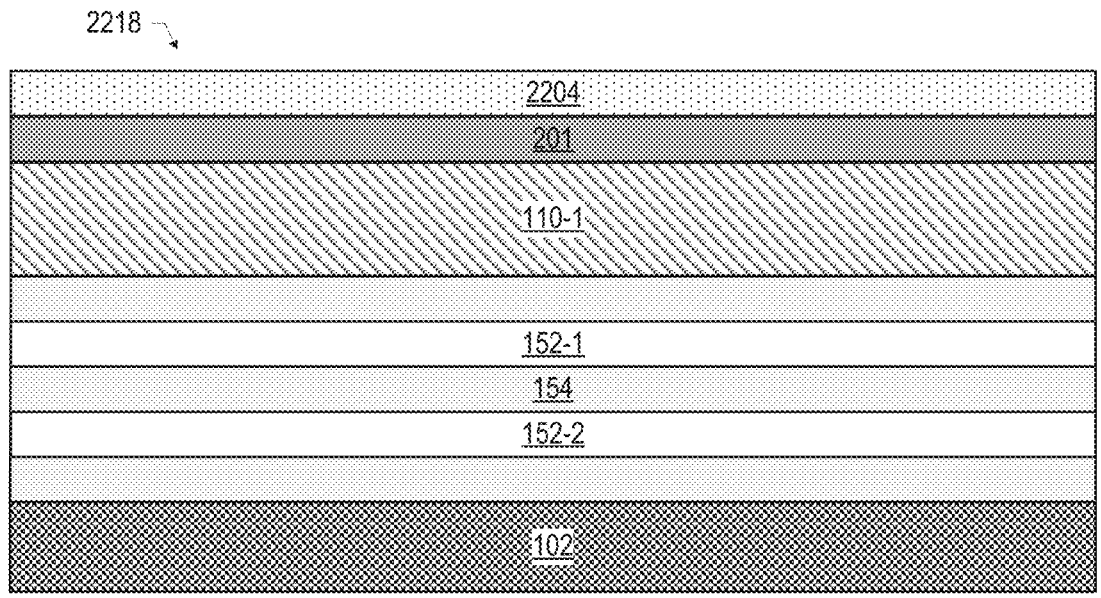
Figure 83B:
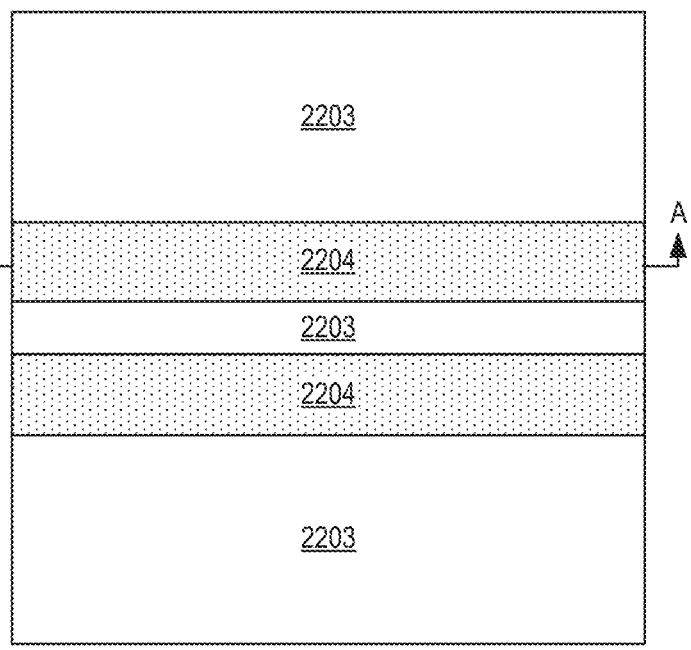

FIG. 83A is a cross-sectional view of an assembly 2218 subsequent to filling the trenches 2277 of the assembly 2216 (FIGS. 82A and 82B) with a resist material 2204. FIG. 83B is a top view of the assembly 2218; the cross-sectional view of FIG. 83A is taken along the section A-A of FIG. 83B. The resist material 2204 may be, for example, a photoresist. The resist material 2204 may be provided in the trenches 2277 using any suitable technique.

Figure 84A:
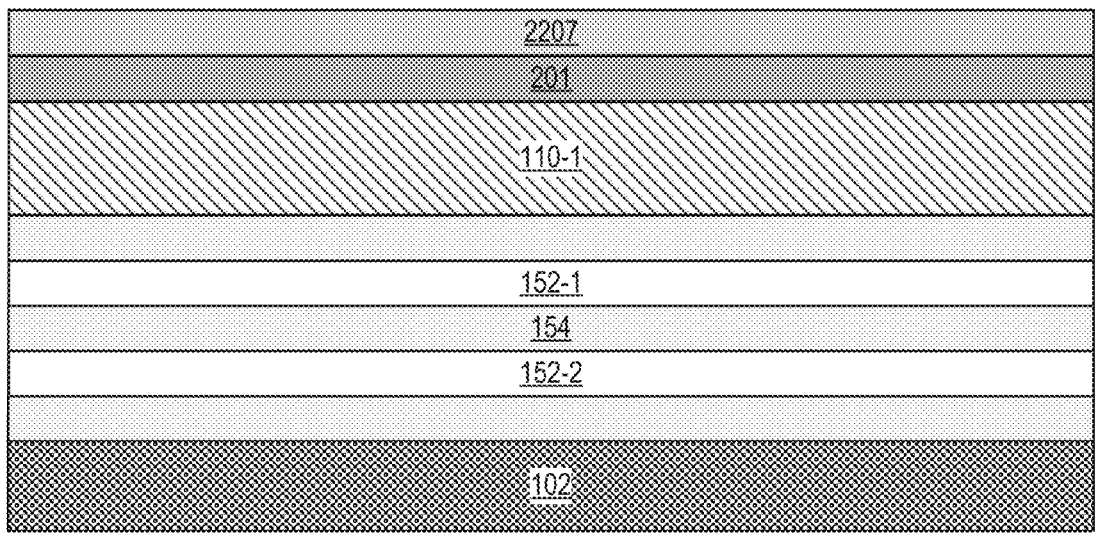
Figure 84B:
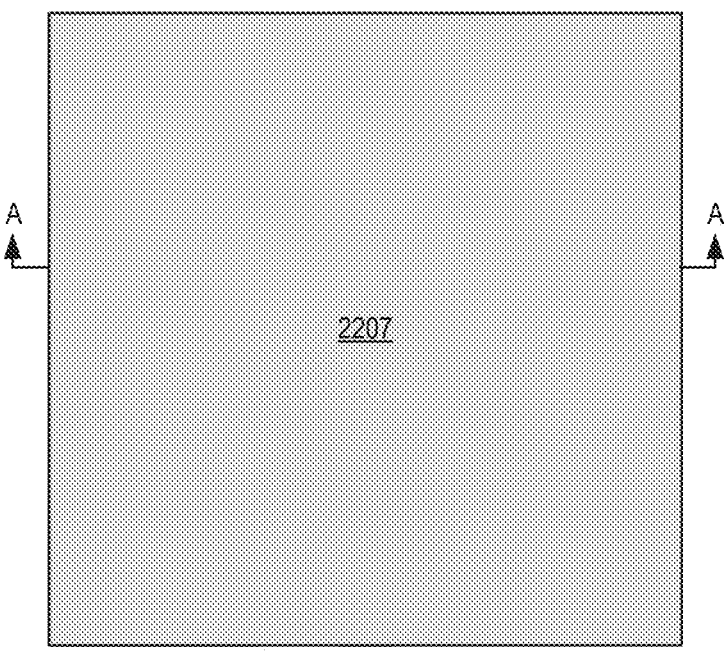

FIG. 84A is a cross-sectional view of an assembly 2220 subsequent to providing another hardmask 2207 on the assembly 2218 (FIGS. 83A and 83B). FIG. 84B is a top view of the assembly 2220; the cross-sectional view of FIG. 84A is taken along the section A-A of FIG. 84B. The hardmask 2207 may take the form of any of the hardmasks disclosed herein, for example.

Figure 85A:
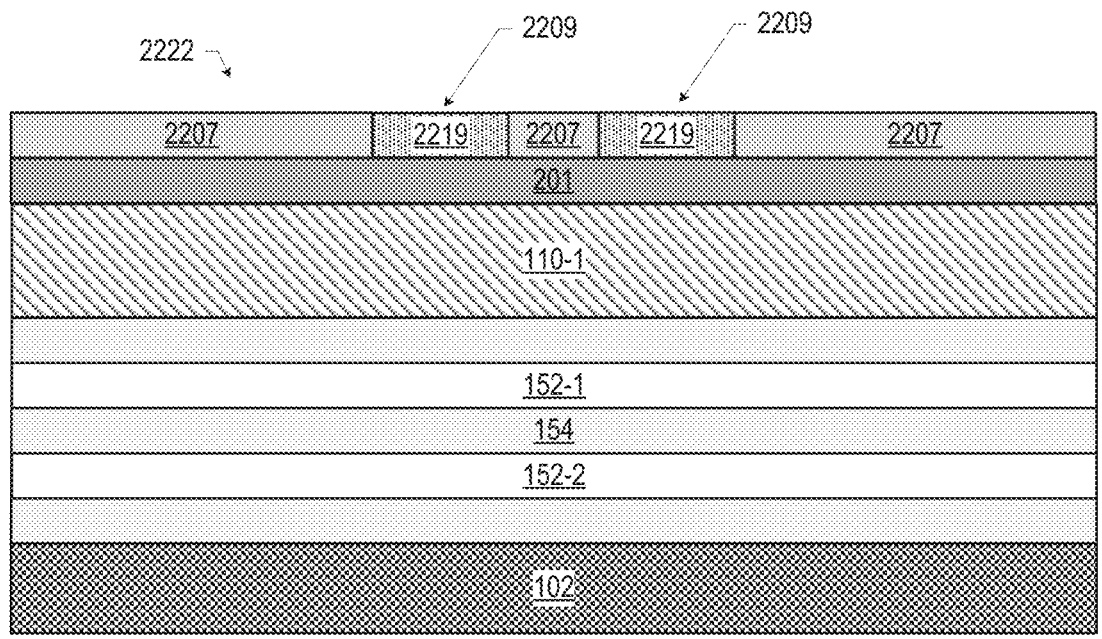
Figure 85B:
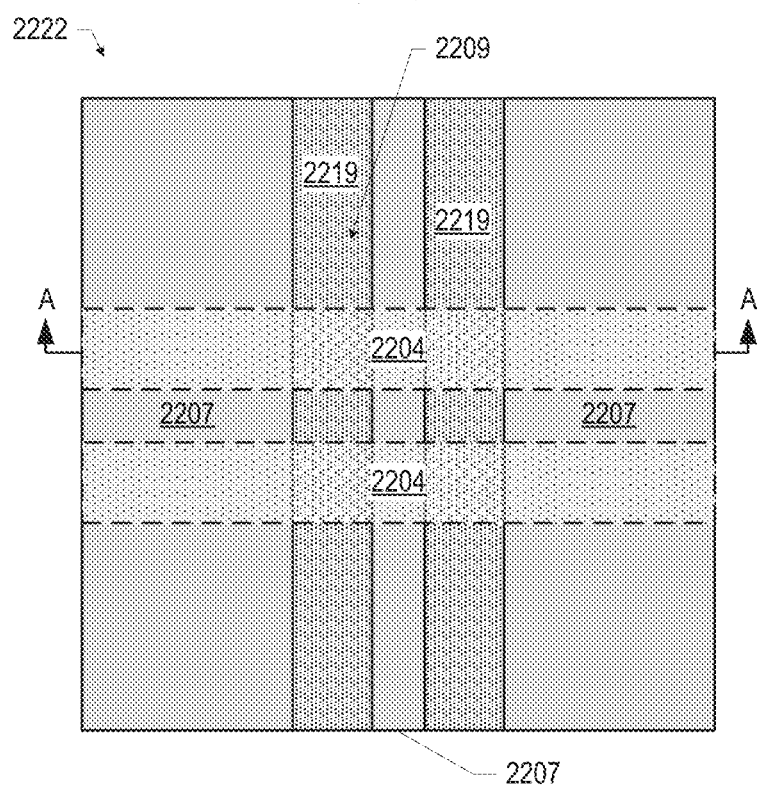

FIG. 85A is a cross-sectional view of an assembly 2222 subsequent to patterning the hardmask 2207 to form trenches 2209 in the hardmask 2207 of the assembly 2220 (FIGS. 84A and 84B), and filling the trenches 2209 with resist material 2219. FIG. 85B is a top view of the assembly 2222; the cross-sectional view of FIG. 85A is taken along the section A-A of FIG. 85B. The hardmask 2207 may be patterned in accordance with any of the embodiments discussed above with reference to the patterning of the hardmask 2203 (e.g., using a pitch-quartering or pitch-halving technique), and the resist material 2219 may be provided in accordance with any of the embodiments discussed above with reference to the provision of the resist material 2204. The trenches 2209 in the hardmask 2207 may be oriented differently than the trenches 2277 in the assembly 2218 (FIGS. 83A and 83B); for example, as illustrated in FIGS. 85A and 85B, the trenches 2209 may be perpendicular to, and overlap with, the trenches 2277. The resist material 2204 in the trenches 2277 are shown with dashed lines in FIG. 85B to illustrate the areas of overlap with the resist material 2219 in the trenches 2209. Only two trenches 2209 are illustrated in FIGS. 85A and 85B for economy of illustration, but any suitable number of trenches 2209 may be formed.

Figure 86A:
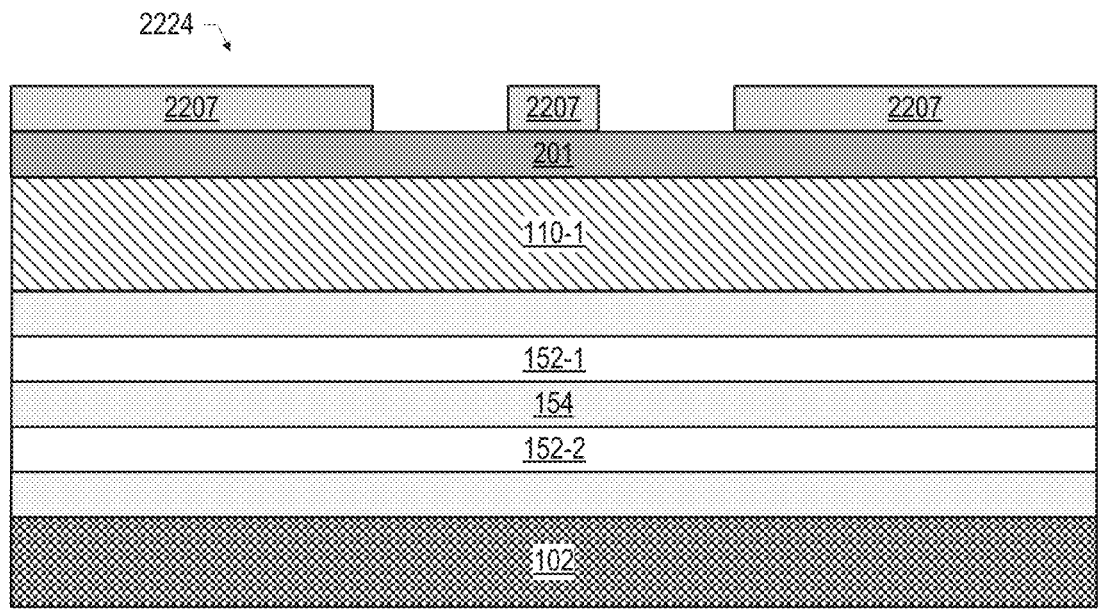
Figure 86B:
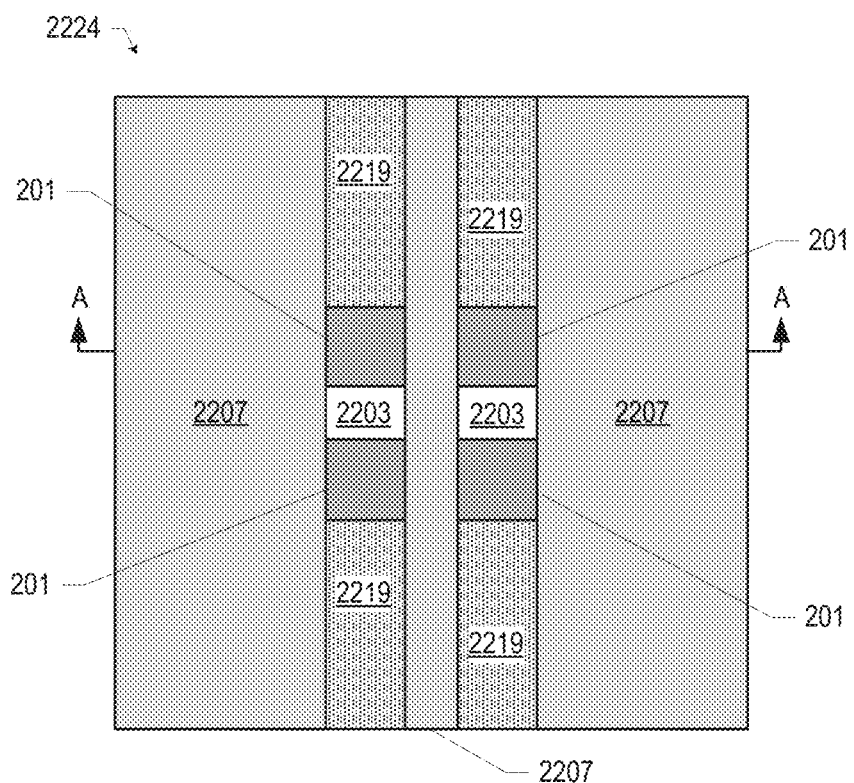

FIG. 86A is a cross-sectional view of an assembly 2224 subsequent to exposing at least some of the areas of overlap between the resist material 2219 and the resist material 2204 of the assembly 2222 (FIGS. 85A and 85B), and then developing the exposed resist material 2219 and resist material 2204 to "uncover" areas of the hardmask 201 that are not covered by the undeveloped resist material 2204, the undeveloped resist material 2219, or either of the hardmasks 2203 and 2207. FIG. 86B is a top view of the assembly 2224; the cross-sectional view of FIG. 86A is taken along the section A-A of FIG. 86B. In the embodiment illustrated in FIGS. 86A and 86B, all four areas of overlap between the resist material 2204 and the resist material 2219 are shown as developed, uncovering four rectangular areas of the hardmask 201. In other embodiments, fewer than all of the areas of overlap between the resist material 2204 and the resist material 2219 may be developed, in any desired pattern.

Figure 87A:
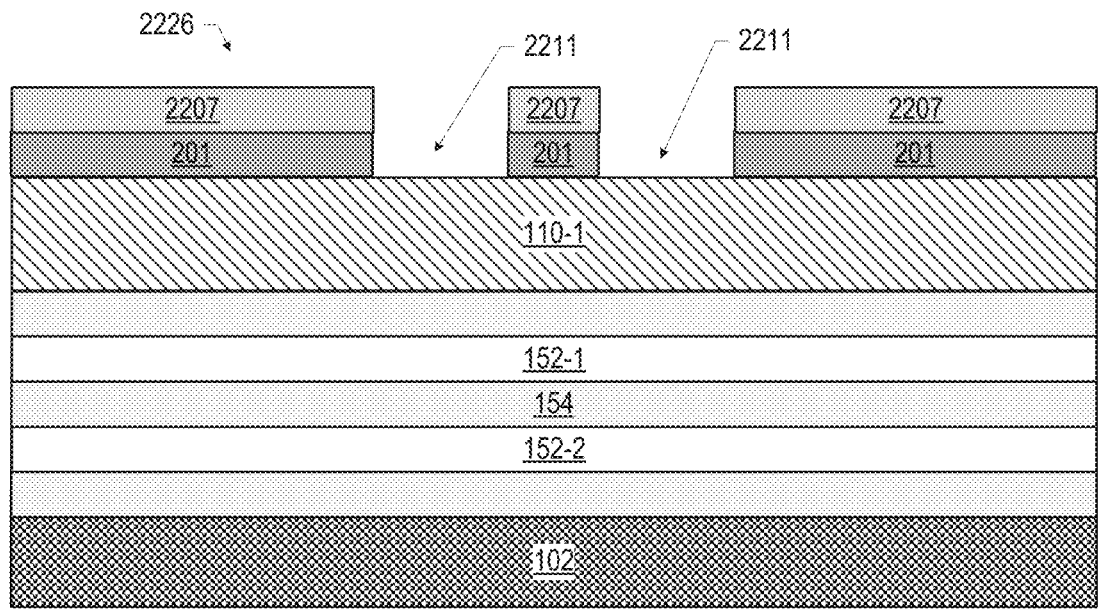
Figure 87B:
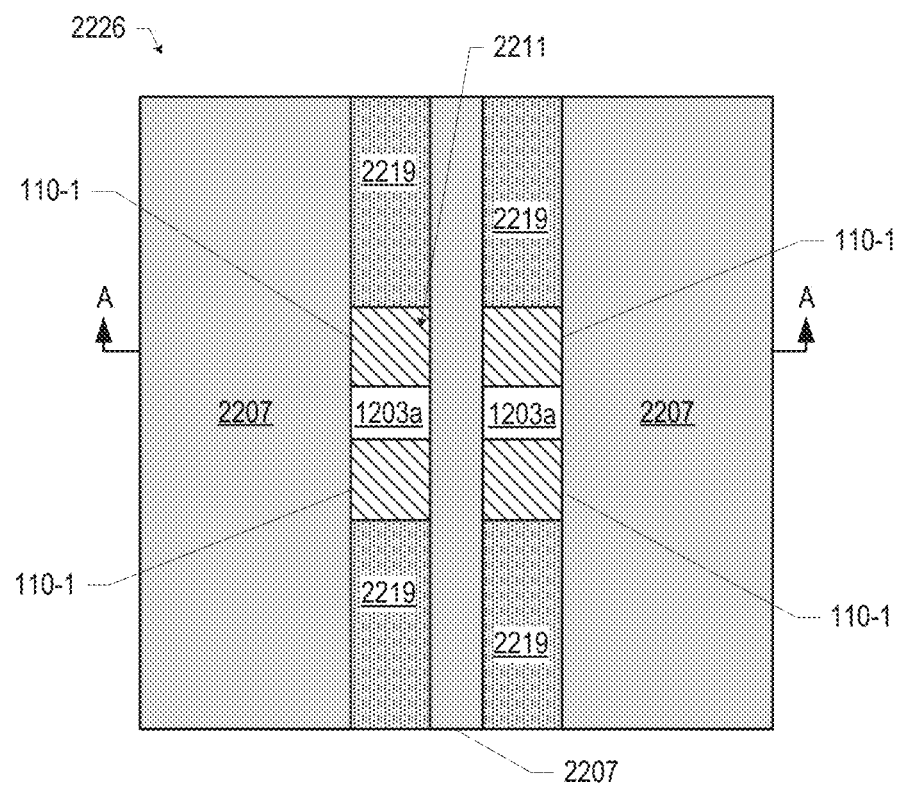

FIG. 87A is a cross-sectional view of an assembly 2226 subsequent to patterning the hardmask 201 of the assembly 2224 (FIGS. 86A and 86B) to etch away portions of the hardmask 201 that are not covered by the undeveloped resist material 2204, the undeveloped resist material 2219, or either of the hardmasks 2203 and 2207. FIG. 87B is a top view of the assembly 2226; the cross-sectional view of FIG. 87A is taken along the section A-A of FIG. 87B. The resulting patterned hardmask 201 may include openings 2211 that have rectangular footprints (corresponding to the areas where the trenches 2209 and the trenches 2277 "overlapped"). The patterned hardmask 201 may be used to analogously pattern the insulating material 110-1 with openings 111-1, as discussed above with reference to several of the preceding embodiments, and further processing may be performed as disclosed herein.

Figure 88:
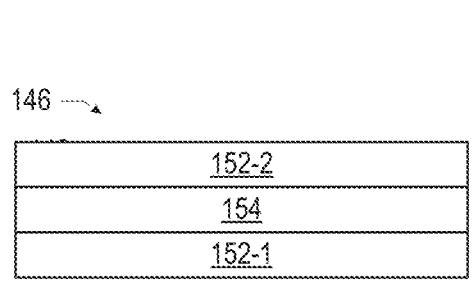
FIGS. 88-89 are cross-sectional views of various examples of quantum well stacks that may be used in a quantum dot device, in accordance with various embodiments.
Figure 89:
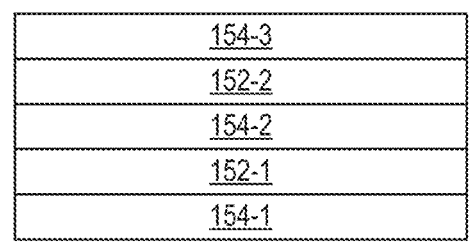

As noted above, a quantum well stack 146 included in a quantum dot device 100 may take any of a number of forms, several of which are illustrated in FIGS. 88-89. Although the quantum well stacks 146 illustrated in FIGS. 88-89 each include two quantum well layers 152, in some embodiments, the quantum well stack 146 included in a quantum dot device 100 may include one quantum well layer 152 or more than two quantum well layers 152; elements may be omitted from the quantum well stacks 146, or added to the quantum well stacks 146, discussed with reference to FIGS. 88-89 to achieve such embodiments, as appropriate.

FIG. 88 is a cross-sectional view of a quantum well stack 146 including a quantum well layer 152-1, a barrier layer 154, and a quantum well layer 152-2. In some embodiments, the quantum well layers 152 of FIG. 88 may be formed of intrinsic silicon, and the gate dielectrics 114 may be formed of silicon oxide; in such an arrangement, during use of the quantum dot device 100, a 2DEG may form in the intrinsic silicon at the interface between the intrinsic silicon and the proximate silicon oxide. Embodiments in which the quantum well layers 152 of FIG. 88 are formed of intrinsic silicon may be particularly advantageous for electron-type quantum dot devices 100. In some embodiments, the quantum well layers 152 of FIG. 88 may be formed of intrinsic germanium, and the gate dielectrics 114 may be formed of germanium oxide; in such an arrangement, during use of the quantum dot device 100, a 2DEG may form in the intrinsic germanium at the interface between the intrinsic germanium and the proximate germanium oxide. Such embodiments may be particularly advantageous for hole-type quantum dot devices 100. In some embodiments, the quantum well layers 152 may be strained, while in other embodiments, the quantum well layers 152 may not be strained.

The barrier layer 154 of FIG. 88 may provide a potential barrier between the quantum well layer 152-1 and the quantum well layer 152-2. In some embodiments in which the quantum well layers 152 of FIG. 88 are formed of silicon, the barrier layer 154 may be formed of silicon germanium. The germanium content of this silicon germanium may be 20-80% (e.g., 30%). In some embodiments in which the quantum well layers 152 are formed of germanium, the barrier layer 154 may be formed of silicon germanium (with a germanium content of 20-80% (e.g., 70%)).

The thicknesses (i.e., z-heights) of the layers in the quantum well stack 146 of FIG. 88 may take any suitable values. For example, in some embodiments, the thickness of the barrier layer 154 (e.g., silicon germanium) may be between 0 and 400 nanometers. In some embodiments, the thickness of the quantum well layers 152 (e.g., silicon or germanium) may be between 5 and 30 nanometers.

The quantum well stack 146 of FIG. 88 may be disposed between the sets of gates 105-1 and 105-2, as discussed above. In some embodiments, the layers of the quantum well stack 146 of FIG. 88 (and FIG. 89) may be grown on the base 102 (and on each other) by epitaxy.

FIG. 89 is a cross-sectional view of a quantum well stack 146 including quantum well layers 152-1 and 152-2, a barrier layer 154-2 disposed between the quantum well layers 152-1 and 152-2, and additional barrier layers 154-1 and 154-3. The quantum well stack 146 may be disposed on the gate dielectric 114-1 such that the barrier layer 154-1 is disposed between the quantum well layer 152-1 and the gate dielectric 114-1. The barrier layer 154-3 may be disposed between the quantum well layer 152-2 and the gate dielectric 114-2. In some embodiments, the barrier layer 154-3 may be formed of a material (e.g., silicon germanium), and when the quantum well stack 146 is being grown on the substrate 144, the barrier layer 154-3 may include a buffer region of that material. This buffer region may trap defects that form in this material as it is grown on the substrate 144, and in some embodiments, the buffer region may be grown under different conditions (e.g., deposition temperature or growth rate) from the rest of the barrier layer 154-3. In particular, the rest of the barrier layer 154-3 may be grown under conditions that achieve fewer defects than the buffer region. When the base 102 is separated from the rest of the assembly 236 during manufacturing of the quantum dot device 100 (e.g., as discussed above with reference to FIG. 38), the quantum well stack 146 may be "broken" in a buffer region of the barrier layer 154-3.

The barrier layers 154-1 and 154-3 may provide potential energy barriers around the quantum well layers 152-1 and 152-2, respectively, and the barrier layer 154-1 may take the form of any of the embodiments of the barrier layer 154-3 discussed herein. The barrier layer 154-2 may take the form of any of the embodiments of the barrier layer 154 discussed above with reference to FIG. 88. The thicknesses (i.e., z-heights) of the layers in the quantum well stack 146 of FIG. 89 may take any suitable values. For example, in some embodiments, the thickness of the barrier layers 154-1 and 154-3 (e.g., silicon germanium) may be between 0 and 400 nanometers. In some embodiments, the thickness of the quantum well layers 152 (e.g., silicon or germanium) may be between 5 and 30 nanometers (e.g., 10 nanometers). In some embodiments, the thickness of the barrier layer 154-2 (e.g., silicon germanium) may be between 25 and 75 nanometers (e.g., 32 nanometers).

In some embodiments, the quantum dot device 100 may include a gate interface material between the quantum well stack 146 and the gate dielectric 114. The gate interface material may provide an interface between the quantum well stack 146 and the gate dielectric 114 that has a low total interface trap density ($D_{it}$), reducing the likelihood of scattering that may impede the coherence of the quantum dots 142 formed in the quantum dot device 100. The gate interface material may include any suitable material to improve the $D_{it}$ of the gates 108 on the quantum well stack 146. In some embodiments, the gate interface material may include silicon. Silicon may be a particularly useful material for the gate interface material when the quantum well stack 146 includes silicon germanium (e.g., as a barrier layer 154), and the gate interface material is disposed on the silicon germanium. In some embodiments in which the gate interface material includes silicon, the silicon may oxidize (e.g., due to air exposure before the gate dielectric 114 is formed) to form a layer of silicon oxide at the interface between the silicon of the gate interface material and the gate dielectric 114. In some embodiments, the gate interface material may include aluminum nitride, aluminum oxynitride, or germanium oxide. In embodiments in which the gate interface material includes germanium oxide, the gate interface material may be formed by forming a layer of germanium, then allowing the layer of germanium to oxidize. In some embodiments, the gate interface material may be a thin layer grown by epitaxy on a quantum well stack 146. For example, in embodiments in which the quantum well stack 146 includes a silicon germanium barrier layer 154 between a quantum well layer 152 and a gate 108, the gate interface material (e.g., silicon) may be grown directly on the silicon germanium barrier. In some embodiments, the gate dielectric 114 (e.g., hafnium oxide) may be grown on top of the gate interface material. The interface between the gate interface material and the gate dielectric 114 may have fewer electrical defects than if the gate dielectric 114 were formed directly on the quantum well stack.

Although the etched quantum well stacks 146 have been illustrated in many of the preceding figures as substantially rectangular with parallel sidewalls, this is simply for ease of illustration, and the quantum well stacks 146 may have any suitable shape (e.g., a shape appropriate to the manufacturing processes used to shape the quantum well stacks 146). For example, in some embodiments, the quantum well stacks 146 may be tapered, narrowing as they extend away from the base 102 (FIG. 7). In some embodiments, the quantum well stacks 146 may taper by 3-10 nanometers in x-width for every 100 nanometers in z-height (e.g., 5 nanometers in x-width for every 100 nanometers in z-height).

Figure 90:
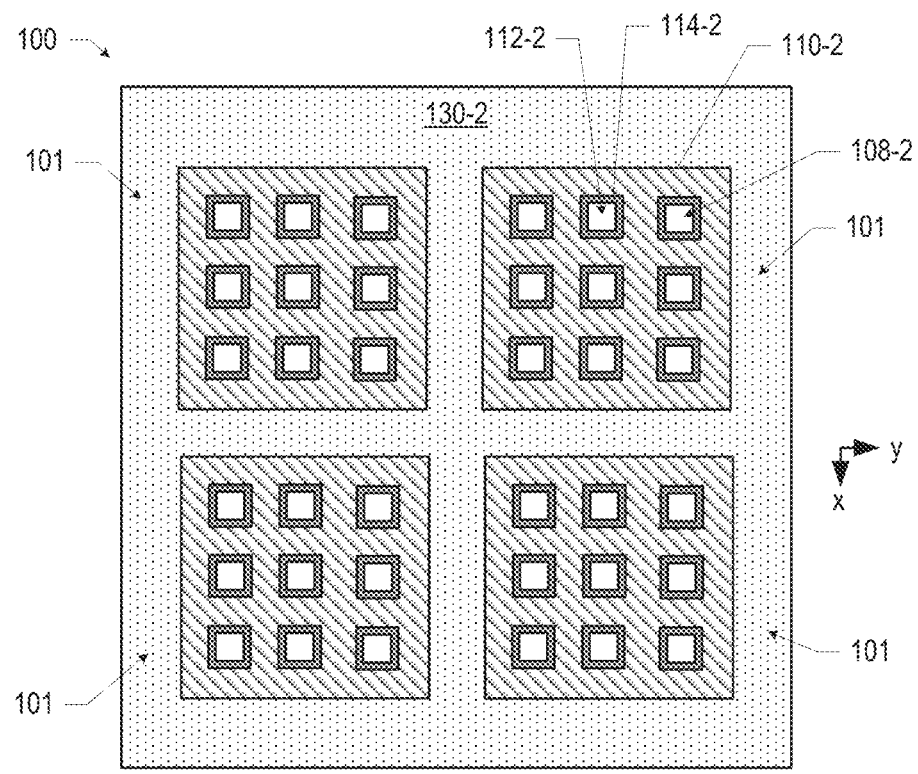
FIG. 90 illustrates an embodiment of a quantum dot device having multiple quantum dot formation regions, in accordance with various embodiments.

Although only a single quantum dot formation region 104 is illustrated in FIGS. 1-4, a quantum dot device 100 may include any number of quantum dot formation regions 104, arranged in any desired manner. For example, multiple quantum dot formation regions 104 may be arranged in a line, or in a rectangular array, or in any desired distribution. For example, FIG. 90 is a top cross-sectional view (analogous to the view of FIG. 1) of a quantum dot device 100 including four quantum dot formation regions 104 arranged in a 2×2 array. Each of the quantum dot formation regions 104 may take the form of any of the quantum dot formation regions disclosed herein (e.g., the quantum dot formation region 104 illustrated in FIG. 1). In particular, a single quantum dot device 100 may include multiple sets of gates 105-1 and/or 105-2, spaced apart by an intervening quantum well stack 146. Multiple quantum dot formation regions 104 may be formed in parallel using the techniques discussed above with reference to FIGS. 5-80, for example. In some embodiments, multiple quantum dot formation regions 104 in a quantum dot device 100 may share common elements. For example, in some embodiments, multiple quantum dot formation regions 104 may share a common doped region 140 (not shown in FIG. 38, but located in any suitable location in the quantum dot device 100) to act as a reservoir for multiple quantum well layers 152. As discussed above, the particular number and arrangement of gates 108 in the embodiment of FIG. 38 is simply illustrative, and any suitable gate arrangement may be used in a quantum dot formation region 104. In some embodiments, different quantum dot formation regions 104 included in a single quantum dot device 100 may have different structures (e.g., different numbers and arrangements of gates 108, or different quantum well stacks 146).

Any of the quantum dot devices 100 disclosed herein may include one or more magnet lines. As used herein, a "magnet line" refers to a magnetic-field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 91:
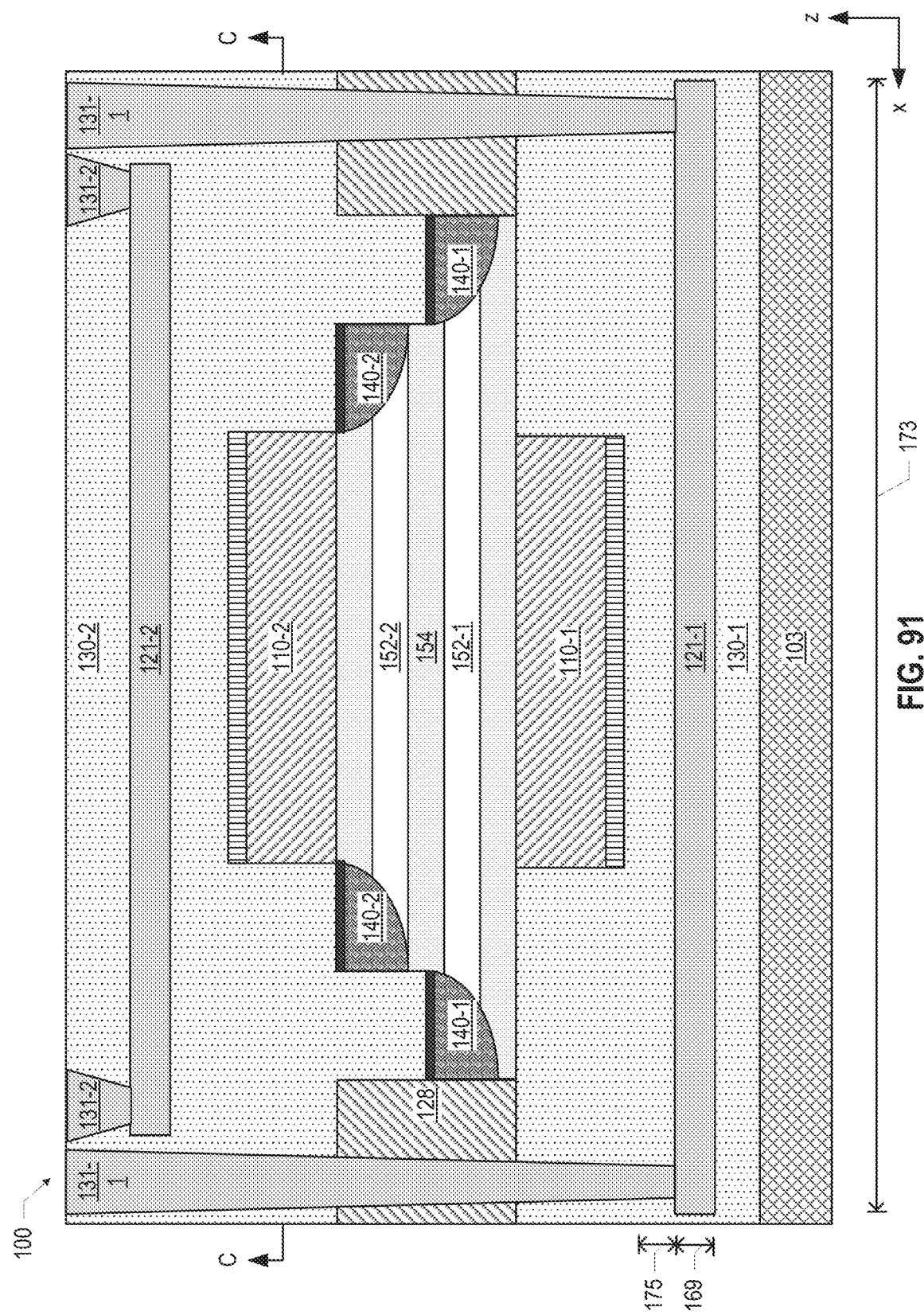
FIGS. 91-92 are cross-sectional views of a quantum dot device including magnet lines, in accordance with various embodiments.
Figure 92:
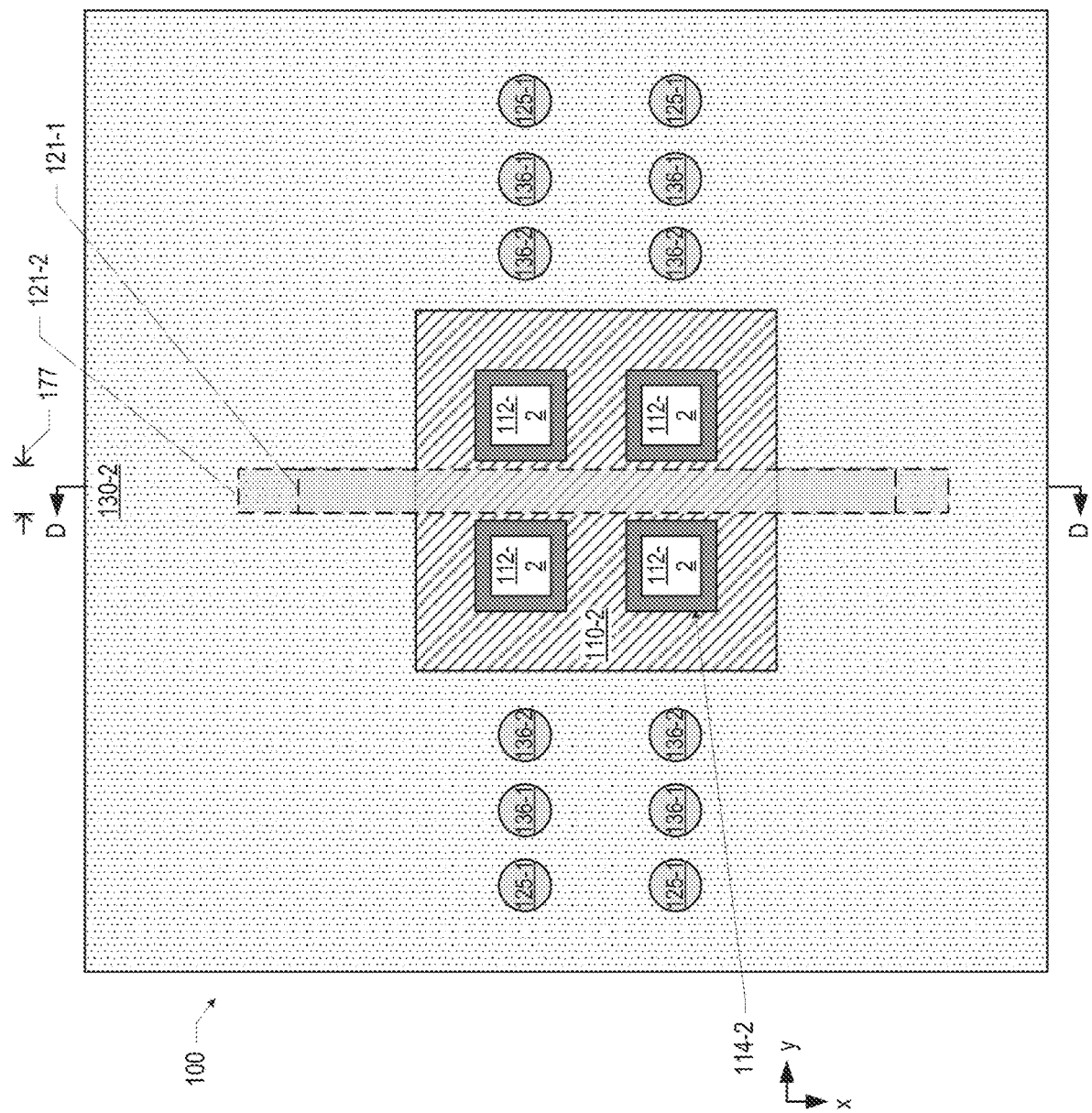

For example, FIGS. 91 and 92 are side and top views, respectively, of a quantum dot device 100 including multiple magnet lines 121. In particular, FIG. 92 illustrates the quantum dot device 100 taken along the section C-C of FIG. 91 (while FIG. 91 illustrates the quantum dot device 100 taken along the section D-D of FIG. 92). A magnet line 121-1 is disposed proximate to the quantum well layer 152-1, and a magnet line 121-2 is disposed proximate to the quantum well layer 152-2.

A magnet line 121 may be formed of a conductive material, and may be used to conduct current pulses that generate magnetic fields to influence the spin states of one or more of the quantum dots 142 that may form in the quantum dot device 100. In some embodiments, a magnet line 121 may conduct a pulse to reset (or "scramble") nuclear and/or quantum dot spins. In some embodiments, a magnet line 121 may conduct a pulse to initialize an electron in a quantum dot in a particular spin state. In some embodiments, a magnet line 121 may conduct current to provide a continuous, oscillating magnet field to which the spin of a qubit may couple. A magnet line 121 may provide any suitable combination of these embodiments, or any other appropriate functionality.

In some embodiments, a magnet line 121 may be formed of copper. In some embodiments, a magnet line 121 may be formed of a superconductor, such as aluminum. In some embodiments, a magnet line 121 may be spaced apart from proximate gates 108 by a distance 175. The distance 175 may take any suitable value (e.g., based on the desired strength of magnetic field interaction with the quantum dots 142); in some embodiments, the distance 175 may be between 25 nanometers and 1 micron (e.g., between 50 nanometers and 200 nanometers). In embodiments in which a quantum dot device 100 includes multiple magnet lines 121, the distances 175 between the multiple magnet lines 121 and proximate gates 108 may be the same or different.

In some embodiments, a magnet line 121 may be formed of a magnetic material. For example, a magnetic material (such as cobalt) may be deposited in a trench in the insulating material 130 to provide a permanent magnetic field in the quantum dot device 100.

A magnet line 121 may have any suitable dimensions. For example, the magnet line 121 may have a thickness 169 between 25 and 100 nanometers. A magnet line 121 may have a width 177 between 25 and 100 nanometers. In some embodiments, the width 177 and thickness 169 of a magnet line 121 may be equal to the width and thickness, respectively, of other conductive lines in the quantum dot device 100 used to provide electrical interconnects (e.g., the conductive lines 393 and 396, discussed below with reference to FIGS. 93 and 94), as known in the art, and may be formed using any processes known for forming conductive lines (e.g., plating in a trench, followed by planarization, or a semi-additive process). A magnet line 121 may have a length 173 that may depend on the number and dimensions of the gates 108 that are to form quantum dots 142 with which the magnet line 121 is to interact. The magnet lines 121 illustrated in FIGS. 91 and 92 are substantially linear, but this need not be the case; magnet lines 121 may take any suitable shape. Conductive vias 131 may contact the magnet lines 121.

In some embodiments, a quantum dot device 100 may include one magnet line 121, or no magnet lines 121; in other embodiments, a quantum dot device 100 may include two, three, four, or more magnet lines 121. Magnet lines 121 included in a quantum dot device 100 may be oriented in any desired manner relative to the gates 108 or other structural features of the quantum dot device 100; for example, one or more magnet lines 121 may be oriented from left to right according to the perspective of FIG. 92, in addition to or instead of one or more magnet lines 121 oriented up and down according to the perspective of FIG. 92 (as illustrated).

Figure 93:
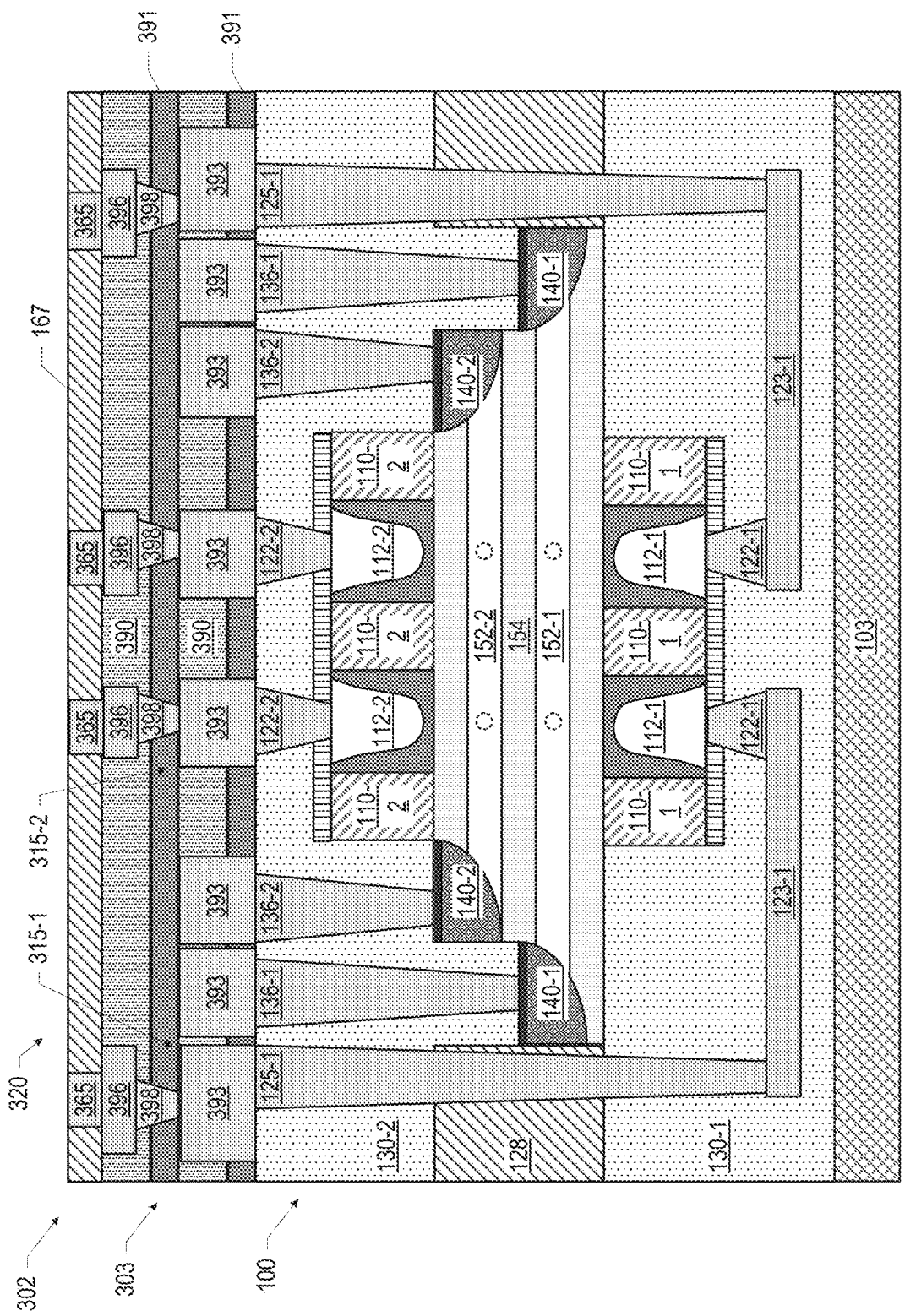
FIG. 93 is a cross-sectional view of a quantum dot device with multiple interconnect layers, in accordance with various embodiments.
Figure 94:
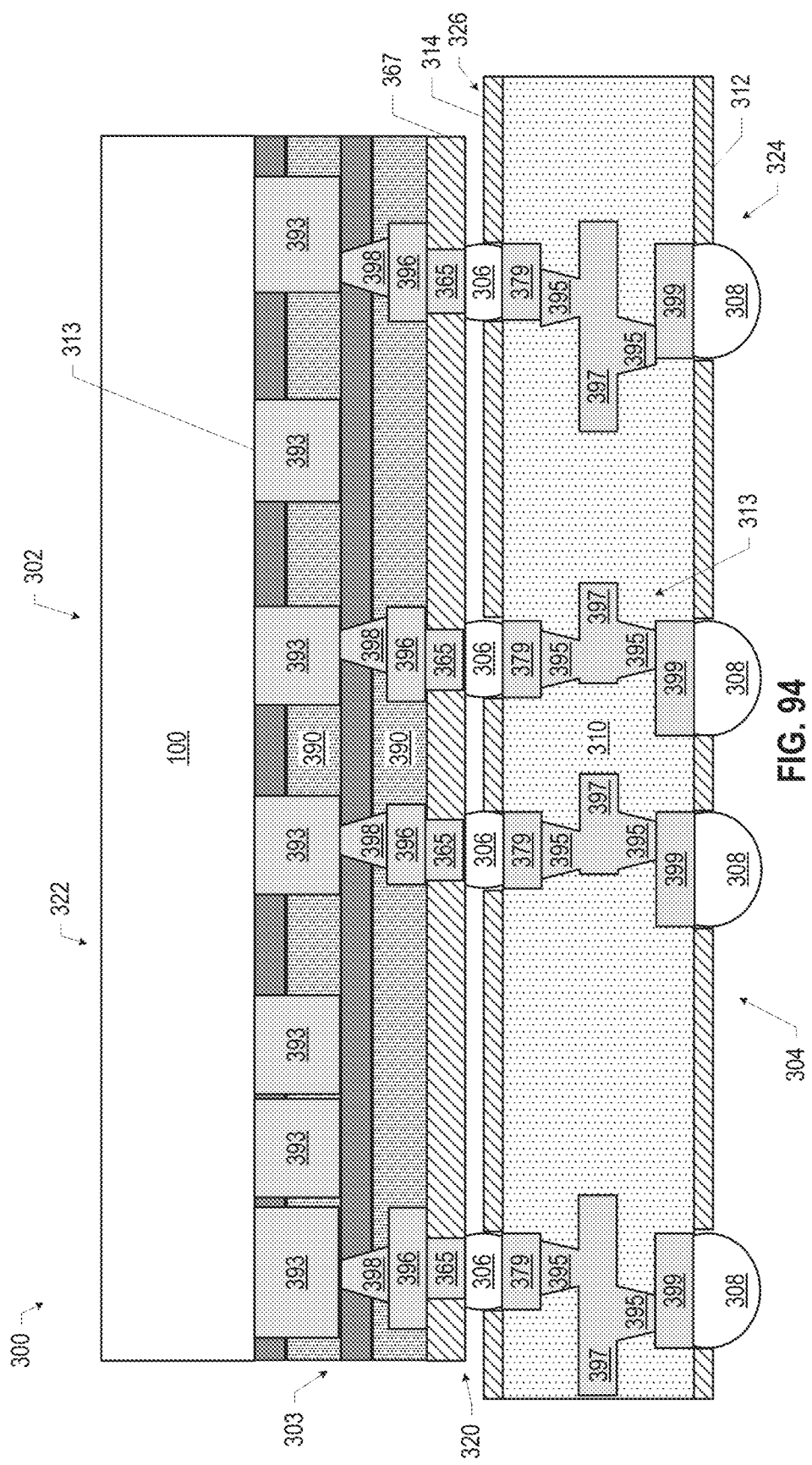
FIG. 94 is a cross-sectional view of a quantum dot device package, in accordance with various embodiments.

In some embodiments, the quantum dot device 100 may be included in a die and coupled to a package substrate to form a quantum dot device package. For example, FIG. 93 is a side cross-sectional view of a die 302 including the quantum dot device 100 of FIG. 2 and conductive pathway layers 303 disposed thereon, while FIG. 94 is a side cross-sectional view of a quantum dot device package 300 in which the die 302 is coupled to a package substrate 304. Details of the quantum dot device 100 are omitted from FIG. 94 for economy of illustration. As noted above, the particular quantum dot device 100 illustrated in FIG. 94 may take the form of the quantum dot device 100 illustrated in FIG. 2, but any of the quantum dot devices 100 disclosed herein may be included in a die (e.g., the die 302) and coupled to a package substrate (e.g., the package substrate 304). In particular, any number of quantum dot formation regions 104, gates 108, doped regions 140, and other components discussed herein with reference to various embodiments of the quantum dot device 100 may be included in the die 302.

The die 302 may include a first face 320 and an opposing second face 322. The support 103 may be proximate to the second face 322, and conductive pathways 315 from various components of the quantum dot device 100 may extend to conductive contacts 365 disposed at the first face 320. The conductive pathways 315 may include conductive vias, conductive lines, and/or any combination of conductive vias and lines. For example, FIG. 93 illustrates an embodiment in which a conductive pathway 315-1 (extending between a gate 108-1 and associated conductive contact 365) includes a conductive via 120-1, a conductive line 129-1, a conductive via 127-1, a conductive line 393, a conductive via 398, and a conductive line 396. In the embodiment of FIG. 93, a conductive pathway 315-2 (extending between the gate 108-2 and associated conductive contact 365) include a conductive via 120-2, a conductive line 393, a conductive via 398, and a conductive line 396. More or fewer structures may be included in the conductive pathways 315, and analogous conductive pathways 315 may be provided between ones of the conductive contacts 365 and the doped regions 140 (and any other components, such as magnet lines, included in the quantum dot device 100). In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 108, the doped regions 140, and the quantum well stack 146 (as well as the proximate conductive vias/lines) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer.

A solder resist material 367 may be disposed around the conductive contacts 365, and in some embodiments may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 93 take the form of bond pads, but other first level interconnect structures may be used (e.g., posts) to route electrical signals to/from the die 302, as discussed below.

The combination of the conductive pathways and the proximate insulating material (e.g., the insulating material 130, the oxide material 390, and the nitride material 391) in the die 302 may provide an interlayer dielectric (ILD) stack of the die 302. As noted above, interconnect structures may be arranged within the quantum dot device 100 to route electrical signals according to a wide variety of designs (in particular, the arrangement is not limited to the particular configuration of interconnect structures depicted in FIG. 93 or any of the other accompanying figures, and may include more or fewer interconnect structures). During operation of the quantum dot device 100, electrical signals (such as power and/or input/output (I/O) signals) may be routed to and/or from the gates 108 and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313 (discussed below) and 315, and/or conductive contacts of the die 302 and/or the package substrate 304, may include aluminum, niobium, tin, titanium, osmium, zinc, molybdenum, tantalum, vanadium, or composites of such materials (e.g., niobium-titanium, niobium-aluminum, or niobium-tin). In some embodiments, the conductive contacts 365, 379, and/or 399 may include aluminum, and the first level interconnects 306 and/or the second level interconnects 308 may include an indium-based solder.

In the quantum dot device package 300 (FIG. 94), first level interconnects 306 may be disposed between the first face 320 of the die 302 and the second face 326 of a package substrate 304. Having first level interconnects 306 disposed between the first face 320 of the die 302 and the second face 326 of the package substrate 304 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first level interconnects 306 may enable the quantum dot device package 300 to have much lower parasitic inductance relative to using wirebonds to couple the die 302 and the package substrate 304, which may result in an improvement in signal integrity for high-speed signals communicated between the die 302 and the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways 313 may extend through insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulating material 130 disclosed herein, for example. The conductive pathways 313 may include one or more conductive vias 395 and/or one or more conductive lines 397, for example.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 to extend between the first face 324 and the second face 326.

In some embodiments, the package substrate 304 may be or may otherwise include a silicon interposer, and the conductive pathways 313 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers).

The conductive contacts 365 of the die 302 may be electrically coupled to the conductive contacts 379 of the package substrate 304 via the first level interconnects 306. In some embodiments, the first level interconnects 306 may include solder bumps or balls (as illustrated in FIG. 94); for example, the first level interconnects 306 may be flip chip (or controlled collapse chip connection, "C4") bumps disposed initially on the die 302 or on the package substrate 304. Second level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the quantum dot device package 300 are discussed below with reference to FIG. 96. The die 302 may be brought in contact with the package substrate 304 using a pick-and-place apparatus, for example, and a reflow or thermal compression bonding operation may be used to couple the die 302 to the package substrate 304 via the first level interconnects 306.

The conductive contacts 365, 379, and/or 399 may include multiple layers of material that may be selected to serve different purposes. In some embodiments, the conductive contacts 365, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first level interconnects 306 include solder, the solder may be a low-temperature solder (e.g., a solder having a melting point below 100 degrees Celsius) so that it can be melted to couple the conductive contacts 365 and the conductive contacts 379 without having to expose the die 302 to higher temperatures and risk damaging the quantum dot device 100. Examples of solders that may be suitable include indium-based solders (e.g., solders including indium alloys). When low-temperature solders are used, however, these solders may not be fully solid during handling of the quantum dot device package 300 (e.g., at room temperature or temperatures between room temperature and 100 degrees Celsius), and thus the solder of the first level interconnects 306 alone may not reliably mechanically couple the die 302 and the package substrate 304 (and thus may not reliably electrically couple the die 302 and the package substrate 304). In some such embodiments, the quantum dot device package 300 may further include a mechanical stabilizer to maintain mechanical coupling between the die 302 and the package substrate 304, even when solder of the first level interconnects 306 is not solid. Examples of mechanical stabilizers may include an underfill material disposed between the die 302 and the package substrate 304, a corner glue disposed between the die 302 and the package substrate 304, an overmold material disposed around the die 302 on the package substrate 304, and/or a mechanical frame to secure the die 302 and the package substrate 304.

FIGS. 95A-B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each of the dies 452 is separated from one another to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 100) or other logic that is configured to store information in the memory devices or execute instructions stored in the memory array.

FIG. 96 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 96 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 94), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second level interconnects 308. Although a single package 420 is shown in FIG. 96, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 96, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package 300 or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 96 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections).

Figures 97, 98:
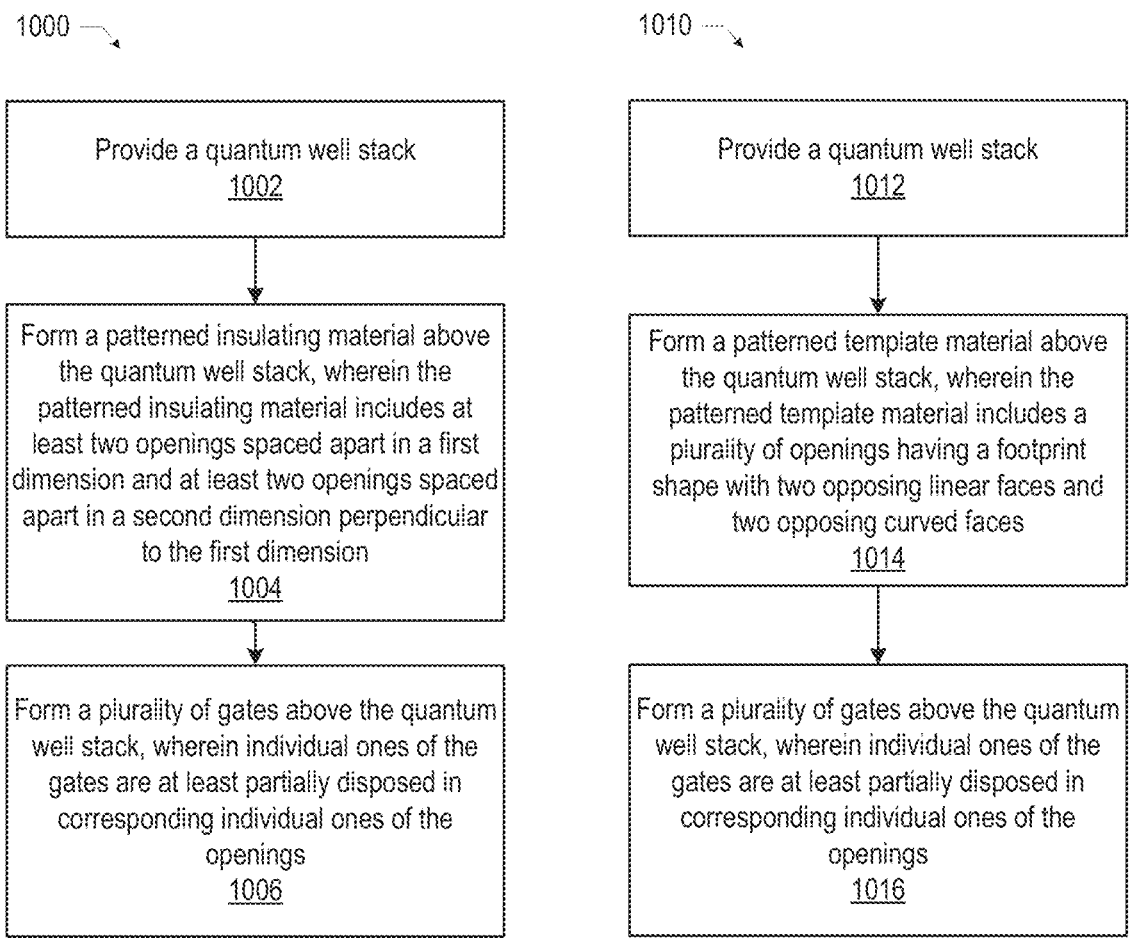
FIGS. 97 and 98 are flow diagrams of illustrative methods of manufacturing a quantum dot device, in accordance with various embodiments.

As noted above, any suitable techniques may be used to manufacture the quantum dot devices 100 disclosed herein. FIGS. 97 and 98 are flow diagrams of illustrative methods 1000 and 1010, respectively, of manufacturing a quantum dot device, in accordance with various embodiments. Although the operations discussed below with reference to the methods 1000 and 1010 are illustrated in a particular order and depicted once each, these operations may be repeated or performed in a different order (e.g., in parallel), as suitable. Additionally, various operations may be omitted, as suitable. Various operations of the methods 1000 and 1010 may be illustrated with reference to one or more of the embodiments discussed above, but the methods 1000 and 1010 may be used to manufacture any suitable quantum dot device (including any suitable ones of the embodiments disclosed herein).

Turning to the method 1000 of FIG. 97, at 1002, a quantum well stack may be provided. For example, a quantum well stack 146 may be provided (e.g., on the substrate 144), and may include the quantum well layers 152-1 and/or the quantum well layer 152-2 (e.g., as discussed above with reference to FIGS. 4-5 and 88-89).

At 1004, a patterned insulating material may be formed above the quantum well stack. The patterned insulating material may include at least two openings spaced apart in a first dimension and at least two openings spaced apart in a second dimension perpendicular to the first dimension. For example, the insulating material 110-1 and/or the insulating material 110-2 may be formed, and may include openings 111-1 and 111-2, respectively (e.g., as discussed above with reference to FIGS. 11-28 and 48-67).

At 1006, a plurality of gates may be formed above the quantum well stack. Individual ones of the gates may be at least partially disposed in corresponding individual ones of the openings. For example, a plurality of gates 108-1 may be formed at least partially in the openings 111-1, and/or a plurality of gates 108-2 may be formed at least partially in the openings 111-2 (e.g., as discussed above with reference to FIGS. 29-34).

Turning to the method 1010 of FIG. 98, at 1012, a quantum well stack may be provided. For example, a quantum well stack 146 may be provided (e.g., on the substrate 144), and may include the quantum well layers 152-1 and/or the quantum well layer 152-2 (e.g., as discussed above with reference to FIGS. 4-5 and 88-89).

At 1014, a patterned template material may be formed above the quantum well stack. The patterned template material may include a plurality of openings having a footprint shape with two opposing linear faces and two opposing curved faces. For example, the insulating material 110-1 and/or the insulating material 110-2 may be formed, and may include openings 111-1 and 111-2 shaped as illustrated in FIGS. 66 and 67 (e.g., using the technique discussed above with reference to FIGS. 48-67).

At 1016, a plurality of gates may be formed above the quantum well stack. Individual ones of the gates may be at least partially disposed in corresponding individual ones of the openings. For example, a plurality of gates 108-1 may be formed at least partially in the openings 111-1, and/or a plurality of gates 108-2 may be formed at least partially in the openings 111-2 (e.g., as discussed above with reference to FIGS. 29-34).

Figure 99:
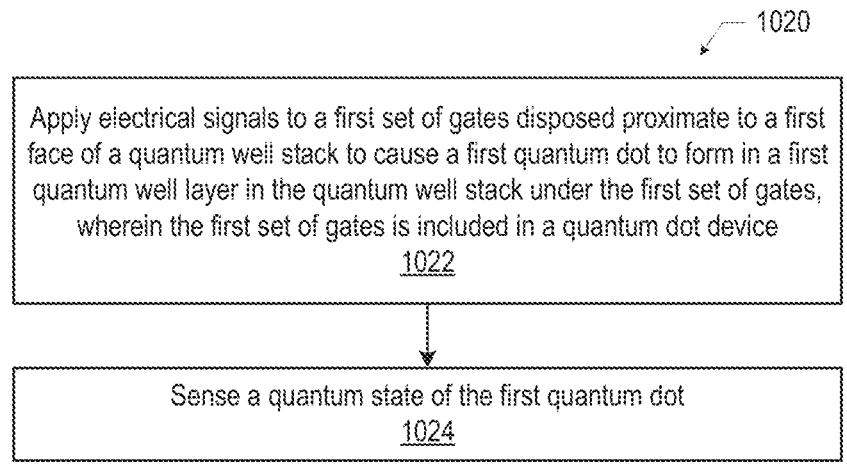
FIG. 99 is a flow diagram of an illustrative method of operating a quantum dot device, in accordance with various embodiments.

A number of techniques are disclosed herein for operating a quantum dot device 100. FIG. 99 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

At 1022, electrical signals may be applied to a first set of gates disposed proximate to a first face of a quantum well stack to cause a first quantum dot to form in a first quantum well layer in the quantum well stack under the first set of gates. The first set of gates may be included in a quantum dot device in accordance with any of those disclosed herein. For example, in some embodiments, the first set of gates may include individual gates having a footprint shape with two opposing linear faces and two opposing curved faces. In some embodiments, the first set of gates may include at least three first gates and a first insulating material extending between at least two different pairs of the first gates. For example, one or more voltages may be applied to the gates 108-1 on a quantum well stack 146 to cause at least one quantum dot 142-1 to form in the quantum well layer 152-1.

At 1024, a quantum state of the first quantum dot may be sensed. For example, a quantum state of a quantum dot 142-1 in the quantum well layer 152-1 may be sensed by a quantum dot 142-2 in the quantum well layer 152-2 (or vice versa).

Figure 100:
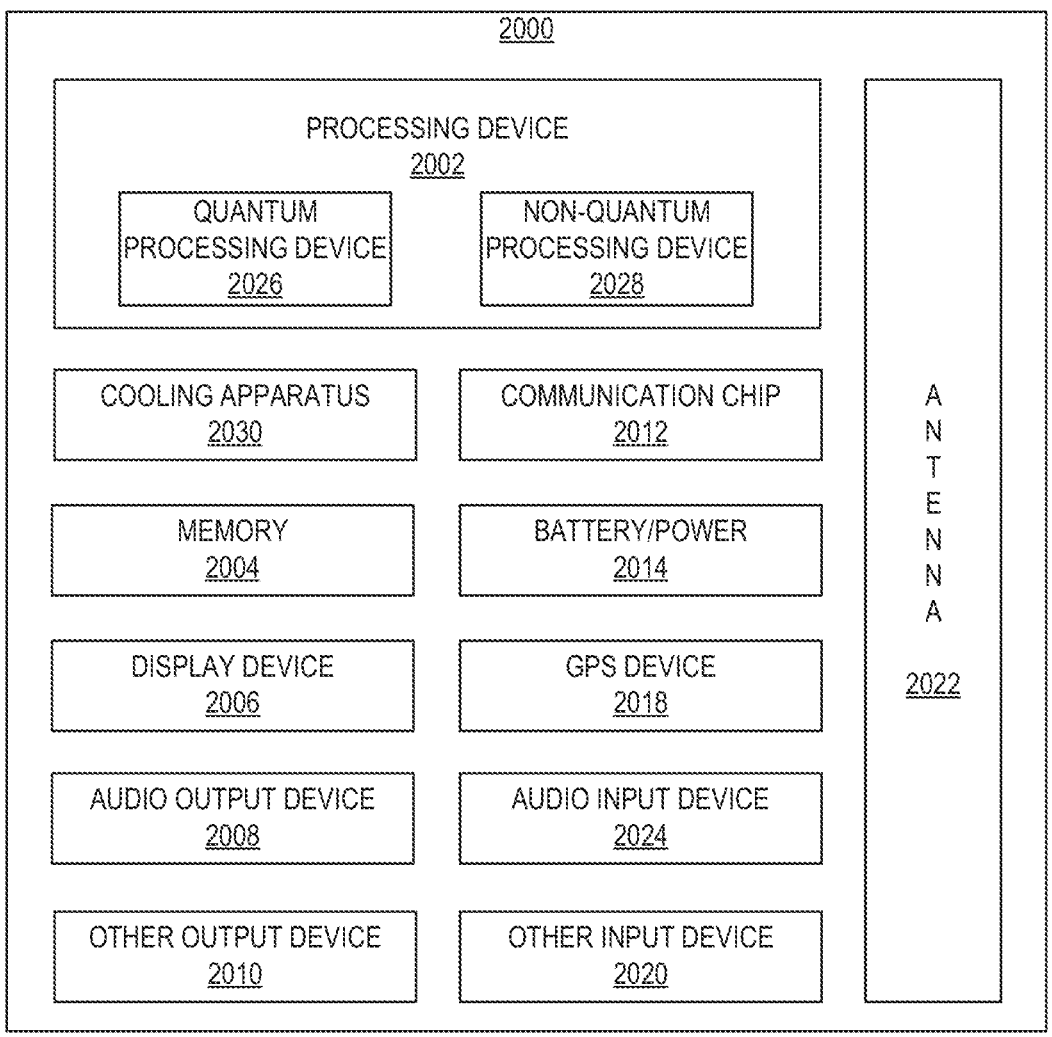
FIG. 100 is a block diagram of an example quantum computing device that may include any of the quantum dot devices disclosed herein, in accordance with various embodiments.

FIG. 100 is a block diagram of an example quantum computing device 2000 that may include any of the quantum dot devices disclosed herein. A number of components are illustrated in FIG. 100 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 100, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Although various ones of the embodiments illustrated in the accompanying drawings may include exactly two quantum well layers 152, this is simply for illustrative purposes, and any of the quantum dot devices 100 (or associated methods or devices) discussed herein may include three or more quantum well layers 152, in accordance with the teachings of the present disclosure. Thus, various ones of the quantum dot devices 100 disclosed herein may be regarded as stacked quantum well structures including two or more quantum well layers 152. For example, a double quantum well structure in a quantum dot device 100 may include two or more quantum well layers 152.

The following paragraphs provide examples of various ones of the embodiments disclosed herein.

Example 1 is a quantum dot device, including: a quantum well stack including a quantum well layer; a plurality of gates disposed above the quantum well stack, wherein at least two of the gates are spaced apart in a first dimension above the quantum well stack, at least two of the gates are spaced apart in a second dimension above the quantum well stack, and the first and second dimensions are perpendicular; and an insulating material disposed above the quantum well stack, wherein the insulating material extends between at least two of the gates spaced apart in the first dimension, and the insulating material extends between at least two of the gates spaced apart in the second dimension.

Example 2 may include the subject matter of Example 1, wherein individual gates of the plurality of gates have a substantially rectangular footprint.

Example 3 may include the subject matter of Example 2, and may further specify that the plurality of gates are distributed in a regular rectangular array.

Example 4 may include the subject matter of any of Examples 1-3, and may further specify that the insulating material includes a region shaped as a cross-grating.

Example 5 may include the subject matter of any of Examples 1-4, and may further specify that the plurality of gates includes at least three gates.

Example 6 may include the subject matter of any of Examples 1-5, and may further specify that the plurality of gates are arranged in an n×m array, n is greater than 1, and m is greater than 1.

Example 7 may include the subject matter of any of Examples 1-6, and may further specify that the insulating material includes a cross-shaped portion.

Example 8 may include the subject matter of any of Examples 1-7, and may further specify that the insulating material includes a perimeter portion extending around the plurality of gates.

Example 9 may include the subject matter of any of Examples 1-8, and may further specify that the insulating material includes a plurality of individual openings in which individual ones of the gates are disposed.

Example 10 may include the subject matter of any of Examples 1-9, and may further specify that the plurality of gates is a plurality of first gates, the quantum well layer is a first quantum well layer, the quantum well stack includes a second quantum well layer, and the quantum dot device further includes a plurality of second gates disposed below the quantum well stack, wherein the second quantum well layer is disposed between the plurality of second gates and the first quantum well layer.

Example 11 may include the subject matter of Example 10, and may further specify that at least two of the second gates are spaced apart in the first dimension below the quantum well stack, and at least two of the second gates are spaced apart in the second dimension below the quantum well stack.

Example 12 may include the subject matter of Example 11, and may further specify that the insulating material is a first insulating material, and the quantum dot device further includes a second insulating material disposed below the quantum well stack, wherein the second insulating material extends between at least two of the second gates spaced apart in the first dimension, and the second insulating material extends between at least two of the second gates spaced apart in the second dimension.

Example 13 may include the subject matter of Example 12, and may further specify that the first insulating material and the second insulating material have a same shape.

Example 14 may include the subject matter of any of Examples 11-13, and may further specify that an arrangement of the second gates below the quantum well stack is a same arrangement as an arrangement of the first gates above the quantum well stack.

Example 15 may include the subject matter of any of Examples 11-14, and may further specify that individual ones of the first gates above the quantum well stack correspond to individual ones of the second gates below the quantum well stack.

Example 16 may include the subject matter of any of Examples 11-15, and may further specify that an arrangement of the second gates is a mirror image of an arrangement of the first gates around the quantum well stack.

Example 17 may include the subject matter of any of Examples 10-16, and may further specify that a barrier layer is disposed between the first and second quantum well layers.

Example 18 may include the subject matter of any of Examples 10-17, and may further include: first and second conductive pathways that conductively contact the first quantum well layer; and third and fourth conductive pathways that conductively contact the second quantum well layer.

Example 19 may include the subject matter of Example 18, and may further specify that the first and second conductive pathways conductively contact the first quantum well layer via first doped regions in the quantum well stack, and the third and fourth conductive pathways contact the second quantum well layer via second doped regions in the quantum well stack.

Example 20 may include the subject matter of any of Examples 1-19, and may further specify that the quantum well layer is formed of silicon or germanium.

Example 21 may include the subject matter of any of Examples 1-20, and may further specify that the insulating material is a first insulating material, and the quantum dot device further includes: a second insulating material disposed above the quantum well stack; and first and second conductive pathways that extend through the second insulating material to conductively contact the quantum well layer.

Example 22 may include the subject matter of any of Examples 1-21, and may further specify that first and second conductive pathways conductively contact the first quantum well layer via first doped regions in the quantum well stack.

Example 23 may include the subject matter of any of Examples 1-22, and may further specify that adjacent ones of the gates are spaced apart by a distance of 100 nanometers or less.

Example 24 may include the subject matter of any of Examples 1-23, and may further specify that adjacent ones of the gates are spaced apart by a distance between 20 and 100 nanometers.

Example 25 may include the subject matter of any of Examples 1-24, and may further specify that the plurality of gates includes: a first gate having a first length, two second gates arranged such that the first gate is disposed between the second gates, wherein the second gates have a second length different from the first length, and two third gates arranged such that the second gates are disposed between the third gates, wherein the third gates have a third length different from the first length and different from the second length.

Example 26 may include the subject matter of any of Examples 1-25, and may further specify that individual gates of the plurality of gates include a gate dielectric having a U-shaped cross section.

Example 27 is a method of operating a quantum dot device, including: applying electrical signals to a first set of gates disposed proximate to a first face of a quantum well stack to cause a first quantum dot to form in a first quantum well layer in the quantum well stack under the first set of gates, wherein the first set of gates includes at least three first gates and a first insulating material extending between at least two different pairs of first gates; and sensing a quantum state of the first quantum dot.

Example 28 may include the subject matter of Example 27, and may further specify that sensing the quantum state of the first quantum dot includes applying electrical signals to a second set of gates disposed proximate to a second face of the quantum well stack to cause a second quantum dot to form in a second quantum well layer in the quantum well stack under the second set of gates, wherein the first and second faces of the quantum well stack are opposing faces of the quantum well stack.

Example 29 may include the subject matter of any of Examples 27-28, and may further specify that sensing the quantum state of the first quantum dot includes sensing a spin state of the first quantum dot.

Example 30 may include the subject matter of any of Examples 27-29, and may further specify that applying the electrical signals to the first set of gates is to cause a second quantum dot to form in the quantum well layer.

Example 31 may include the subject matter of any of Examples 27-30, and may further specify that the first insulating material includes a region shaped as a cross-grating.

Example 32 is a method of manufacturing a quantum dot device, including: providing a quantum well stack; forming a patterned insulating material above the quantum well stack, wherein the patterned insulating material includes at least two openings spaced apart in a first dimension and at least two openings spaced apart in a second dimension perpendicular to the first dimension; and forming a plurality of gates above the quantum well stack, wherein individual ones of the gates are at least partially disposed in corresponding individual ones of the openings.

Example 33 may include the subject matter of Example 32, and may further specify that the patterned insulating material and the plurality of gates are formed above a first face of the quantum well stack, and the method further includes forming another set of gates above a second face of the quantum well stack, wherein the second face of the quantum well stack is opposite to the first face of the quantum well stack.

Example 34 may include the subject matter of any of Examples 32-33, and may further specify that providing the quantum well stack includes providing the quantum well stack on a support, and the method further includes, after forming the plurality of gates, separating the quantum well stack from the support.

Example 35 may include the subject matter of any of Examples 32-34, and may further include: removing at least some of the quantum well stack to form a recess; and providing a dopant in the quantum well stack proximate to the recess.

Example 36 may include the subject matter of any of Examples 32-35, and may further specify that forming the patterned insulating material includes: providing an unpatterned insulating material; providing a first hardmask above the unpatterned insulating material; forming a first plurality of parallel trenches oriented in a first direction in the first hardmask; providing a second hardmask above the unpatterned insulating material; forming a second plurality of parallel trenches oriented in a second direction in the first hardmask, wherein the second direction is perpendicular to the first direction; and patterning the unpatterned insulating material to form the patterned insulating material by removing the unpatterned insulating material in areas in which the first plurality of trenches and the second plurality of trenches overlap.

Example 37 may include the subject matter of Example 36, and may further include: providing a third hardmask above the unpatterned insulating material; and patterning the third hardmask by removing areas in which the first plurality of trenches and the second plurality of trenches overlap; wherein patterning the unpatterned insulating material includes patterning the unpatterned insulating material in accordance with the patterned third hardmask.

Example 38 may include the subject matter of any of Examples 36-37, and may further specify that forming the patterned insulating material includes using a spacer-based pitch-quartering technique or a spacer-based pitch-halving technique.

Example 39 is a quantum computing device, including: a quantum processing device, wherein the quantum processing device includes an active quantum well layer and a read quantum well layer, a first set of gates to control formation of quantum dots in the active quantum well layer, and a second set of gates to control formation of quantum dots in the read quantum well layer, and wherein the first set of gates includes at least three first gates and an insulating material extending between at least two different pairs of first gates; a non-quantum processing device, coupled to the quantum processing device, to control voltages applied to the first set of gates and the second set of gates; and a memory device to store data generated by the read quantum well layer during operation of the quantum processing device.

Example 40 may include the subject matter of Example 39, and may further include a cooling apparatus to maintain the temperature of the quantum processing device below 5 degrees Kelvin.

Example 41 may include the subject matter of Example 40, and may further specify that the cooling apparatus includes a dilution refrigerator.

Example 42 may include the subject matter of Example 40, and may further specify that the cooling apparatus includes a liquid helium refrigerator.

Example 43 may include the subject matter of any of Examples 39-42, and may further specify that the memory device is to store instructions for a quantum computing algorithm to be executed by the quantum processing device.

Example 44 may include the subject matter of any of Examples 39-43, and may further specify that the first set of gates and the second set of gates each include a plurality of gates arranged in a two-dimensional array.

Example 45 may include the subject matter of any of Examples 39-44, and may further specify that adjacent gates of the first set of gates are spaced apart by a distance between 20 and 100 nanometers.

Example 46 may include the subject matter of any of Examples 39-45, and may further specify that the insulating material has a region shaped as a grid.

The invention claimed is:

1. A quantum dot device, comprising:
a quantum well stack including a quantum well layer;
a plurality of gates above the quantum well stack, wherein at least two of the gates are separated by a gap in a first dimension above the quantum well stack, at least two of the gates are separated by a gap in a second dimension above the quantum well stack, and the first and second dimensions are perpendicular; and
an insulating material above the quantum well stack, wherein the insulating material fills the gap that separates the at least two of the gates in the first dimension above the quantum well stack, and the insulating material further fills the gap that separates the at least two of the gates in the second dimension above the quantum well stack.

2. The quantum dot device of claim 1, wherein the plurality of gates is a plurality of first gates, the quantum well layer is a first quantum well layer, the quantum well stack includes a second quantum well layer, and the quantum dot device further includes:
a plurality of second gates below the quantum well stack, wherein, in a cross-section of the quantum dot device along a plane that intersects at least one gate of the plurality of first gates and intersects at least one gate of the plurality of second gates, the second quantum well layer is between the at least one gate of the plurality of second gates and the first quantum well layer.

3. The quantum dot device of claim 2, wherein at least two of the second gates are separated by a gap in the first dimension below the quantum well stack, and at least two of the second gates are separated by a gap in the second dimension below the quantum well stack.

4. The quantum dot device of claim 3, wherein the insulating material is a first insulating material, and the quantum dot device further comprises:
a second insulating material below the quantum well stack, wherein the second insulating material fills the gap that separates the at least two of the second gates in the first dimension below the quantum well stack, and the second insulating material fills the gap that separates the at least two of the second gates spaced apart in the second dimension below the quantum well stack.

5. The quantum dot device of claim 3, wherein an arrangement of the second gates below the quantum well stack is a same arrangement as an arrangement of the first gates above the quantum well stack.

6. The quantum dot device of claim 2, further comprising:
first and second conductive pathways that conductively contact the first quantum well layer; and
third and fourth conductive pathways that conductively contact the second quantum well layer.

7. The quantum dot device of claim 1, wherein the plurality of gates includes:
a first gate having a first length,
two second gates arranged such that the first gate is in an opening between the second gates, wherein the second gates have a second length different from the first length, and
two third gates arranged such that the second gates are in an opening between the third gates, wherein the third gates have a third length different from the first length and different from the second length.

8. A quantum computing device, comprising:
a quantum processing device, wherein the quantum processing device includes an active quantum well layer and a read quantum well layer, a first set of gates to control formation of quantum dots in the active quantum well layer, and a second set of gates to control formation of quantum dots in the read quantum well layer, and wherein the first set of gates includes at least three first gates and an insulating material filling gaps between at least two different pairs of first gates, wherein the insulating material is in contact with sidewalls of the at least two different pairs of first gates that face each other;
a non-quantum processing device, coupled to the quantum processing device, to control voltages applied to the first set of gates and the second set of gates; and
a memory device to store data generated by the read quantum well layer during operation of the quantum processing device.

9. The quantum computing device of claim 8, further comprising:
a cooling apparatus to maintain a temperature of the quantum processing device below 5 degrees Kelvin.

10. The quantum computing device of claim 8, wherein the first set of gates and the second set of gates each include a plurality of gates arranged in a two-dimensional array.

11. The quantum computing device of claim 8, wherein the insulating material has a region shaped as a grid.

12. A quantum dot device, comprising:
a quantum well stack including a quantum well layer;
a plurality of gates above the quantum well stack, wherein at least two of the gates are spaced apart in a first dimension above the quantum well stack, at least two of the gates are spaced apart in a second dimension above the quantum well stack, and the first and second dimensions are perpendicular; and
an insulating material above the quantum well stack, wherein the insulating material extends between at least two of the gates spaced apart in the first dimension, and the insulating material extends between at least two of the gates spaced apart in the second dimension,
wherein the plurality of gates includes:
a first gate having a first length,
two second gates arranged such that the first gate is between the second gates, wherein the second gates have a second length different from the first length, and
two third gates arranged such that the second gates are between the third gates,
wherein the third gates have a third length different from the first length and different from the second length.

13. The quantum dot device of claim 12, wherein individual gates of the plurality of gates have a substantially rectangular footprint.

14. The quantum dot device of claim 13, wherein the plurality of gates are distributed in a regular rectangular array.

15. The quantum dot device of claim 12, wherein the plurality of gates are arranged in an n×m array, n is greater than 1, and m is greater than 1.

16. The quantum dot device of claim 12, wherein the insulating material includes a perimeter portion extending around the plurality of gates.

17. The quantum dot device of claim 12, wherein the plurality of gates is a plurality of first gates, the quantum well layer is a first quantum well layer, the quantum well stack includes a second quantum well layer, and the quantum dot device further includes:
a plurality of second gates below the quantum well stack, wherein the second quantum well layer is between the plurality of second gates and the first quantum well layer.

18. The quantum dot device of claim 12, wherein the plurality of gates includes:
a first gate having a first length,
two second gates arranged such that the first gate is between the second gates, wherein the second gates have a second length different from the first length, and
two third gates arranged such that the second gates are between the third gates, wherein the third gates have a third length different from the first length and different from the second length.

19. A method of manufacturing a quantum dot device, the method comprising:
providing a quantum well stack including a quantum well layer;
providing a plurality of gates above the quantum well stack, wherein at least two of the gates are spaced apart in a first dimension above the quantum well stack, at least two of the gates are spaced apart in a second dimension above the quantum well stack, and the first and second dimensions are perpendicular; and
providing an insulating material above the quantum well stack, wherein:
in a cross-section of the quantum dot device along a plane intersecting a middle of a sidewall of a first gate of the at least two of the gates spaced apart in the first dimension and intersecting a middle of a sidewall of a second gate of the at least two of the gates spaced apart in the first dimension, the insulating material is between the middle of the sidewall of the first gate of the at least two of the gates spaced apart in the first dimension and the middle of the sidewall of the second gate of the at least two of the gates spaced apart in the first dimension, and
in a cross-section of the quantum dot device along a plane intersecting a middle of a sidewall of a first gate of the at least two of the gates spaced apart in the second dimension and intersecting a middle of a sidewall of a second gate of the at least two of the gates spaced apart in the second dimension, the insulating material is between the middle of the sidewall of the first gate of the at least two of the gates spaced apart in the second dimension and the middle of the sidewall of the second gate of the at least two of the gates spaced apart in the second dimension.

20. The method of claim 19, wherein the plurality of gates includes:
a first gate having a first length,
two second gates arranged such that the first gate is between the second gates, wherein the second gates have a second length different from the first length, and
two third gates arranged such that the second gates are between the third gates, wherein the third gates have a third length different from the first length and different from the second length.

21. The quantum dot device of claim 1, wherein:
the insulating material is in contact with a sidewall of a first gate of the two of the gates separated by the gap in the first dimension and with a sidewall of a second gate of the two of the gates separated by the gap in the first dimension, and the sidewall of the first gate of the two of the gates separated by the gap in the first dimension and the sidewall of the second gate of the two of the gates separated by the gap in the first dimension face each other.

22. The quantum dot device of claim 1, wherein individual gates of the at least two of the gates separated by the gap in the first dimension and the least two of the gates separated by the gap in the second dimension are in respective openings in the insulating material.

23. The quantum dot device of claim 1, further comprising one or more doped regions in contact with the quantum well layer.

24. The quantum dot device of claim 1, wherein individual gates of the plurality of gates have a substantially rectangular footprint.

25. The quantum dot device of claim 24, wherein the plurality of gates are distributed in a regular rectangular array.

26. The quantum dot device of claim 1, wherein the plurality of gates are arranged in an nxm array, n is greater than 1, and m is greater than 1.

27. The quantum dot device of claim 1, wherein the insulating material includes a perimeter portion extending around the plurality of gates.

28. The quantum dot device of claim 1, wherein adjacent ones of the gates are spaced apart by a distance of 100 nanometers or less.

* * * * *

UNITED STATES PATENT AND TRADEMARK OFFICE
CERTIFICATE OF CORRECTION

| | |
|---|---|
| PATENT NO. | : 11,594,599 B2 |
| APPLICATION NO. | : 16/317023 |
| DATED | : February 28, 2023 |
| INVENTOR(S) | : James S. Clarke et al. |

It is certified that error appears in the above-identified patent and that said Letters Patent is hereby corrected as shown below:

On the Title Page

On Page 2, item (56), under "Other Publications", in Column 2, Line 52, delete "Ultafast" and insert -- Ultrafast --, therefor.

On Page 2, item (56), under "Other Publications", in Column 2, Line 67, delete "Warwich," and insert -- Warwick, --, therefor.

In the Claims

In Column 47, Claim 22, Line 11, delete "the least two of the gates" and insert -- the at least two of the gates --, therefor.

Signed and Sealed this
Eighteenth Day of April, 2023

Katherine Kelly Vidal
*Director of the United States Patent and Trademark Office*